(12) United States Patent
Gucyski

(10) Patent No.: US 6,639,815 B1
(45) Date of Patent: Oct. 28, 2003

(54) PRECISION SWITCHING POWER AMPLIFIER COMPRISING INSTANTANEOUSLY INTERRUPTIBLE POWER SOURCE

(76) Inventor: Jeff Gucyski, P.O. Box 11633, Costa Mesa, CA (US) 92627

( * ) Notice: Subject to any disclaimer, the term of this patent is extended or adjusted under 35 U.S.C. 154(b) by 0 days.

(21) Appl. No.: 10/139,691

(22) Filed: May 4, 2002

(51) Int. Cl.[7] .................................................. H02M 1/12
(52) U.S. Cl. ...................................................... 363/40
(58) Field of Search ......................... 363/40, 123, 131, 363/39

(56) References Cited

U.S. PATENT DOCUMENTS 6,021,053 A * 2/2000 Baskette et al. .............. 363/40
6,229,720 B1 * 5/2001 Noma et al. .................. 363/40

* cited by examiner

Primary Examiner—Shawn Riley

(57) ABSTRACT

The amplifier comprises instantaneously interruptible power source ($I^2PS$) for producing a precise AC output voltage. A continuous mode $I^2PS$ can be built using only 7 power components, including two inductors and an output capacitor. The $I^2PS$ can instantaneously interrupt the correction and become idle. The inductors each attain a corrective current and provide a return voltage. Two switches are separately coupled in series with the inductors for selectively applying the respective corrective currents between the power supply and the output capacitor. Two diodes limit the return voltages. A converter converts the supply voltage or an internal voltage into an internal supply current. A fine amplifier can employ two low power transistors to rapidly deliver a fine current to the output capacitor. This dramatically reduces output noise and improves accuracy. The converter and the fine amplifier can be combined or used separately. The $I^2PS$ having unity gain is most accurate and requires a simple preamplifier.

20 Claims, 27 Drawing Sheets

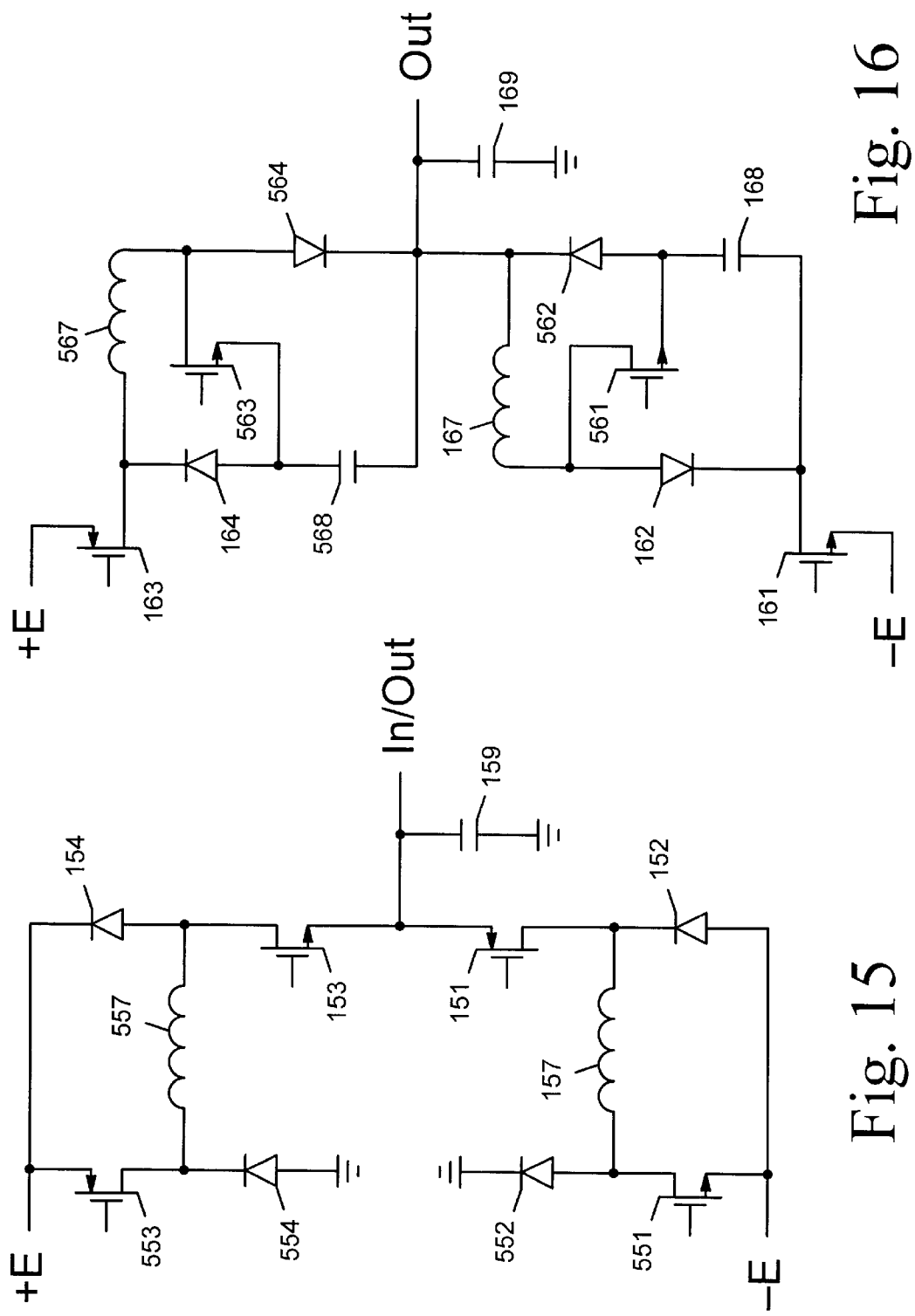

PRECISION SWITCHING POWER AMPLIFIER COMPRISING INSTANTANEOUSLY INTERRUPTIBLE POWER SOURCE

CROSS REFERENCE TO RELATED INVENTIONS

The present invention is related to the following U.S. Patents by the same inventor, U.S. Pat. Nos. 6,385,056, 6,366,474, 6,362,979, 6,121,756 (et al.), 6,011,702, 5,896, 280 (et al.), 5,892,666, 5,736,841, 5,637,988, 5,426,413, 5,382,843, 5,270,904, 5,267,132, 5,252,974, 5,225,767, 5,221,887, 5,214,430, 5,206,649, 5,196,995, 5,173,698, 5,164,657, 5,164,656, 5,155,489, 5,155,430, 5,155,381, 5,146,399, 5,099,241, 5,057,990, 5,041,832, 4,999,568, 4,980,686, 4,980,649, 4,958,155, 4,956,760, 4,949,234, 4,947,308, 4,943,740, 4,940,982, 4,940,906, 4,929,848, 4,871,980, 4,866,398, 4,857,931, 4,853,837, 4,845,391, 4,843,392, 4,837,572, 4,829,263, 4,811,017, 4,803,610, 4,782,306, 4,763,106, 4,763,080, 4,749,958, 4,749,953, 4,736,286, 4,714,894, 4,634,996 and 4,476,441.

FIELD OF THE INVENTION

The invention relates to unidirectional or bi-directional DC/AC converter. This includes switching power amplifier, AC power source, frequency converter, line conditioner and uninterruptible power source.

BACKGROUND OF THE INVENTION

Many terms exist to describe various types of devices used for power conversion. The following definitions are provided in order to avoid any conflict of terms. A switching power supply (SPS) is an AC/DC or DC/DC converter. A switching power amplifier (SPA) is an AC/AC or DC/AC converter. An SPA that produces a fixed frequency is commonly referred to as inverter, AC voltage regulator, AC power source, line conditioner, frequency converter, etc. An SPA that amplifies a variable frequency is often narrowed to class-D amplifier, whereas other techniques exist. An uninterruptible power source/supply/system (UPS) is a bi-directional DC/AC converter. The UPS charges a battery when line is present and simulates line voltage when line fails. In the following disclosure, the term converter refers to a block performing power conversion within a parent apparatus.

Conventional SPA and UPS each comprise an output inductor that continuously delivers a current to an output capacitor. Moreover, a feedback signal introducing delay and phase shift is used to determine that current. Only an optimal level of the current is established. In particular, a rate at which the current is regulated is very limited in order to maintain high stability. However, variations of load impedance over amplitude and frequency are often rapid and unpredictable. A precise correction is simply impossible since, at the end of every switching cycle, the correction is either insufficient or continues while no longer required. In order to minimize an output voltage ripple, a powerful output filter is used. However, this further contributes to unpredictability of load impedance. Unless a well-behaved load is used, the high accuracy is unattainable with traditional techniques. This includes most sophisticated class-D amplifiers. Usually, the accuracy of the output voltage produced by the UPS is nonessential. However, an excessive switching results in reduced efficiency. During the battery charging, the UPS acts like an SPS.

Class-D amplifiers are plagued by numerous inherent flaws. Pulse width modulation (PWM) and other modulation schemes are used to average the input and feedback signals. Moreover, the output voltage is obtained by averaging the pulse train in the output filter. The result is slow response time and sluggish performance. The output voltage is never on target as the output inductor "drags" it around. Even if the output voltage is precisely equal to the input voltage, multiplied by gain, class-D amplifier will overshoot or undershoot. The output voltage is thus corrected and/or falsified in every switching cycle. Moreover, increased cost and reduced efficiency of class-D amplifiers are unacceptable. No-load operation can produce large resonant currents in the output filter. Minimum load matching the main load is often required. Problems associated with power devices offer many other examples. In order to correct even a tiny overshoot at peak current, the output inductor has to be fully discharged and fully recharged. The result is increased response time and overblown current ratings. But even the switching itself is troublesome. Dead time is excessive in order to take into account temperature dependence and device differences. Output capacitance of the complementary switch and intra-winding capacitance of the inductor add up causing enlarged supply voltage spikes and ringing. Parasitic power supply capacitance coupled to the floating driver is also added. To make it worse, the switches are paralleled by clamping diodes due to poor quality of intrinsic body diodes. Schottky diodes, usually recommended, have particularly large junction capacitance. Yet another example is reverse energy flow, also known as power supply pumping. Power supply capacitors have to be severely oversized as to store energy returned at low frequencies. Pushing energy back and forth dramatically worsens EMI/RFI.

An instantaneously interruptible power source ($I^2PS$) is introduced in the abovementioned "Precision Switching Power Amplifier and Uninterruptible Power System," U.S. Pat. No. 6,385,056, dated May 7, 2002, and "Switching Power Amplifier and Uninterruptible Power System Comprising DC/DC Converter for Sinusoidal Output," U.S. Pat. No. 6,362,979, dated Mar. 26, 2002. A unidirectional or bi-directional $I^2PS$ is equivalent to a conventional SPA or UPS respectively. However, some intrinsic features of the $I^2PS$ are in sharp contrast to common flaws of the conventional devices. The $I^2PS$ can instantaneously interrupt the correction, wherein a precise correction can be accomplished in every switching cycle. Moreover, the $I^2PS$ can become idle by the end of every switching cycle or remain idle over a period of many cycles. The $I^2PS$ is thus idle when no correction is necessary. If accuracy of the output voltage is nonessential, as in case of the UPS, a less frequent correction of the output voltage results in reduced power dissipation. The $I^2PS$ is unidirectional, unless otherwise noted.

SUMMARY OF THE INVENTION

The present invention is intended to provide an SPA comprising an $I^2PS$ for producing a precise AC output voltage. A converter provides an internal supply current. A fine amplifier rapidly delivers a fine current to the output capacitor. The converter and the fine amplifier can be.combined or used separately.

The switching power apparatus according to the present invention provides an AC output voltage in response to an AC input signal. A power supply means provides at least one supply voltage. A first and second inductive means attain a first and second corrective currents, and provide a first and second return voltages respectively. A first and second rectifying means limit the first and second return voltages respectively. A capacitive means provides the AC output voltage. A first switching means has a first reference terminal and a first supply terminal, and is coupled in series with the first inductive means for selectively applying the first corrective current between the power supply means and the capacitive means. A second switching means has a second reference terminal and a second supply terminal, and is coupled in series with the second inductive means for selectively applying the second corrective current between the power supply means and the capacitive means. A converter means has a first and second input terminals for converting a voltage appearing therebetween and providing a supply current to at least one supply terminal. The first input terminal is coupled to one of the terminals of the first switching means and the second input terminal is coupled to one of the terminals of the second switching means.

In another embodiment, a power supply means provides at least one supply voltage. A pair of inductive means each attain a corrective current and provide a return voltage. A pair of rectifying means is separately coupled to the inductive means for limiting the respective return voltages. A capacitive means provides the AC output voltage. A pair of switching means is separately coupled in series with the inductive means for selectively applying the respective corrective currents between the power supply means and the capacitive means. An amplifier means provides a fine current to the capacitive means in response to the AC input signal and the AC output voltage.

A voltage shifter according to the present invention provides a first binary output signal referenced to a first output potential in response to a first binary input signal referenced to an input potential and provides a second binary output signal referenced to a second output potential in response to a second binary input signal referenced to the input potential. A first current source means provides a first current in response to the first and second binary input signals. A resistive means provides a voltage referenced to the first output potential in response to the first current. A first driver means provides the first binary output signal in response to the voltage. A second current source means provides a second current in response to the voltage. A second driver means provides the second binary output signal in response to the second current.

The corrective current is equal to at least a portion of an inductive means current attained by the inductive means. The corrective current is inherently interrupted. Specifically, the respective switching means selectively applies the inductive means current to the output capacitor. When the switching means is conductive, the corrective current is equal to the inductive means current. Otherwise, the corrective current is zero. The inductive means comprises at least one inductor and/or transformer. The inductive means current is continuous if an inductor is used. Conversely, a primary current of a transformer can be interrupted. In particular, a flyback transformer provides a secondary current when the primary current is interrupted, and vice versa. Therefore, one current continues to flow in form of the other current. The corrective current recharges the output capacitor. Specifically, a current flowing through the output capacitor is equal to a difference between the corrective current and the output current of the I$^2$PS. The latter current may be zero since no minimum load is required.

Two inductive components each attain a unidirectional current. This overcomes many disadvantages of conventional systems with a single inductive component. The inductive component attains a bi-directional inductor current that often has opposite polarity than polarity necessary to accomplish the correction. Some time has to expire before the inductor current drops to zero and builds up in the desired direction. This results in increased current ratings and higher ripple of the output voltage. Furthermore, at least one pair of complementary switches is coupled across a power supply. Each pair requires a dead time to conduct the inductive current. The dead time may be excessive in order to prevent cross-conduction of the switches. This further contributes to the increased ripple level.

The employment of the two inductive components adds other features. The currents flowing through these components are unidirectional and independently developed. The corrective current can immediately assume desired polarity and possibly an upheld level. Moreover, these currents can offset one another. The corrective current is equal to the current of one inductive component if one output switch is closed. However, the corrective current is equal to a difference between both currents if both output switches are closed. In particular, the corrective current is zero if the output switches are open or if both switches are closed and the inductive components carry even currents. The technique employing two inductive components is disclosed in the abovementioned "Ultra Efficient Switching Power Amplifier," U.S. Pat. No. 4,980,649 dated Dec. 25, 1990, and in both patents introducing I$^2$PS, by the same inventor.

Continuous or discontinuous mode of operation usually applies to a conventional SPS. The mode is determined in accordance to continuity of a primary and/or secondary current. In particular, an inductive output component in the SPS carries the corrective current for correcting the output voltage. The corrective current is uninterrupted as it can only rise, fall or remain at zero level. By contrast, the corrective current is inherently interrupted in an I$^2$PS Multiple inductive components can be used to attain the corrective current. Nevertheless, continuous or discontinuous mode of operation can be distinguished in the I$^2$PS. Operation of each inductive output component can be divided into active and idle periods. During each active period, the respective inductive component provides at least a portion of the corrective current. Conversely, during each idle period, the corrective current is interrupted or delivered by another inductive component. The distinction between the continuous and discontinuous modes is made according to stability of the current carried by any inductive component during the idle period thereof.

In the continuous mode I$^2$PS, energy stored in the inductive output component is maintained during each idle period. A switch or a diode is employed to effectively short the inductive component. The voltage thereacross is near zero, wherein the inductor current remains practically constant. During the active period, the corrective current immediately assumes the upheld value carried by the inductive component. The inductive component is charged only during the active period. Moreover, if multiple inductive components are employed, each inductive component is charged during that period. A lossless I$^2$PS would be inoperative since no discharging of the inductive component would be accomplished. Inefficiencies of the real I$^2$PS are thus taken advantage of. The continuous mode I$^2$PS frequently operates in the discontinuous mode, e.g. near zero crossing of the output voltage. The continuous mode I$^2$PS is inherently unidirectional unless switches are used to carry out discontinuous operation.

In the discontinuous mode I$^2$PS, the inductive output component or components intend to be fully discharged in every switching cycle. However, the switching cycle itself is unaffected by current levels carried by the inductive components. The I²PS can thus operate in the continuous mode, particularly near peaks of the output voltage. During the idle period, energy stored in the respective inductive component is temporarily stored in a capacitor or returned to the power supply. Zero current switching improves efficiency, whereas peak currents are increased. The discontinuous mode I²PS can be bidirectional. Numerous techniques targeting discontinues mode are disclosed in the abovementioned "Precision Switching Power Amplifier and Uninterruptible Power System," U.S. Pat. No. 6,385,056, dated May 7, 2002. Therefore, the focus of the following disclosure is on the continuous mode.

BRIEF DESCRIPTION OF THE DRAWINGS

The present invention will become more clear in conjunction with the accompanying figures of which:

FIG. 15 is an embodiment of continuous or discontinuous mode bidirectional I²PS;

FIG. 16 is the preferred embodiment of continuous or discontinuous mode transformer-less I²PS boosting the output voltage;

DETAILED DESCRIPTION OF THE INVENTION

Figure 1:
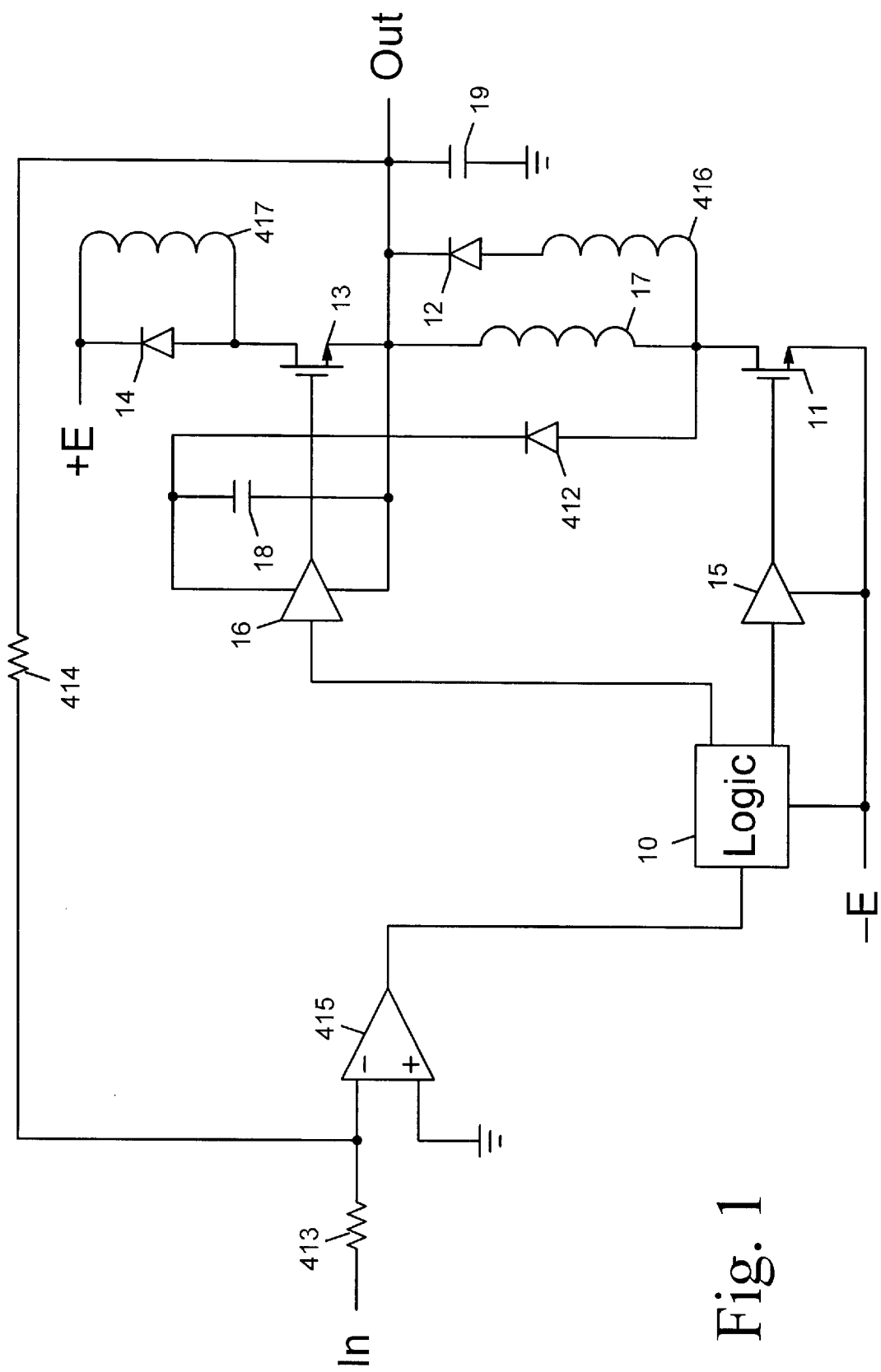
FIG. 1 is the preferred embodiment of continuous mode I²PS comprising single floating driver and implementing auxiliary inductor.

FIG. 1 is the preferred embodiment of continuous mode I²PS comprising single floating driver and implementing auxiliary inductor. The I²PS employs a pair of main inductors for attaining the corrective current and an auxiliary inductor for developing a supply voltage. Operation of each main inductor can be divided into active and idle periods. One main inductor provides at least a portion of the corrective current during each active period. Conversely, the corrective current is interrupted or delivered by the other main inductor during each idle period of the one main inductor.

Energy stored in each main inductor is maintained during the respective idle period. A diode is employed to effectively short the inductor. The voltage thereacross is near zero, wherein the inductor current remains practically constant. During the active period, the corrective current immediately assumes the upheld value carried by the inductor. The inductor is charged only during the active period. A lossless I²PS would be inoperative since no discharging of the inductor would be accomplished. Inefficiencies of the real I²PS are thus taken advantage of. Switches used in this and the following embodiments are N-channel MOSFETs, unless otherwise noted.

The input voltage, e.g. from an audio source, is applied to the resistor 413. The inverting input of the comparator 415 is connected to the resistors 413 and 414. An output signal of the comparator 415 is applied to the logic circuit 10. The logic 10 provides a pair of signals that are applied to inputs of the drivers 15 and 16. The drivers 15 and 16 further drive gates of the switches 11 and 13 respectively. A negative supply voltage −E is applied to the source of the switch 11. A conventional power supply delivers supply current to the logic 10 and the driver 15, both referenced to −E, and to the comparator 415. The drain of the switch 11 is tied to the anode of the diode 412, one main inductor 17 and the auxiliary inductor 416. The inductor 416 is further tied to the anode of the diode 12. The cathode of the diode 412 is connected to the capacitor 18 and a supply terminal of the driver 16. A positive supply voltage +E is applied to the cathode of the diode 14 and the other main inductor 417. The drain of the switch 13 is tied to the anode of the diode 14 and the inductor 417. The output of the I²PS is connected to the source of the switch 13, the cathode of the diode 12, the inductor 17, the capacitors 18, 19, the resistor 414 and a reference terminal of the driver 16. The non-inverting input of the comparator 415 and the capacitor 19 are grounded. The AC output voltage appears across the capacitor 19.

The switch 11 and the driver 15 represent a first switching means. The source of the switch 11 and the reference terminal of the driver 15 are connected to a reference terminal of the first switching means. The driver 15 is supplied from the external power source. The switch 13, the driver 16 and the capacitor 18 represent the second switching means. The source of the switch 13, the capacitor 18 and the reference terminal of the driver 16 are connected to a reference terminal of the second switching means. Moreover, the capacitor 18 and the supply terminal of the driver 15 are connected to a supply terminal of the second switching means. The auxiliary inductor 416 and the diode 412 represent a converter. The converter has a pair of input terminals for converting a voltage appearing therebetween and generating a supply current. One input terminal is connected to the drain of the switch 11, the other to the output of the I²PS. The drain represents an output terminal of the first switching means. The diode 12 limits a return voltage provided by the inductor 416. The diode 412 applies a return voltage provided by the inductor 17 to the supply terminal of the second switching means.

The input and output voltages are applied across the resistor divider 413, 414. A ratio of resistor values sets the gain of the amplifier. The comparator 415 has high open-loop gain in order to provide a precise output voltage. The switch 13 turns on to increase the output voltage. The switch 11 is turned off. The corrective current is equal to the current of the inductor 417. The voltage applied thereacross is equal to a difference between +E and the output voltage, wherein the corrective current increases. The switch 13 can turn off at any time, whenever the correction is completed. The flow of the corrective current is interrupted instantaneously. The diode 14 limits the drain voltage of the switch 13 substantially to +E. Moreover, the diode 14 shorts the inductor 417, wherein the inductor current remains virtually constant. When the switch 13 turns on again, the corrective current can immediately assume the upheld value of the inductor current.

Figure 6:
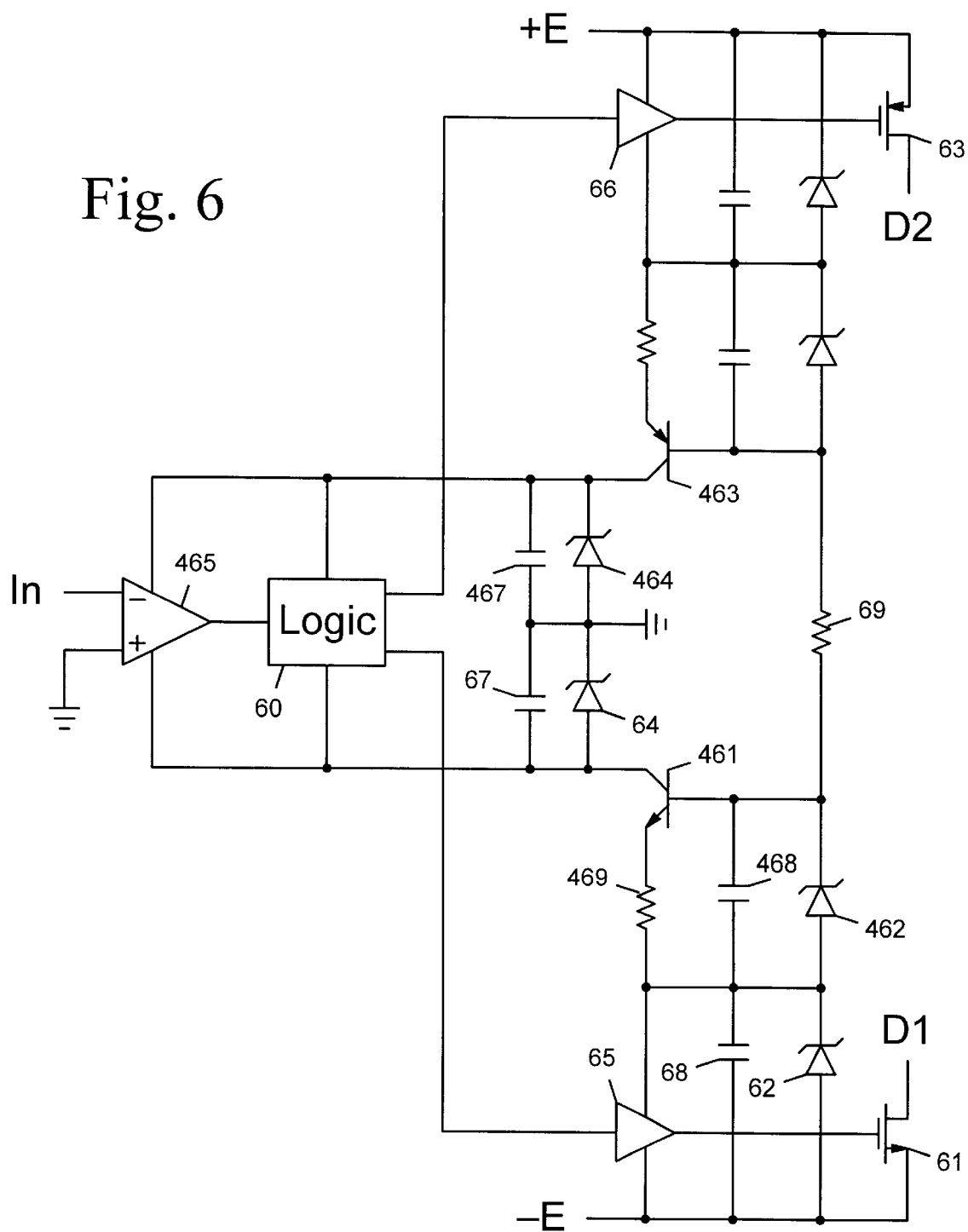
FIG. 6 is the preferred embodiment of continuous mode I²PS incorporating linear regulator.

Similarly, the switch 11 turns on to decrease the output voltage. The voltage applied across the inductors 17 and 416 is substantially equal to a difference between −E and the output voltage. Moreover, the increasing corrective current is equal to a difference between both inductor currents. The inductor currents are unidirectional, wherein the current of the inductor 416 is smaller than or equal to the current of the inductor 17. Furthermore, the inductor 17 is significantly larger than the inductor 416 so that the current thereof drops to zero at a high rate. The switch 11 can turn off at any time, whenever the correction is completed. The flow of the corrective current is interrupted instantaneously. The capacitor 18 stores a supply voltage of the driver 16. The driver 16 comprises a zener diode, not shown for simplicity, for limiting the supply voltage. An equivalent zener diode is depicted in FIG. 6. The diode 412 applies the supply voltage across the inductor 17. Furthermore, the diode 12 applies the supply voltage across the inductor 416. The currents of the inductors 17 and 416 decrease and increase respectively. The diode 412 stops conduction when the inductor currents become even. The diode 12 continues conduction and effectively shorts the inductors 17 and 416 that act like a single inductor. When conduction phases of the switches 11 and 13 overlap, all inductor currents determine the corrective current.

Figure 2:
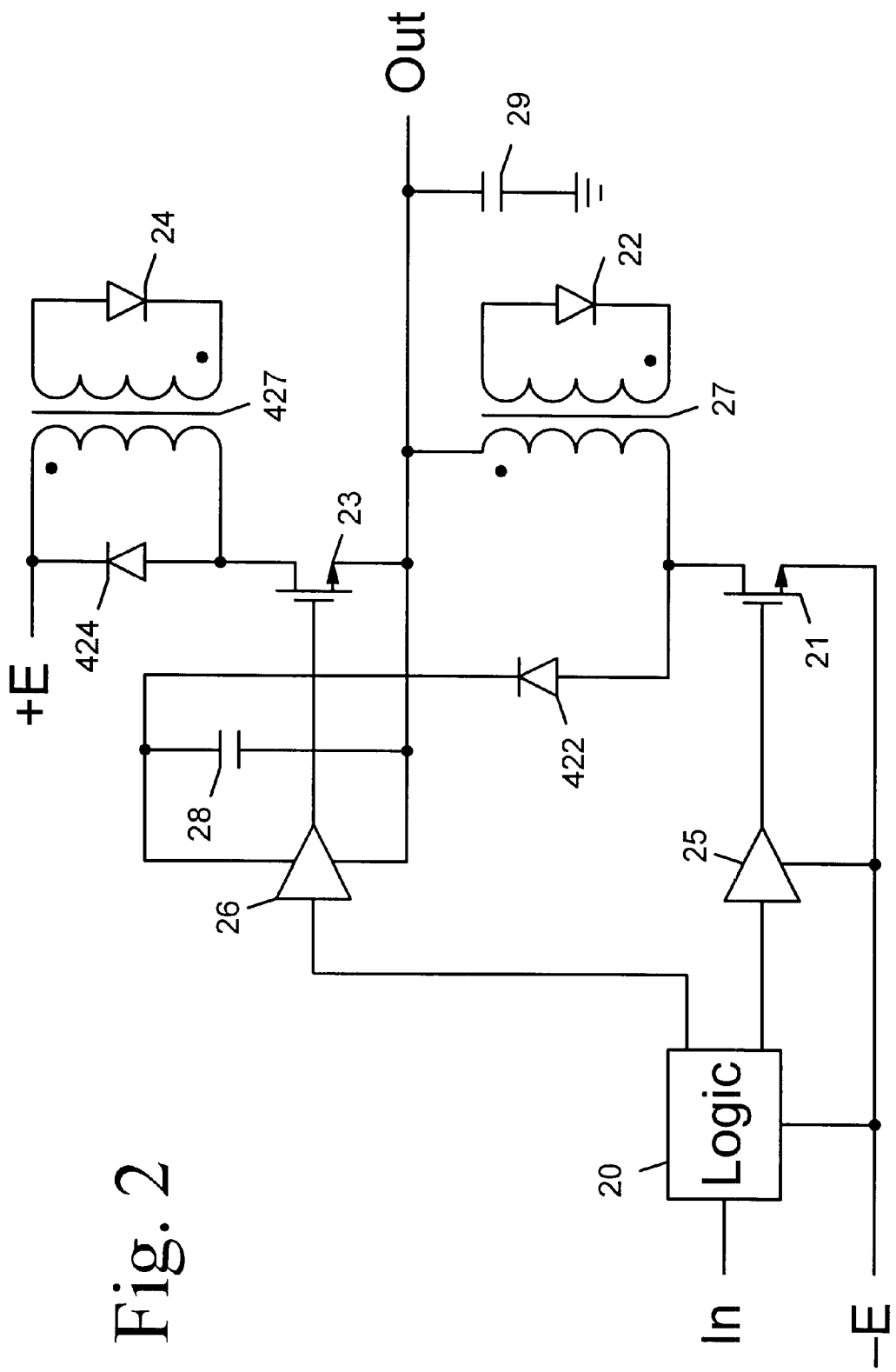
FIG. 2 is an embodiment of continuous mode I²PS comprising single floating driver and implementing leakage inductance.

FIG. 2 is an embodiment of continuous mode I²PS comprising single floating driver and implementing leakage inductance. The flyback transformers are substituted for the inductors of the FIG. 1 embodiment. The input comparator and the resistor network are not shown for simplicity. The optional diode 424 is coupled as the diode 14 of FIG. 1 but serves a different purpose. The operation of the I²PS is very similar to that of the FIG. 1 I²PS. Therefore, only points requiring additional comment will be addressed.

The logic 20 controls the switches 21 and 23 through the drivers 25 and 26 respectively. The drain of the switch 21 is tied to the anode of the diode 422 and the primary winding of the transformer 27. The cathode of the diode 422 is connected to the capacitor 28 and a supply terminal of the driver 26. A positive supply voltage +E is applied to the cathode of the diode 424 and the primary winding of the transformer 427. The drain of the switch 23 is tied to the anode of the diode 424 and the primary winding. The diodes 22 and 24 are tied across the secondary windings of the transformers 27 and 427 respectively. The source of the switch 23, the capacitors 28, 29, the primary winding of the transformer 27 and a reference terminal of the driver 26 are connected to the output of the I²PS. The capacitor 29 is grounded and provides the AC output voltage.

The switch 23 turns on to increase the output voltage. The primary winding of the transformer 427 acts like an inductor. The increasing corrective current is equal to the primary current of the transformer 427. The switch 23 turns off to instantaneously interrupt the corrective current. A leakage inductance of the transformer 427 causes a voltage spike at the drain of the switch 23. The diode 424 clamps that spike substantially to +E. If the diode 424 is unused, intrinsic transient voltage suppressor of the switch 23 clamps the voltage spike. The diode 24 shorts the secondary winding of the transformer 427. The turns ratio of the transformer 427 is below unity. The diode 424 is eventually cut off as its forward voltage exceeds the primary voltage of the transformer 427. Peak secondary current is smaller than peak primary current.

Similarly, the switch 21 turns on to decrease the output voltage. The primary winding of the transformer 27 acts like an inductor. The increasing corrective current is equal to the primary current of the transformer 27. The switch 21 turns off to instantaneously interrupt the corrective current. A leakage inductance of the transformer 27 causes a voltage spike at the drain of the switch 21. The capacitor 28 stores a supply voltage of the driver 26. The driver 26 comprises a zener diode, not shown for simplicity, for limiting the supply voltage. An equivalent zener diode is depicted in FIG. 6. The diode 422 applies the supply voltage across the primary winding of the transformer 27. Moreover, the diode 22 shorts the secondary winding of the transformer 27. The turns ratio of the transformer 27 is below unity. The diode 424 is eventually cut off as the primary voltage drops near zero. An inductor can be added in series with the primary winding of the transformer 27 if its leakage inductance is insufficient.

Figure 3:
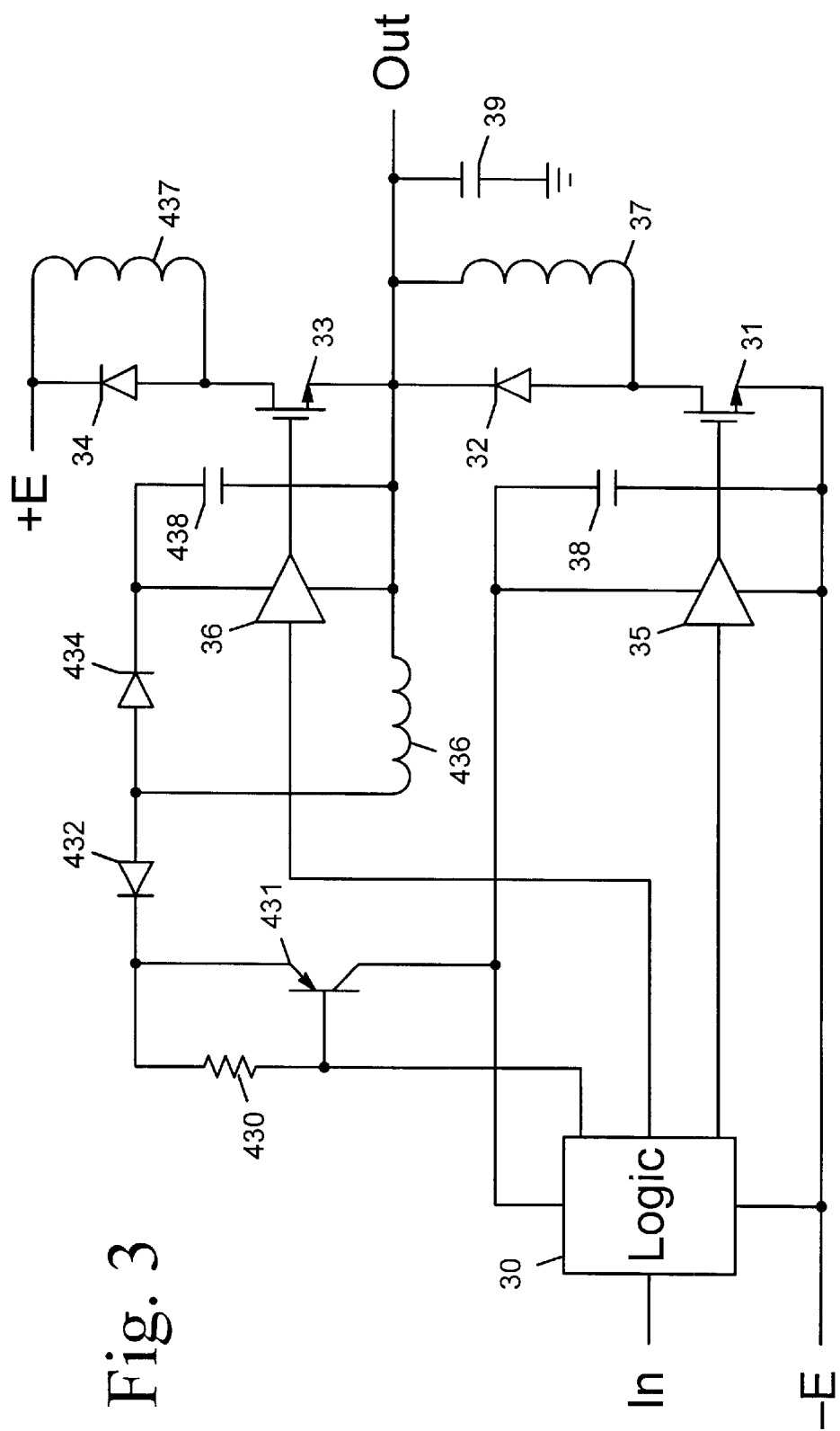
FIG. 3 is the preferred embodiment of continuous mode I²PS comprising single floating driver and incorporating flyback converter.

FIG. 3 is the preferred embodiment of continuous mode I²PS comprising single floating driver and incorporating flyback converter. The embodiments of FIGS. 1 and 2 require an additional supply voltage for the logic and one of the drivers. Moreover, an auxiliary inductor or a transformer having sufficient leakage inductance is required, which may adversely affect performance of the I²PS. Parasitic capacitance coupled to the drain of the switch 11 or 21 is increased. The instant I²PS requires only two external supply voltages. An internal switching regulator delivers power to the logic and both drivers. The logic controls the switches and the switching regulator. Preferably, the I²PS employs a linear power supply for an input comparator. For example, FIG. 6 shows the comparator supplied by a pair of current sources.

The switch 31, the driver 35 and the capacitor 38 represent one switching means. The switch 33, the driver 36 and the capacitor 438 represent the other switching means. The switching regulator has a pair of input terminals for converting a voltage appearing therebetween and providing a supply current. One input terminal is connected to the supply terminal of the driver 35, the other to the output of the I²PS. The inductor 436 attains the supply current and provides a return voltage. The switch 431 selectively applies the voltage appearing between the input terminals across the inductor 436. The diode 434 applies the supply current to the supply terminal of the driver 36. Moreover, the diode 434 limits the return voltage to the supply voltage of the driver 36.

Specifically, the comparator signal is applied to an input of the logic 30. The logic 30 provides a pair of signals that are applied to inputs of the drivers 35 and 36. The drivers 35 and 36 further drive gates of the switches 31 and 33 respectively. A negative supply voltage −E is applied to the source of the switch 31, the capacitor 38, and reference terminals of the logic 30 and the driver 35. The drain of the switch 31 is tied to the anode of the diode 32 and the inductor 37. A positive supply voltage +E is applied to the cathode of the diode 34 and the inductor 437. The drain of the switch 33 is tied to the anode of the diode 34 and the inductor 37. The source of the switch 33, the cathode of the diode 32, the inductors 37, 436, the capacitors 39, 438 and a reference terminal of the driver 36 are connected to the output of the I²PS. The capacitor 39 is grounded and provides the AC output voltage.

The switching regulator comprises the components 430 through 432, 434 and 436. Specifically, an output of the logic 30 is connected to the base of the PNP transistor 431 and the resistor 430. The collector of the switch 431 is connected to the capacitor 38, and supply terminals of the logic 30 and the driver 35. The emitter of the switch 431 is connected to the cathode of the diode 432 and the resistor 430. The inductor 436 is tied to the anodes of the diodes 432 and 434. The cathode of the diode 434 is connected to the capacitor 38 and a supply terminal of the driver 36.

The switch 31 or 33 turns on to decrease or increase the output voltage respectively. The corrective current is equal to the current of the inductor 37 or 437 respectively. If the switch 31 or 33 turns off, the corrective current is interrupted instantaneously. The diode 32 or 34 shorts the inductor 37 or 437, wherein the respective inductor current remains virtually constant. If the switch 31 or 33 turns on again, the corrective current can immediately assume the upheld value of the respective inductor current. When conduction phases of the switches 31 and 33 overlap, the corrective current is equal to a difference between both inductor currents.

The logic 30 controls the switching regulator and assures proper startup. The capacitor 438 stores a supply voltage of the driver 36. The capacitor 38 stores a supply voltage of the logic 30 and the driver 36. The logic 30 monitors the latter voltage and the switching regulator stabilizes it. When supply voltages +E and −E are first applied to the I²PS, all capacitors are discharged. The logic 30 shorts its supply terminal to the base of the switch 431. A supply current flows through the switch 431, the diode 432, the inductor 436, the capacitor 39 and the load, if any. When the capacitor 38 is charged to an adequate level, the logic 30 turns the switch 431 off. The diode 434 applies the current of the inductor 436 to the capacitor 438. However, this current may be insufficient to charge the capacitor 438 to the adequate level. In particular, the inductor 436 can saturate and store minimal energy. When the logic 30 is fully operational, the switch 431 is switched until the capacitor 38 is charged to a higher level. This initial overcharging is necessary in order to charge the capacitor 438 to the adequate level. In the end, the I²PS assumes normal operation. The switching regulator stabilizes the supply voltage across the capacitor 38. The driver 36 comprises a zener diode, not shown for simplicity, for limiting the respective supply voltage. An equivalent zener diode is depicted in FIG. 6.

The switch 431 turns on to increase the supply voltage of the logic 30 and the drivers 35, 36. The voltage across the inductor 436 is equal to a difference between −E and the output voltage, further reduced by the supply voltage stored in the capacitor 38. The corrective current is equal to the current flowing through the inductor 436 if the switches 31 and 33 are turned off. Otherwise, the current of the inductor 436 increases or decreases the corrective current when the switch 31 or 33 is closed respectively. When the switch 431 turns off, the diode 434 applies the supply voltage stored in the capacitor 438 across the inductor 436. A sum of supply currents of the logic 30 and the driver 35 is greater than a supply current of the driver 36. Therefore, the inductor 436 inherently provides sufficient current for charging the capacitor 438.

If the output voltage is near or below the supply voltage stored in the capacitor 38, with reference to −E, the diode 432 is nonconductive. Unless that level of the output voltage is monitored, the logic 30 continues to activate the switch 431. However, the switching regulator is idle. The capacitors 38 and 438 deliver full supply currents to the logic 30 and the drivers 35, 36. The switching regulator can operate independently. For example, the switch 431 can be driven by self-running oscillator that is disabled when the supply voltage stored in the capacitor 38 becomes excessive. The switching regulator draws its input current from the output of the I²PS. Therefore, the operation of the switching regulator may improve noise distribution of the I²PS output voltage. A low-pass filter can more effectively filter it.

Figure 4A:
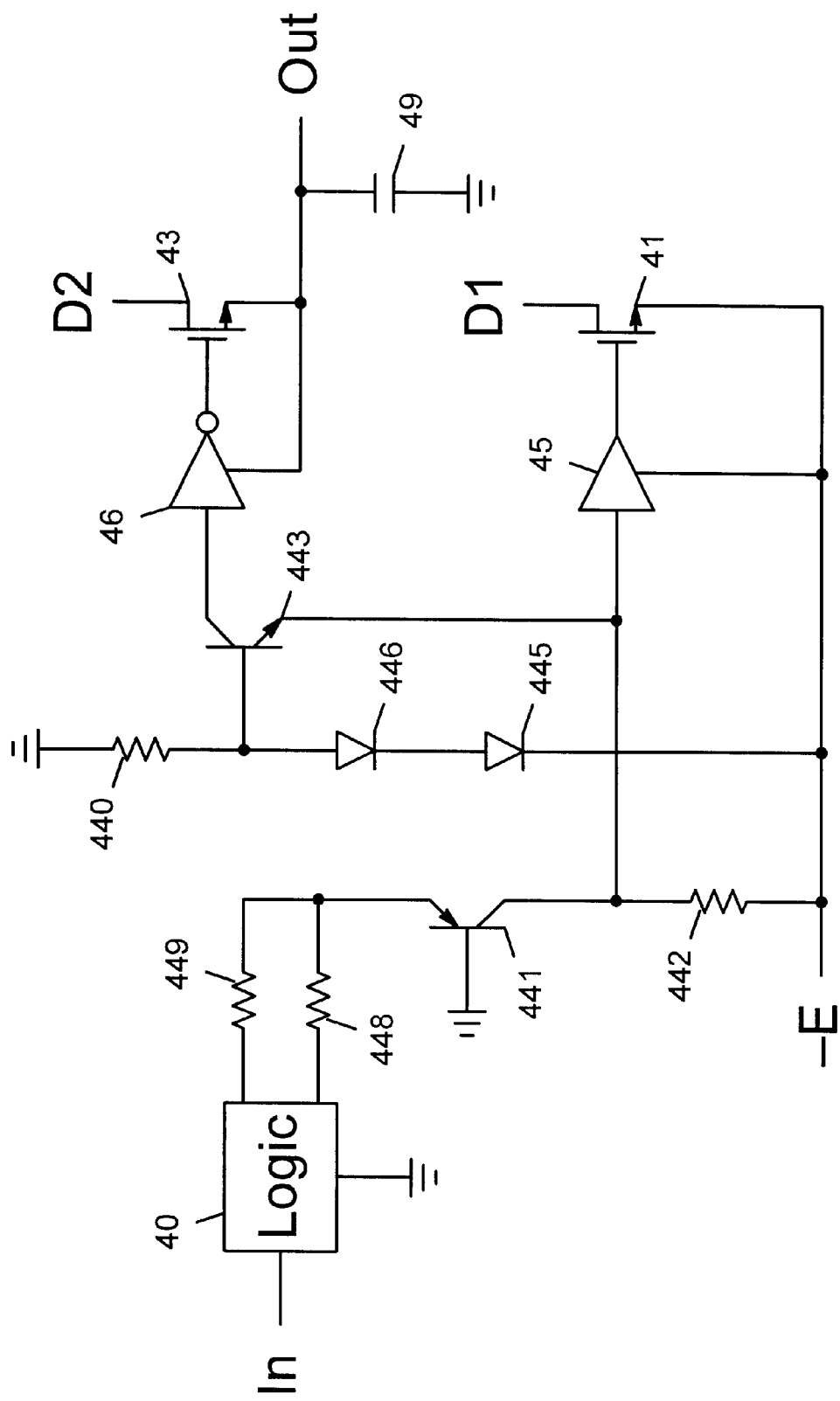
FIG. 4a is an embodiment of voltage shifter for I²PS with single floating driver.

FIG. 4a is an embodiment of voltage shifter for I²PS with single floating driver. It may be convenient to reference the logic to the negative supply voltage −E. A single voltage shifter is necessary to control the switch operating at different potential, as shown in FIG. 3. However, it may be advantageous to ground the logic. For example, the input comparator and the logic may be supplied from an external power source. This reduces current requirements of an internal switching regulator. The logic can be also shared in full-bridge or multi-channel amplifier. The logic provides a pair of signals for driving the output switches. In a conventional circuit, one switch would be required to shift level for the power switch connected to −E and two switches for the floating power switch. However, only two transistors are necessary to accomplish the shifting in the instant embodiment. The transistors operate in common base configuration, which results in shortest transition time.

The voltage shifter operates at three different potentials. It provides a first binary output signal referenced to a negative supply voltage −E in response to a first binary input signal referenced to ground and provides a second binary output signal referenced to the output of the I²PS in response to a second binary input signal also referenced to ground. A first current source provides a first current in response to the first and second binary input signals. A resistor provides a voltage referenced to −E in response to the first current. A first driver provides the first binary output signal in response to the voltage. A second current source provides a second current in response to the voltage. A second driver provides the second binary output signal in response to the second current. The first current source includes a pair of series coupled resistors with the first and second binary input signals separately applied thereto. The first current source further comprises the transistor 441. The second current source comprises the transistor 443 and its biasing network. The base, emitter and collector of the transistors 41 and 43 can be referred to as base, emitter and collector electrodes, respectively, since other types of transistors can be used.

Specifically, the logic 40 receives an input signal from a comparator. It provides a pair of the output signals for controlling the switches 41 and 43. The signals are separately applied to the resistors 449 and 448. Both resistors are connected to the emitter of the PNP transistor 441. The collector of the transistor 441, the emitter of the NPN transistor 443, an input of the non-inverting driver 45 and the resistor 442 are tied together. The collector of the switch 443 is connected to an input of the inverting driver 46. The drivers 45 and 46 further drive gates of the switches 41 and 43 respectively.

The drains of the switches 41 and 43, D1 and D2 respectively, are coupled to an output network such as 32, 34, 37 and 437 of FIG. 3. −E is applied to the source of the switch 41, the cathode of the diode 445, the resistor 442 and a reference terminal of the driver 45. The base of the transistor 443 is connected to the anode of the diode 446 and the resistor 440. The diodes 445 and 446 are in series. A more elaborate biasing network can be used to compensate for temperature variations of base-emitter voltage of the transistor 443. The output of the I²PS is connected to the source of the switch 43, the capacitor 49 and a reference terminal of the driver 46. The logic 40, the base of the transistor 441, the resistor 440 and the capacitor 49 are grounded. The capacitor 49 provides the AC output voltage.

The voltage shifter allows 3-state output. The logic 40 provides IDLE and DOWN signals that are applied to the resistors 449 and 448 respectively. If the DOWN signal is high, the switches 41 and 43 are turned on and off respectively. The state of the IDLE signal is insignificant as the DOWN signal overwrites it. If the IDLE and DOWN signals are low, the switches 41 and 43 are turned off and on respectively. Finally, if the IDLE and DOWN signals are high and low respectively, the switches 41 and 43 are turned off. The I²PS is in idle state, wherein no correction of the output voltage is performed.

Specifically, the transistors 441 and 443 operate in linear region. When the IDLE and DOWN signals are low, the transistor 441 is cut off as the emitter voltage thereof is near zero. The resistor 440 and the series coupled diodes 445, 446 bias the transistor 443. The voltage across the resistor 442 is approximately equal to the forward voltage of the diode 445. The input voltage of the driver 45 is below a threshold voltage and the switch 41 is turned off. The collector current of the transistor 443 is applied to the driver 46. An input section thereof may comprise a current amplifier or a pull-up resistor. The input signal of the driver 46 is low and the switch 43 is turned on.

When the IDLE signal is high and DOWN signal is low, the I²PS is in idle state. The resistor 449 has higher value than the resistor 448. The transistor 441 conducts a collector current that results in a small voltage drop across the resistor 442. The voltage drop is greater than the forward voltage of the diode 445. As a result, the transistor 443 is cut off. The input signal of the driver 46 is high and the switch 43 is turned off. Moreover, the voltage drop is also smaller than the threshold voltage of the driver 45. The switch 41 is cut off. When the DOWN signal is high, the voltage across the resistor 442 is above the threshold voltage. The switch 41 is turned on. The transistor 443 and the switch 43 are cut off. If the IDLE signal is high as well, the voltage across the resistor 442 is yet higher.

For example, the IDLE and DOWN signals are 0V when low and 4V when high. The threshold voltage of the driver 45 is 1.5V. When both signals are low, the voltage across the resistor 442 is 0.6V. When the IDLE signal is high and DOWN signal is low, the input voltage of the driver 45 is 0.8V. The transistor 443 is cut off as its base-emitter voltage is merely 0.4V. The resistor 449 is 2.5 times greater than the resistor 448. Therefore, the input voltage of the driver 45 is 2V when the IDLE signal is low and DOWN signal is high. When both signals are high, the input voltage of the driver 45 is above 2V.

Figure 4B:
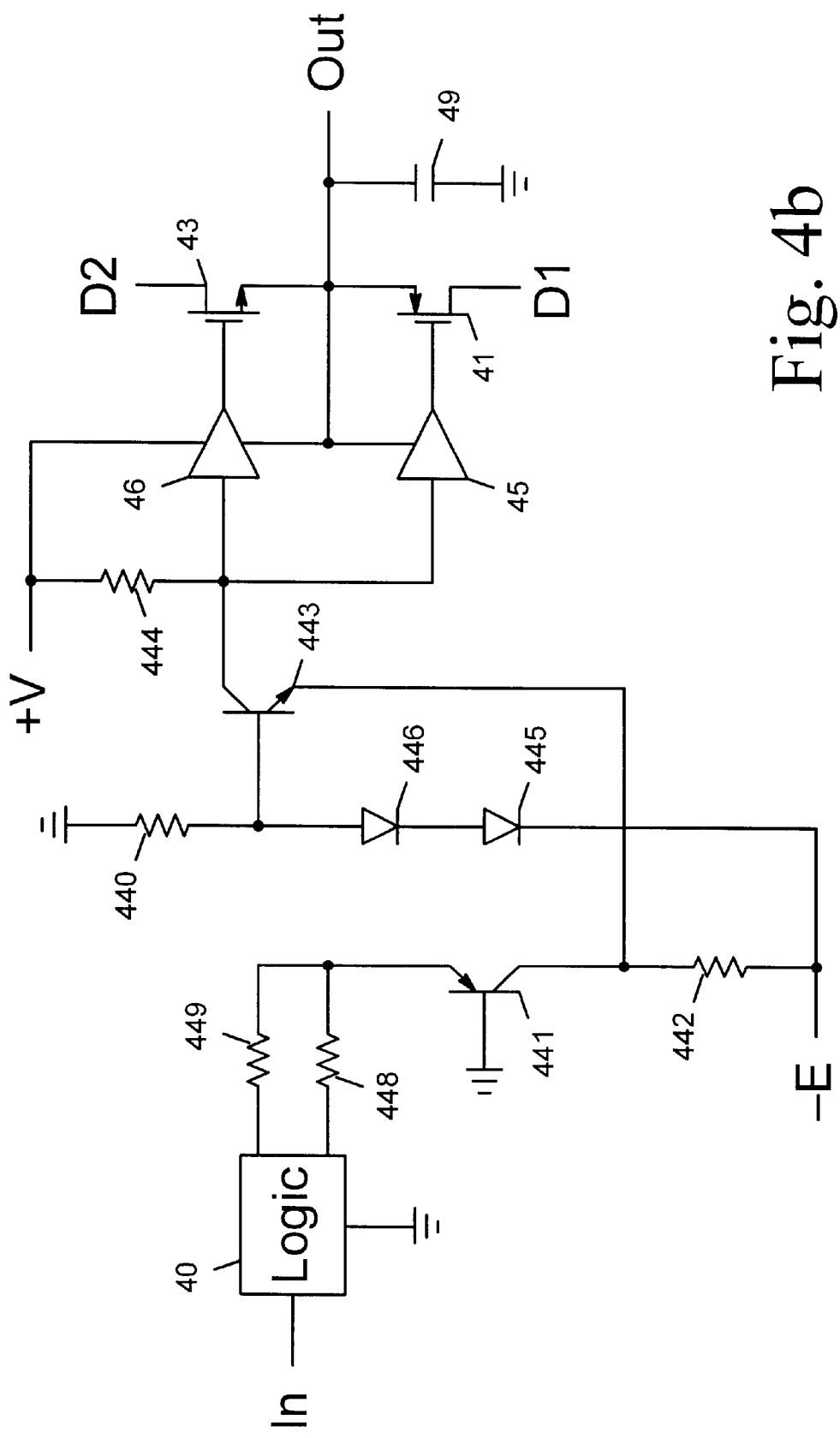
FIG. 4b is an embodiment of voltage shifter for I²PS with floating drivers.

FIG. 4b is an embodiment of voltage shifter for I²PS with floating drivers. The voltage shifter is based on the FIG. 4a embodiment, whereas both output switches are referenced to the output of the I²PS. The remaining portion of the circuit is the same. Specifically, the collector of the switch 443 is connected to the pull-up resistor 444 and inputs of the drivers 45 and 46. The drivers 45 and 46 further drive gates of the switches 41 and 43 respectively. The former switch is P-channel MOSFET. An internal supply voltage +V is applied to the resistor 444 and a supply terminal of the driver 46. +V is referenced to the output of the I²PS. The output is also connected to the sources of the switches 41, 43, the capacitor 49, a supply terminal of the driver 45 and a reference terminal of the driver 46. The drains of the switches 41 and 43, D1 and D2 respectively, are coupled to an output network such as 72, 74, 77 and 477 of FIG. 7.

The voltage shifter operates at three different potentials. However, both binary input signals and both binary output signals are referenced to ground and the output of the I²PS respectively. Both current sources represent a current mirror that is referenced to the negative supply voltage −E. The emitter current of the transistor 441 is reflected as the collector current of the transistor 443. Both transistors operate in common base configuration, which results in shortest transition time. The voltage drop across the resistor 444 is proportional to the collector current. Each driver provides a binary output signal in response to the voltage drop.

The voltage shifter allows 3-state output. The logic 40 provides a pair of output signals that are applied to the resistors 448 and 449 having equal values. The transistors 441 and 443 operate in linear region. If both output signals are low, the transistor 441 is cut off. The voltage across the resistor 442 is approximately equal to the forward voltage of the diode 445. The input voltage of the drivers 45 and 46 is referenced to the output of the I²PS. The voltage is negative, whereby the switches 41 and 43 are turned on and off respectively.

If one of the output signals is high, the transistor 441 conducts a small collector current. The voltage drop across the resistor 442 is approximately equal to one half the forward voltage of the diode 445. The collector current of the transistor 443 is cut in half. The input voltage of the drivers 45 and 46 is positive, whereby the switches 41 and 43 are turned off. The I²PS is in idle state, wherein no correction of the I²PS output voltage is performed. Finally, if both output signals are high, the transistor 441 conducts full collector current. The voltage across the resistor 442 is greater than the forward voltage of the diode 445, whereby the transistor 443 is cut off. The input voltage of the drivers 45 and 46 is equal to +V. The switches 41 and 43 are turned off and on respectively.

Figure 5:
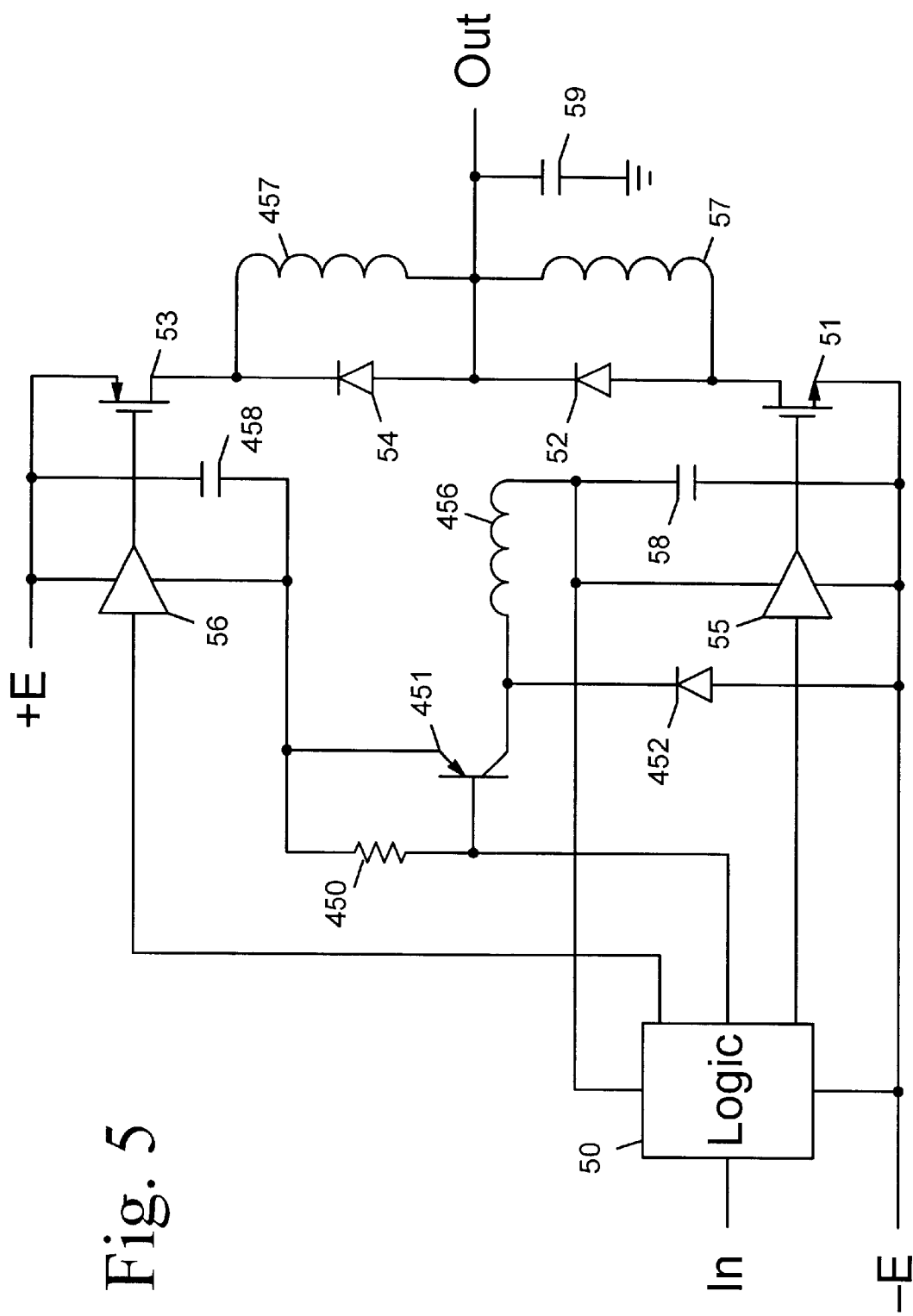
FIG. 5 is the preferred embodiment of continuous mode I²PS incorporating buck converter.

FIG. 5 is the preferred embodiment of continuous mode I²PS incorporating buck converter. An internal switching regulator delivers power to the logic and both drivers, similar to the FIG. 3 embodiment. However, the regulator is supplied from the main power source since both drivers are coupled to supply rails. Specifically, the comparator signal is applied to the input of the logic 50. The logic 50 controls the drivers 55 and 56 that drive gates of the switches 51 and 53 respectively. The drain of the switch 51 is tied to the anode of the diode 52 and the inductor 57. The drain of the switch 53, P-channel MOSFET, is tied to the cathode of the diode 54 and the inductor 457.

Another output of the logic 50 is connected to the base of the PNP transistor 451 and the resistor 450. The collector of the switch 451 is tied to the cathode of the diode 452 and the inductor 456. The inductor 456 is further tied to the capacitor 58 and supply terminals of the components 50, 55. The emitter of the switch 451 is connected to the resistor 450, the capacitor 458 and a reference terminal of the driver 56. A positive supply voltage +E is applied to the source of the switch 53, a supply terminal of the driver 56 and the capacitor 458. A negative supply voltage −E is applied to the source of the switch 51, the anode of the diode 452, the capacitor 58 and reference terminals of the components 50, 55. The cathode of the diode 52, the anode of the diode 54, the inductors 57, 457 and the capacitor 59 are connected to the output of the I²PS. The capacitor 59 is grounded and provides the AC output voltage.

The switch 51, the driver 55 and the capacitor 58 represent a first switching means. The source of the switch 51, the capacitor 58 and the reference terminal of the driver 55 are connected to a reference terminal of the first switching means. The capacitor 58 and the supply terminal of the driver 55 are connected to a supply terminal of the first switching means. The switch 53, the driver 56 and the capacitor 458 represent a second switching means. The source of the switch 53, the capacitor 458 and the supply terminal of the driver 56 are connected to a reference terminal of the second switching means. The capacitor 458 and the reference terminal of the driver 56 are connected to a supply terminal of the second switching means. Therefore, the reference terminals of both switching means are connected to the power supply. The switching regulator has a pair of input terminals that are separately tied to the supply terminals of the switching means. The switch 451 selectively applies a voltage appearing between those terminals across the inductor 456. The inductor 456 attains the supply current and provides a return voltage. Therefore, the switch 451 selectively applies the supply current to the supply terminal of the second switching means. The diode 452 limits the return voltage to the supply voltage of the first switching means.

The switch 51 or 53 turns on to decrease or increase the output voltage respectively. The corrective current is equal to the current of the inductor 57 or 457 respectively. If the switch 51 or 53 turns off, the corrective current is interrupted instantaneously. The diode 52 or 54 shorts the inductor 57 or 457, wherein the respective inductor current remains virtually constant. If the switch 51 or 53 turns on again, the corrective current can immediately assume the upheld value of the respective inductor current. If conduction phases of the switches 51 and 53 overlap, the corrective current is equal to a difference between both inductor currents.

The logic 50 controls the switching regulator and assures proper startup. The regulator delivers power to the logic 50 and the drivers 55, 56. The supply voltage of the driver 56 is stored in the capacitor 458 and limited by an internal zener diode. An equivalent zener diode is depicted in FIG. 6. The capacitor 58 stores a supply voltage of the logic 50 and the driver 55. The logic 50 also monitors the voltage. When the supply voltages +E and −E are first applied to the I²PS, all capacitors are discharged. The logic 50 provides a current to the base of the switch 451 as to turn it on. The supply current flows through the switch 451, the inductor 456 and the capacitors 58, 258. When the capacitor 58 is charged to an adequate level, the logic 50 turns the switch 451 off. A sum of supply currents of the logic 50 and the driver 55 is greater than supply current of the driver 56. Therefore, the capacitor 458 is fully charged before charging of the capacitor 58 is completed.

The switch 451 turns on to increase the supply voltage of the logic 50 and the drivers 55, 56. The voltage across the inductor 456 is equal to a sum of the rail-to-rail voltage reduced by the supply voltages stored in the capacitors 58 and 458. In contrast to the FIG. 3 embodiment, the corrective current is unaffected by the input current of the switching regulator. If the switch 451 turns off, the diode 452 applies the respective supply voltage across the inductor 456. A sum of the supply currents of the logic 50 and the driver 55 is greater than supply current of the driver 56. Therefore, the switch 451 provides sufficient current for charging the capacitor 458. The switching regulator can operate independently of the amplifier itself. For example, the switch 451 can be driven by self-running oscillator that is disabled when the supply voltage stored in the capacitor 58 becomes excessive.

FIG. 6 is the preferred embodiment of continuous mode I²PS incorporating linear regulator. Similar to the FIG. 5 embodiment, the regulator is supplied from the main power source. Both drivers are coupled to supply rails. In the simplest case, the regulator comprises a single current source that delivers power to the drivers. A separate power supply is then required for supplying the comparator and the logic. However, the linear regulator is capable of delivering a minimal ripple current. It is thus best suitable to supply the input circuit. Furthermore, the regulator is optimized to minimize noise injected into signal ground. For the same reason, the logic is ungrounded.

Specifically, the input voltage is applied to the inverting input of the comparator 465. The output signal of the comparator 465 is applied to the logic circuit 60. The collector of the NPN transistor 461 is connected to the anode of the zener diode 64, the capacitor 67, a negative supply terminal of the comparator 465 and a reference terminal of the logic 60. The collector of the PNP transistor 463 is connected to the cathode of the zener diode 464, the capacitor 467 and positive supply terminals of the components 60, 465. The non-inverting input of the comparator 465, the cathode of the diode 64, the anode of the diode 464 and the capacitors 67, 467 are grounded. The comparator 465 determines polarity of the input voltage. A resistor divider, such as 413, 414 of FIG. 1, can be used to apply the input voltage to the inverting input of the comparator 465.

A supply terminal of the driver 65 is connected to the cathode of the zener diode 62, the anode of the zener diode 462, the capacitors 68, 468 and the resistor 469. The cathode of the diode 462 is tied to the base of the transistor 461, the capacitor 468 and the resistor 69. The emitter of the transistor 461 is in series with the resistor 469. The logic 60 provides a pair of signals that are applied to inputs of the drivers 65 and 66. The drivers 65 and 66 further drive gates of the switches 61 and 63 respectively. A negative supply voltage −E is applied to the source of the switch 61, the anode of the zener diode 62, the capacitor 68, and a reference terminal of the driver 65. A positive supply voltage +E is applied to the source of the switch 63, P-channel MOSFET, a supply terminal of the driver 65 and the respective capacitor. The drains of the switches 61 and 63, D1 and D2 respectively, are coupled to an output network such as 52, 54, 57 and 457 of FIG. 5.

The power supply includes a pair of current sources. In one current source, a bias voltage is limited by the diode 462 and stored in the capacitor 468. The bias voltage, reduced by base-emitter voltage of the transistor 461, appears across the resistor 469. Therefore, the transistor 461 provides a constant collector current. The current is applied between the components 60, 465 on one side and the driver 65 on the other side. The negative supply voltage for the components 60, 465 is limited by the diode 64 and stored in the capacitor 67. Similarly, the supply voltage of the driver 65 is limited by the diode 62 and stored in the capacitor 68. The other current source provides a constant current between the components 60, 465 on one side and the driver 66 on the other side. The current source is built analogously. In particular, the positive supply voltage for the components 60, 465 is limited by the diode 464 and stored in the capacitor 467. The resistor 69 provides a bias current to both current sources.

The current sources are set to deliver a largest supply current. For example, the current sources deliver a sum of supply currents of the comparator 465 and the logic 60 if the sum is larger than a supply current of either driver. Moreover, the current sources provide even currents. A difference between the currents is applied to ground. Therefore, any instability of the currents contributes to ground noise. By contrast, voltage drift of the currents is insignificant. The capacitor 468 greatly increases stability of the respective current source. A voltage regulator sensing the voltage across the resistor 469 can be substituted for the diode 462 to precisely set the current. Similar remarks apply to the current source comprising the transistor 463. However, this current source is superfluous if the components 60 and 465 are supplied from an external power source. The collector of the transistor 461 is then tied to the reference terminal of the driver 66.

Figure 7:
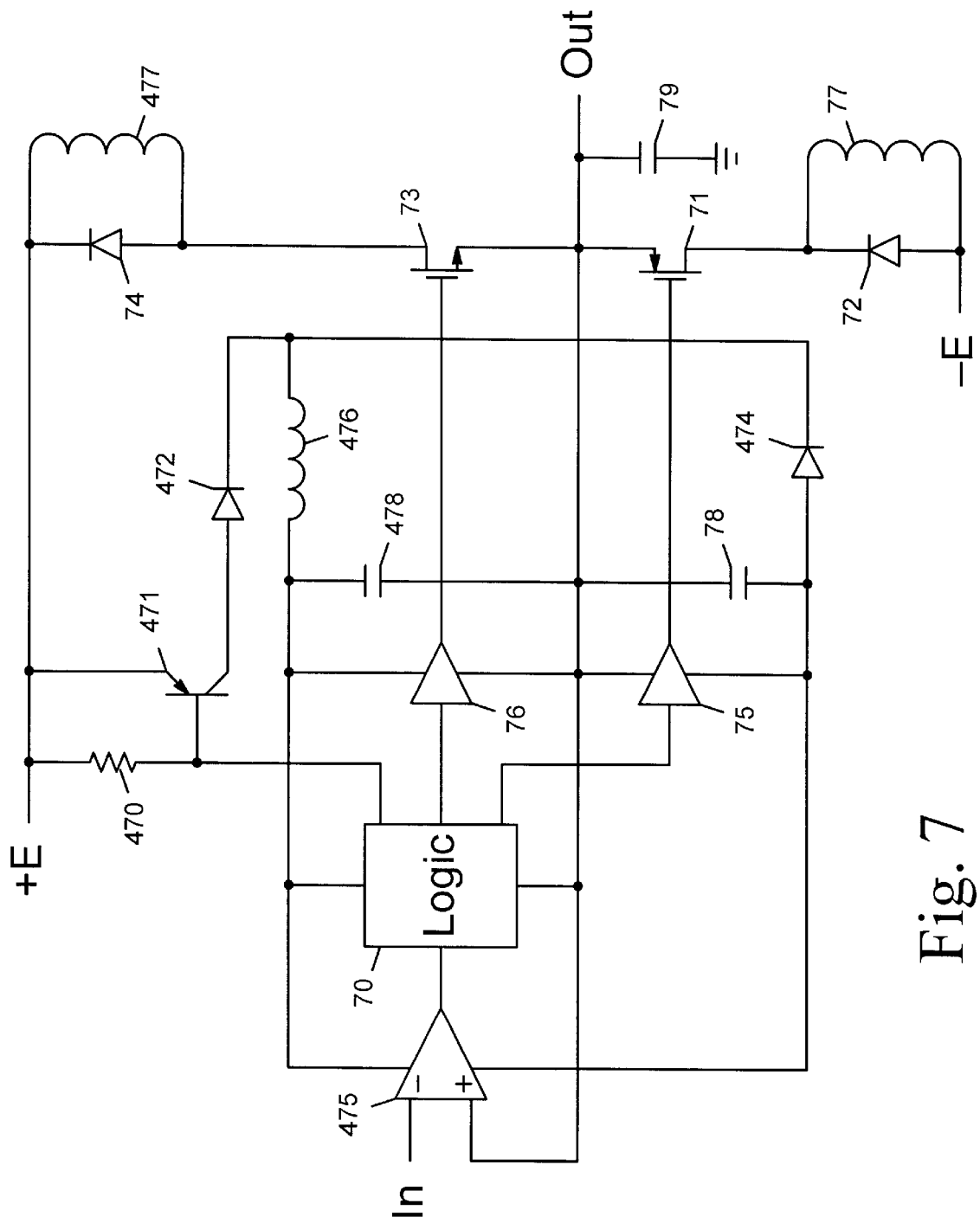
FIG. 7 is an embodiment of continuous mode I²PS comprising floating drivers and incorporating buck converter.

FIG. 7 is an embodiment of continuous mode I$^2$PS comprising floating drivers and incorporating buck converter. In an I$^2$PS, at least one driver can operate at potential that varies with reference to potential of the logic. This requires a voltage shifter in order to transfer the respective binary signal from the logic to the driver. Moreover, the comparator is used to set the gain of the I$^2$PS. This gain effectively reduces open-loop gain of the comparator and results in lower resolution of the I$^2$PS. Another concern is power supply and ground noise. Grounded components, such as the comparator and the logic, produce noise that can interfere with the grounded preamplifier.

The instant I$^2$PS employs output switches of opposite polarities, similar to the FIG. 5 embodiment. However, the switches have sources connected to the output of the I$^2$PS. Furthermore, the comparator and the logic are also referenced to the output. The only voltage shifter that may be required operates at a small and stable voltage. The I$^2$PS inherently has unity gain. A quantization error of the comparator corresponds to the resolution of the I?PS. The analog and digital sections of the I$^2$PS are separated, which minimizes noise. Other advantages of the unity gain I$^2$PS are pointed out with reference to FIG. 30 that illustrates an example of the preamplifier.

Specifically, the input signal is applied to the inverting input of the comparator 475. A comparator output signal is applied to an input of the logic 70. The logic 70 provides three output signals. Two signals are applied to inputs of the drivers 75 and 76 that further drive the gates of the switches 71 and 73 respectively. The drain of the switch 71, P-channel MOSFET, is tied to the cathode of the diode 72 and the inductor 77. A negative supply voltage −E is applied to the anode of the diode 72 and the inductor 77. The drain of the switch 73 is tied to the anode of the diode 74 and the inductor 477. A positive supply voltage +E is applied to the cathode of the diode 74, the inductor 477 and the switching regulator. The sources of the switches 71, 73, the capacitors 78, 79, 478, the non-inverting input of the comparator 475, a supply terminal of the driver 75 and reference terminals of the components 70, 76 are connected to the output of the I$^2$PS. The capacitor 79 is grounded and provides the AC output voltage.

The switching regulator comprises the components 470 through 472, 474 and 476. It delivers power to the comparator 475, the logic 70 and the drivers 75, 76. The logic controls the switches and the switching regulator. Specifically, the third output of the logic 70 is connected to the base of the PNP transistor 471 and the resistor 470. The emitter of the switch 471 and the resistor 470 receive +E. The collector of the switch 471 is in series with the diode 472. The inductor 476 is tied to cathodes of the diodes 472 and 474. The inductor 476 is further connected to the capacitor 78, a positive supply terminal of the comparator 475 and supply terminals of the components 70, 76. The anode of the diode 474 is connected to the capacitor 78, a negative supply terminal of the comparator 475 and a reference terminal of the driver 76.

The switch 71 or 73 turns on to decrease or increase the output voltage respectively. The corrective current is equal to the current of the inductor 77 or 477 respectively. If the switch 71 or 73 turns off, the corrective current is interrupted instantaneously. The diode 72 or 74 shorts the inductor 77 or 477, wherein the respective inductor current remains virtually constant. The logic 70 controls the switching regulator and assures proper startup. The capacitor 78 stores a supply voltage for the comparator 475 and the driver 75. The driver 75 comprises a zener diode, not shown for simplicity, for limiting the supply voltage. An equivalent zener diode is depicted in FIG. 6. The capacitor 478 stores a supply voltage of the comparator 475, the logic 70 and the driver 76. The logic 70 monitors the latter voltage and the switching regulator stabilizes it.

The switch 471 turns on to increase the respective supply voltages. The current of the inductor 476 charges the capacitor 478. When the switch 471 turns off, the diode 474 applies a sum of the supply voltages stored in the capacitors 37 and 478 across the inductor 476. Positive and negative supply currents are delivered to the components 70, 76, 475 and 75, 475 respectively. The positive supply current is greater than a negative supply current. Therefore, the inductor 476 provides sufficient current for charging the capacitor 78. If a sum of the output voltage and the supply voltage stored in the capacitor 478 is near or above +E, the diode 472 is nonconductive. Unless that level of the output voltage is monitored, the logic 70 continues to activate the switch 471. However, the switching regulator is idle. The capacitors 78 and 478 deliver full supply currents. The switching regulator can operate independently.

Figure 8:
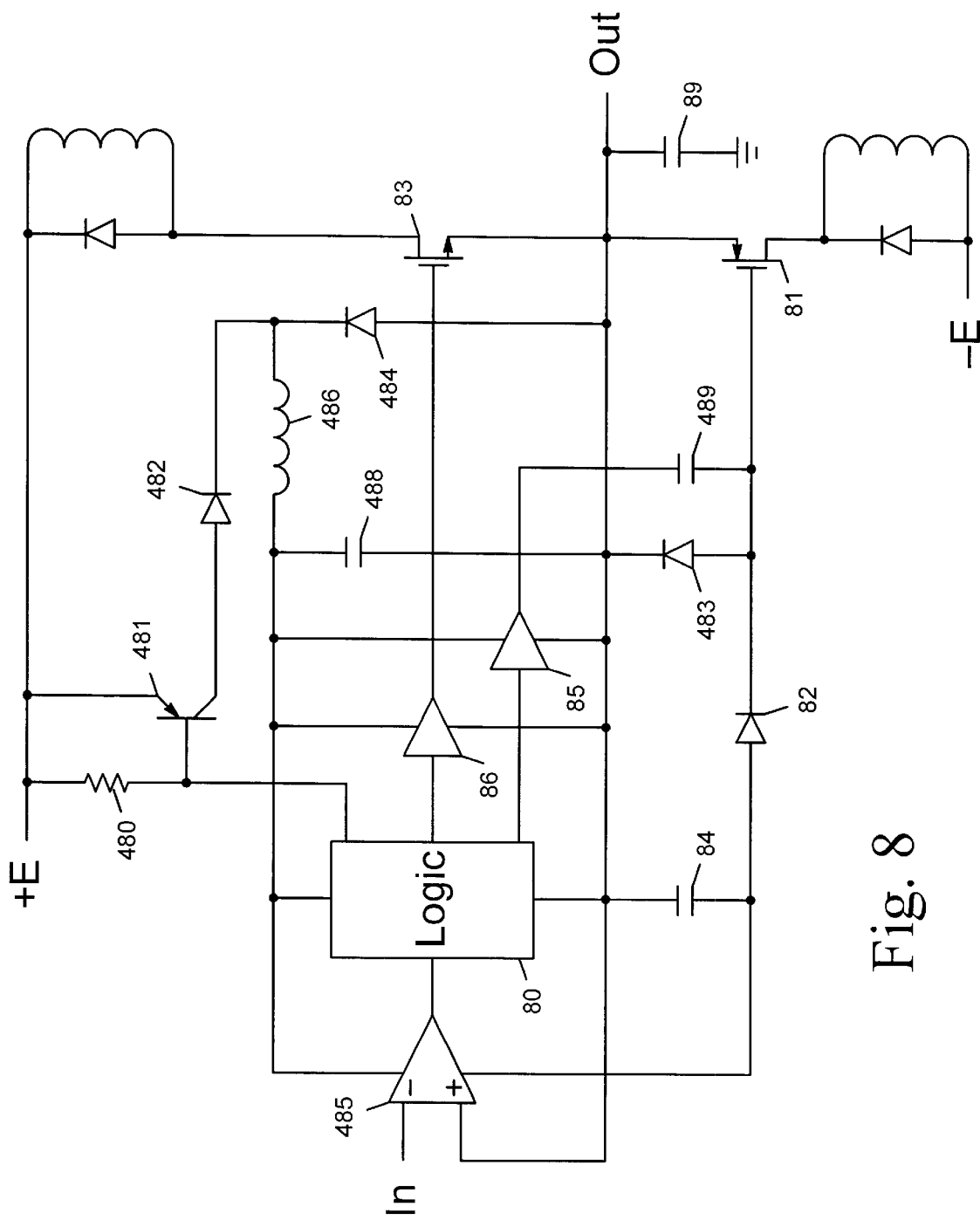
FIG. 8 is another embodiment of continuous mode I²PS comprising floating drivers, and incorporating buck converter and charge pump.

FIG. 8 is another embodiment of continuous mode I²PS comprising floating drivers, and incorporating buck converter and charge pump. The I²PS is based on the FIG. 7 embodiment, whereas both drivers share one supply voltage. This dramatically improves efficiency of the switching regulator. The driver 75 of FIG. 7 comprises a zener diode, not shown for simplicity, for limiting the supply voltage. The equivalent zener diode is eliminated in the instant embodiment. Two components are added to provide a negative supply voltage to the input comparator. Only four components are connected differently.

Specifically, the sources of the switches 81, 83, the cathode of the diode 483, the anode of the diode 484, the capacitors 84, 89, 488, the non-inverting input of the comparator 485 and reference terminals of the components 80, 85, 86 are connected to the output of the I²PS. A positive supply voltage is stored in the capacitor 488 and applied to supply terminals of the components 80, 85, 86 and 485. The switch 81, P-channel MOSFET, requires a negative gate voltage. Therefore, the output voltage of the driver 85 is applied through the capacitor 489 to the gate of the switch 81. The switch 81, the driver 85, the capacitor 489 and the diodes 82, 483 represent a first switching means. The switch 83, the driver 86 and the capacitor 488 represent a second switching means. Supply terminals of the first and second switching means are coupled to each other. They correspond to the supply terminals of the drivers 85 and 86 respectively.

The components 82 and 84 are added to develop a regulated negative voltage. The capacitor 489 is connected to the gate of the switch 81, the cathode of the diode 82 and the anode of the diode 483. The diode 483 maintains a minimum voltage across the capacitor 489. The anode of the diode 82 is tied to capacitor 84 and a negative supply terminal of the comparator 485. The diode 82 rectifies the gate voltage of the switch 81. The capacitor 84 stores the negative supply voltage that is near a peak of the gate voltage. The negative supply voltage is regulated since the switching regulator stabilizes the positive supply voltage. Moreover, the output voltage of the driver 85 varies within a predetermined range. Usually, the voltage swings from rail to rail.

The switch 81 or 83 turns on to decrease or increase the output voltage respectively. The corrective current is equal to the current of the inductor coupled to the respective drain. If the switch 81 or 83 turns off, the corrective current is interrupted instantaneously. The parallel coupled diode effectively shorts the respective inductor, wherein the current thereof remains virtually constant. The logic 80 monitors the positive supply voltage and controls the switching regulator. The switch 481 turns on to increase the positive supply voltage stored in the capacitor 488. When the switch 481 is turned off, the diode 484 applies that voltage across the inductor 486. If a sum of the output voltage and the positive supply voltage is near or above +E, the diode 482 is nonconductive. The switching regulator is idle.

Figure 9:
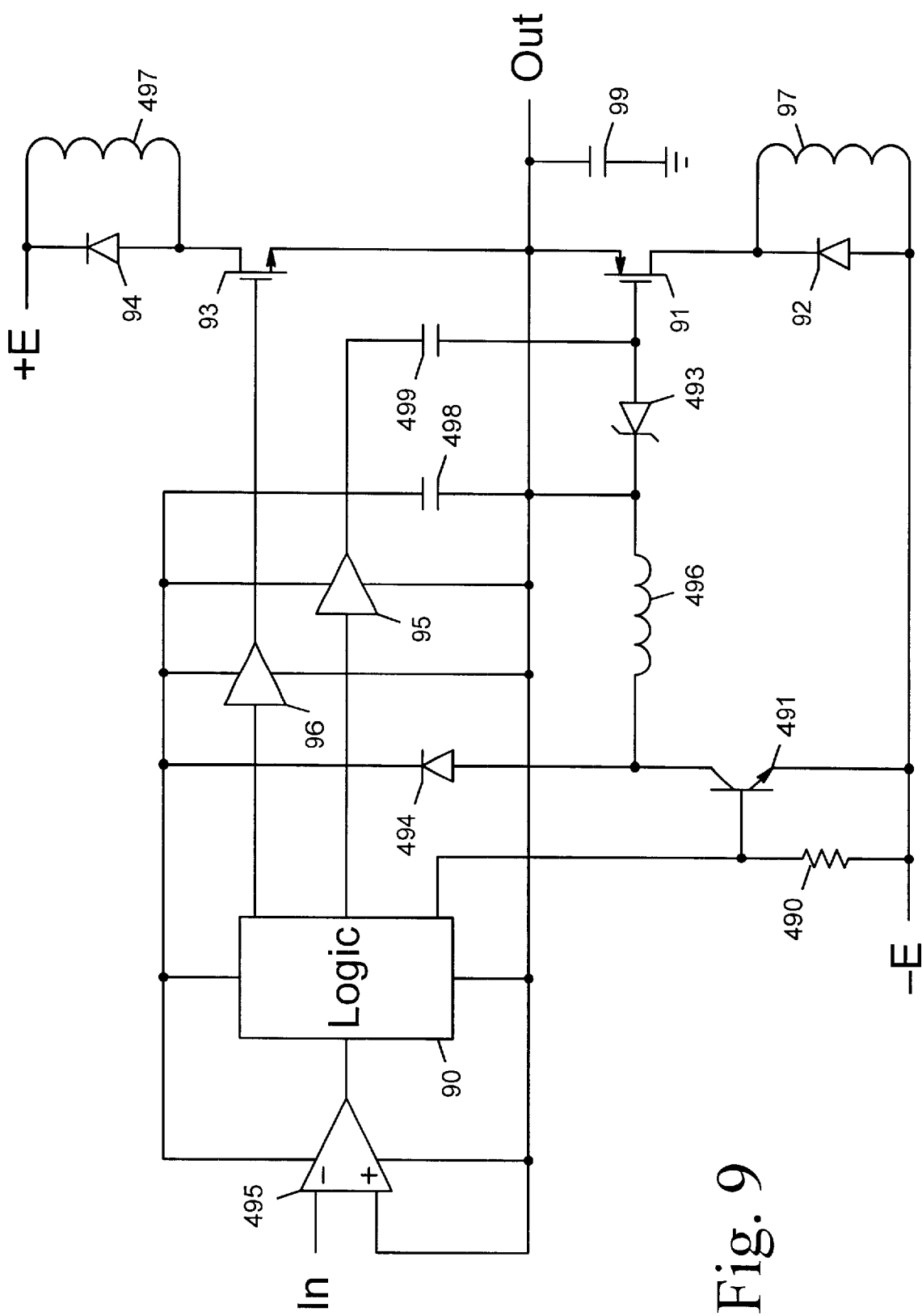
FIG. 9 is the preferred embodiment of continuous mode I²PS comprising floating drivers and incorporating flyback converter.

FIG. 9 is the preferred embodiment of continuous mode I²PS comprising floating drivers and incorporating flyback converter. The I²PS is based on the FIG. 8 embodiment, whereas a single supply comparator is employed. Moreover, the idle mode of the switching regulator is eliminated. Only points requiring additional comment will be addressed. The switching regulator comprises the components 490, 491, 494 and 496. The logic 90 provides a control current to the base of the NPN transistor 491 and the resistor 490. The emitter of the switch 491 and the resistor 490 receive −E. The collector of the switch 491 is tied to the anode of the diode 492 and the inductor 496.

The switching regulator is operative in full range of the I²PS output voltage. Even when the output voltage is near −E, the collector-emitter voltage of the switch 491 remains positive. The capacitor 499 provides for a voltage shift as to develop a negative gate voltage of the switch 91, P-channel MOSFET. Moreover, the gate-source capacitance of the switch 91 is a primary load of the driver 95. The zener diode 493 is necessary in order to maintain the voltage across the capacitor 499 within a predetermined range. The zener voltage is slightly higher than output voltage swing of the driver 95. If the comparator 495 requires a negative supply voltage, a diode and a capacitor can be added, as illustrated in FIG. 8. A regular diode can be substituted for the zener diode 493, unless a negative supply current of the comparator 495 is very small.

Figure 10:
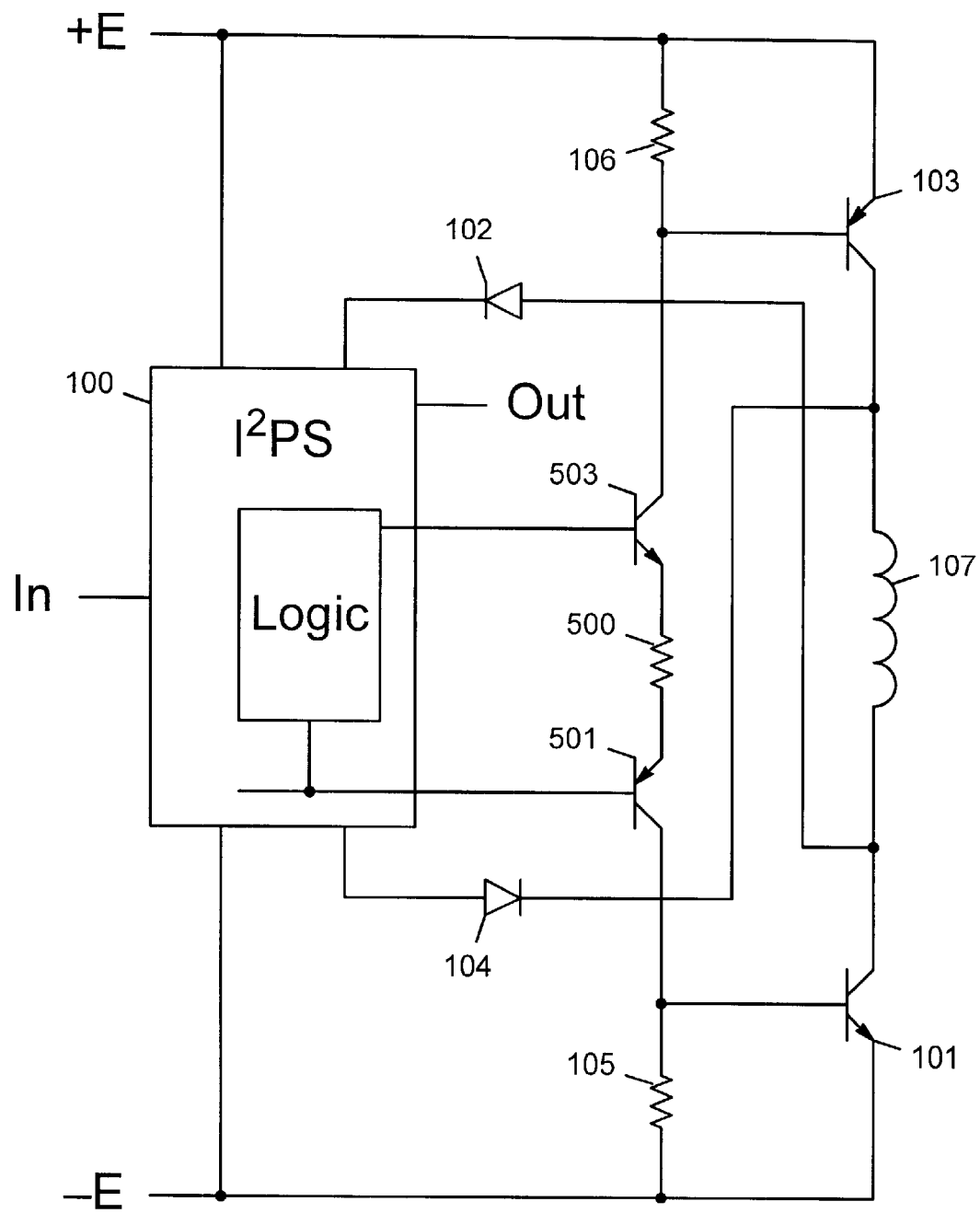
FIG. 10 illustrates a method for implementing switching regulator with floating inductor.

FIG. 10 illustrates a method for implementing switching regulator with floating inductor. In an I²PS, one or two output switches can be referenced to the output. Examples are shown in FIGS. 3 and 7. An internal switching regulator can draw current from the output of the I²PS. This usually worsens noise distribution of the I²PS output voltage. The regulator can operate in a wide voltage range and inject noise current that varies with amplitude of the output voltage. Moreover, the switching regulator may be inoperative near peaks of the output voltage. Large capacitors may be required to maintain internal supply voltages at low frequencies. The switching regulator with floating inductor solves numerous problems and lowers cost.

The I²PS 100 comprises a logic block. The base of the PNP transistor 501 is connected to a reference terminal of the logic. One output of the logic is connected to the base of the NPN transistor 503. The resistor 500 is coupled between emitters of the transistors 501 and 503. The collector of the transistor 501 is connected to the base of the NPN transistor 101 and the resistor 105. Similarly, the collector of the transistor 503 is connected to the base of the PNP transistor 103 and the resistor 106. One end of the inductor 107 is tied to the collector of the switch 101 and the anode of the diode 102. The other end is tied to the collector of the switch 103 and the cathode of the diode 104. The respective supply voltage of the I²PS appears between the cathode of the diode 102 and the anode of the diode 104.

The connection of the emitter of the switch 101 and the resistor 105 represents one input terminal of the switching regulator. The connection of the emitter of the switch 103 and the resistor 106 represents the other input terminal. A sum of the supply voltages +E and −E is applied between the input terminals. The inductor 107 attains the supply current. The switches 101 and 103 selectively apply the sum across the inductor 107. The diodes 102 and 104 represent a rectifying means for applying the supply current to at least one supply terminal of the I²PS.

Specifically, the I²PS 100 amplifies an input signal and provides an output voltage. The internal logic block controls output switches and the switching regulator. The supply voltages +E and −E are applied to the inductor 107 for charging it. When the inductor 107 is disconnected, energy stored therein is directed to the I²PS 100. The transistors 101 and 103 operate as switches. By contrast, the transistors 501 and 503 operate as switched current sources providing inherently equal currents. The logic of the I²PS 100 can be referenced to a supply voltage rail, as shown in FIG. 1, to ground, as shown in FIG. 4a, or to the I²PS output, as shown in FIG. 7. The switching regulator delivers a single supply voltage to at least one floating driver. The supply voltage can be split into two supply voltages using conventional methods.

One example refers to the FIG. 1 embodiment. The logic is grounded and one driver is floating. The instant switching regulator can be substituted for the diode 412 and the inductor 416. The logic is referenced to −E that is also applied directly to the resistor 500. The transistor 501 and the resistor 105 are superfluous. The bases of the transistors 101 and 503 are connected through separate resistors to the output of the logic. The cathode of the diode 102 is connected to the supply terminal of the driver 16 and the capacitor 18. The anode of the diode 104 is connected to the I²PS output. When the logic output is high, the transistors 101, 103 and 503 are conducting. The inductor 107 is effectively connected between the supply rails. When the logic output is low, the supply voltage stored in the capacitor 18 is applied across the inductor 107.

Another example refers to the FIG. 9 embodiment. The logic and both drivers are referenced to the I²PS output, and thus float. The instant regulator can be substituted for the respective regulator comprising the switch 491. The base of the transistor 501 and the anode of the diode 104 are connected to the output of the I²PS. The cathode of the diode 102 is connected to the supply terminals of the component 90, 95, 96, 495 and the capacitor 498. When the respective logic output is high, the transistors 101, 103, 501 and 503 are conducting. The inductor 107 is effectively connected between the supply rails. When the logic output is low, the supply voltage stored in the capacitor 498 is applied across the inductor 107. In both examples, the switching regulator operates properly even when the respective supply voltage swings above the positive supply rail.

Figure 11:
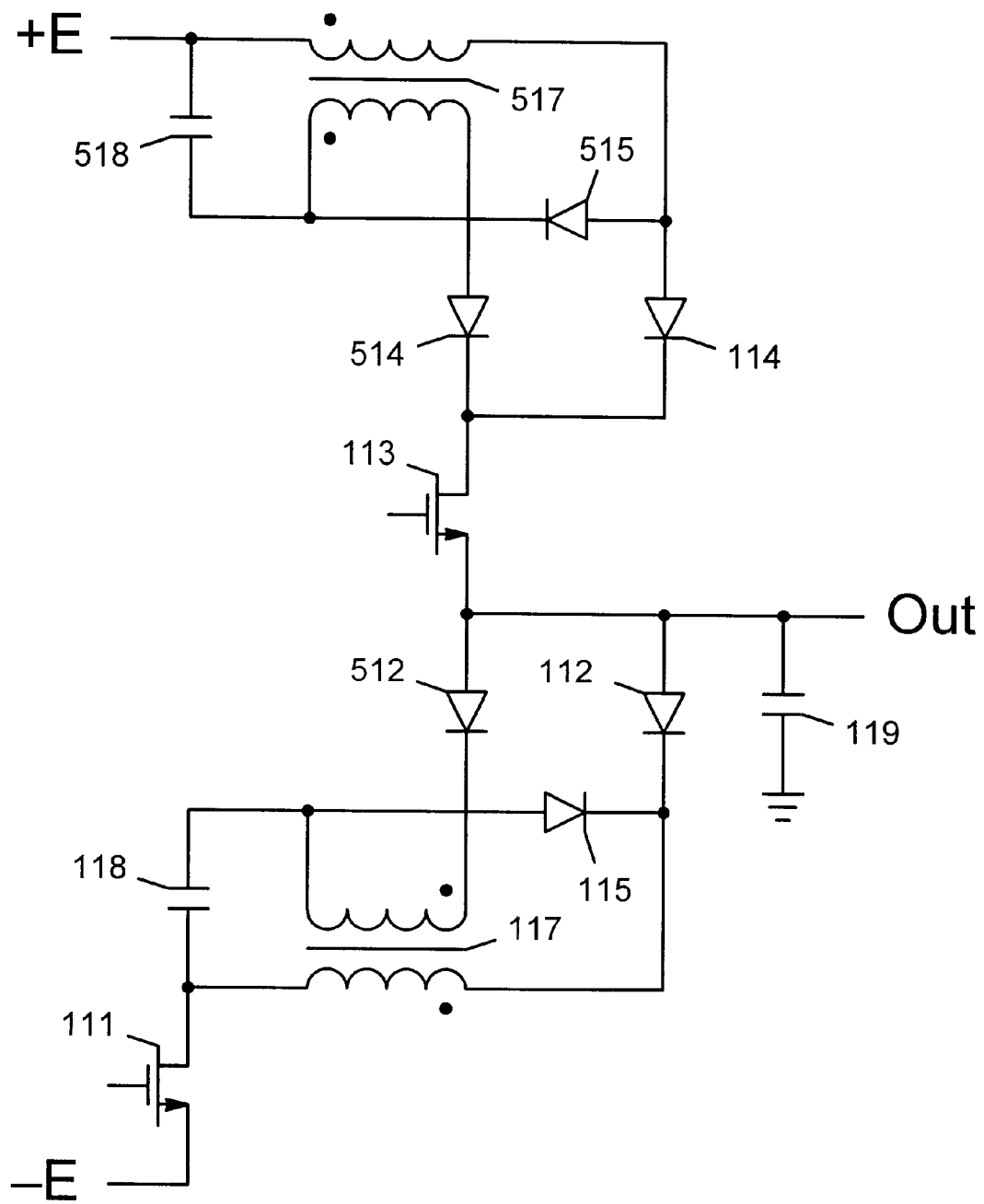
FIG. 11 is an embodiment of continuous or discontinuous mode I²PS with two switches.

FIG. 11 is an embodiment of continuous or discontinuous mode I²PS with two switches. The I²PS is similar to embodiments of FIGS. 17 and 25 disclosed in the above-mentioned "Precision Switching Power Amplifier and Uninterruptible Power System," U.S. Pat. No. 6,385,056. In particular, each embodiment comprises a pair of switches and a pair of transformers. The instant I²PS eliminates reverse energy flow and employs switches having reduced voltage ratings. The transformers represent an inductive means that attains primary currents and provides return voltages. A pair of switches selectively applies the primary currents to the power supply. A pair of diodes limits the return voltages when the corrective current is substantially equal to zero. Both switches conduct the corrective current that is applied to an output capacitor.

Specifically, a positive supply voltage +E is applied to the capacitor 518 and the primary winding of the forward transformer 517. The capacitor 518 is also connected to the cathode of the diode 515 and the secondary winding of the transformer 517. The primary and secondary windings are further tied to the anodes of the diodes 114, 515 and 514 respectively. The drain of the switch 113 is connected to the cathodes of the diodes 114 and 514. Similarly, a negative supply voltage −E is applied to the source of the switch 111. Its drain is connected to the capacitor 118 and the primary winding of the forward transformer 117. The capacitor 118 is also connected to the anode of the diode 115 and the secondary winding of the transformer 117. The primary and secondary windings are further tied to the cathodes of the diodes 112, 115 and 512 respectively. The source of the switch 113, the anodes of the diode 112, 512 and the capacitor 119 are connected to the output of the I²PS. The capacitor 119 is grounded and provides the AC output voltage.

The switch 111 turns on to decrease the output voltage. The switch 113 is turned off. Either the diode 112 or 512 conducts the corrective current. This depends on a difference between −E and the output voltage, the voltage stored in the capacitor 118 and turns ratio of the transformer 117. For example, the I²PS operates in continuous mode if the primary and secondary windings have equal number of turns. The capacitor 118 is fully discharged. The primary or secondary winding of the transformer 117 acts like an inductor carrying the corrective current. The switch 111 can turn off at any time, whenever the correction is completed. The corrective current is immediately interrupted. At least a portion of energy stored in the transformer 117 is fed to the capacitor 118 via the diode 115. The charging of the capacitor 118 continues until the transformer 117 is reset or the switch 111 turns on again. Similarly, the switch 113 turns on to increase the output voltage. The operation of the I²PS is analogous. Both switches 111 and 113 can be closed simultaneously.

Figure 12:
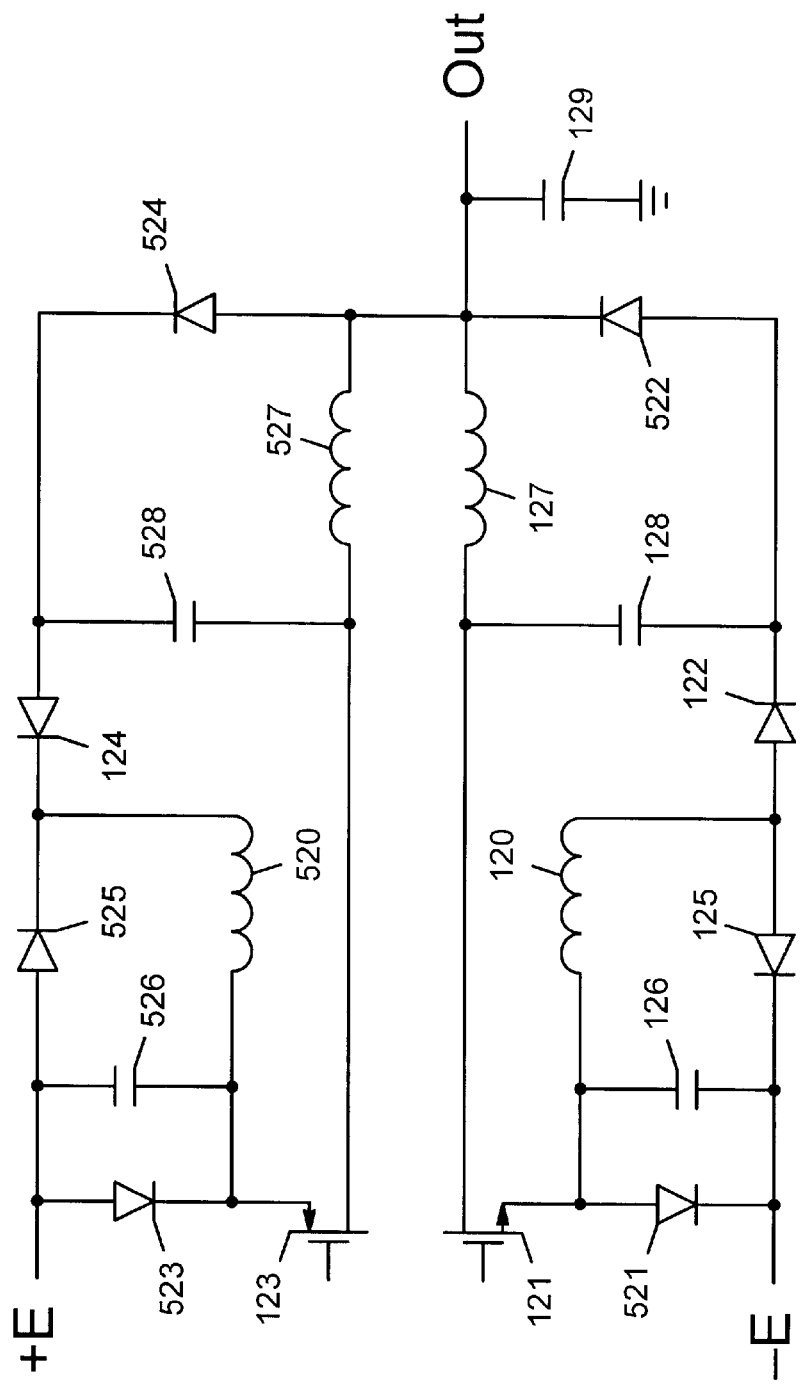
FIG. 12 is another embodiment of continuous or discontinuous mode I²PS with two switches.

FIG. 12 is another embodiment of continuous or discontinuous mode I²PS with two switches. The I²PS employs inductors rather than transformers, as of the FIG. 11 embodiment. Furthermore, two diodes and two capacitors are added. Specifically, a positive supply voltage +E is applied to the anodes of the diodes 523, 525 and the capacitor 526. One end of the inductor 520 is tied to the source of the switch 123, P-channel MOSFET, the cathode of the diode 523 and the capacitor 526. The other end is tied to the cathodes of the diodes 124 and 525. The capacitor 528 is connected to the drain of the switch 123 and the inductor 527. The capacitor 528 is further tied to the anode of the diode 124 and the cathode of the diode 524. Similarly, a negative supply voltage −E is applied to the cathodes of the diodes 125, 521 and the capacitor 126. One end of the inductor 120 is tied to the source of the switch 121, the anode of the diode 521 and the capacitor 126. The other end is tied to the anodes of the diodes 122 and 125. The capacitor 128 is connected to the drain of the switch 121 and the inductor 127. The capacitor 128 is further tied to the cathode of the diode 122 and the anode of the diode 522. The cathode of the diode 522, the anode of the diode 524, the inductors 127, 527 and the capacitor 129 are connected to the output of the I²PS. The capacitor 129 is grounded and stores the AC output voltage.

The switch 121 turns on to decrease the output voltage. The switch 123 is turned off. The switch 121 applies −E reduced by a voltage stored in the capacitor 126 to the inductor 127. The inductor 127 attains the corrective current that discharges the capacitor 126. The diode 521 takes over the corrective current when the capacitor 126 is discharged. Moreover, the switch 121 and the diode 122 apply the voltage stored in the capacitor 128 across the inductor 120. The diode 125 takes over the current of the inductor 120 when the capacitor 128 is discharged. The switch 121 can turn off at any time, whenever the correction is completed. The corrective current is immediately interrupted. Energy stored in the inductors 120 and 127 is transferred to the capacitors 126 and 128 through the diodes 125 and 522 respectively. Similarly, the switch 123 turns on to increase the output voltage. The operation of the I²PS is analogous. Both switches 121 and 123 can be closed simultaneously.

Figure 13:
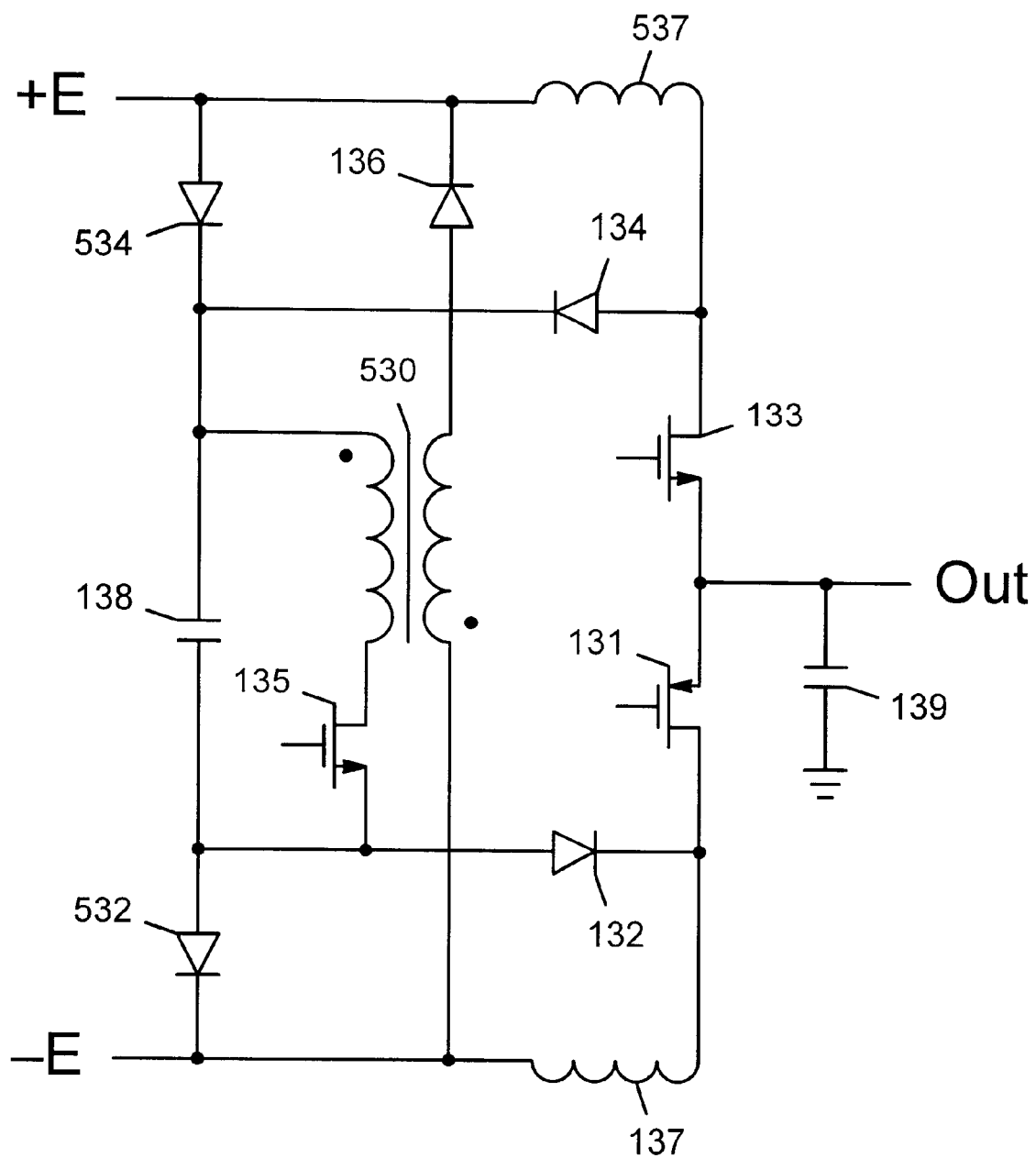
FIG. 13 is the preferred embodiment of discontinuous mode I²PS incorporating flyback converter.

FIG. 13 is the preferred embodiment of discontinuous mode I²PS incorporating flyback converter. The I²PS is based on the FIG. 30 embodiment disclosed in the above-mentioned "Precision Switching Power Amplifier and Uninterruptible Power System," U.S. Pat. No. 6,385,056. However, there are significant differences between both embodiments. Only the switches 131, 133 and the capacitor 139 are connected to the output. Furthermore, a holdup voltage stored in the capacitor 138 is inherently higher than a sum of the supply voltages. By these means, noise injected into the output is minimized and a current discharging the capacitor 138 is reduced. The components 135, 136 and 530 constitute a flyback converter that corresponds to the converter 700 of FIG. 30. The flyback converter returns excessive energy stored in the capacitors 138 to the power supply.

A positive supply voltage +E is applied to the cathode of the diode 136, the anode of the diode 534 and the inductor 537. A negative supply voltage −E is applied to the cathode of the diode 532, the inductor 137 and one end of the secondary winding of the flyback transformer 530. The other end is tied to the anode of the diode 136. The drain of the switch 131, P-channel MOSFET, is connected to the cathode of the diode 132 and the inductor 137. The drain of the switch 133 is tied to the anode of the diode 134 and the inductor 537. The source of the switch 135 is connected to the anodes of the diodes 132, 532 and the capacitor 138. The drain of the switch 135 is connected to one end of the primary winding of the transformer 530. The other end is tied to the cathodes of the diodes 134, 534 and the capacitor 138. The sources of the switches 131, 133 and the capacitor 139 are connected to the output of the I²PS. The capacitor 139 is grounded and stores the output voltage.

The switch 131 turns on to decrease the output voltage. The switch 133 is turned off. The corrective current is equal to the current of the inductor 137. A voltage applied thereacross is approximately equal to a difference between −E and the output voltage. The diodes 134 and 532 apply the holdup voltage across the inductor 537. Energy stored therein is delivered to the capacitor 138. Similarly, the switch 133 turns on to increase the output voltage. The corrective current is equal to the current of the inductor 537. A voltage appearing thereacross is approximately equal to a difference between +E and the output voltage. The switch 131 is turned off, wherein the inductor 137 discharges through the diodes 132, 534 and the capacitor 138. The switch 131 or 133 can turn off at any time, whenever the correction is completed. The flow of the corrective current is interrupted instantaneously.

When both switches 131 and 133 are turned off, the diodes 132 and 134 conduct the currents of the inductors 137 and 537 respectively. If the current of the inductor 137 is greater than the current of the inductor 537, the diode 534 conducts a difference between both currents. The inductor 137 is discharged as the holdup voltage is applied thereacross. By contrast, the voltage across the inductor 537 is equal to a difference between forward voltages of the diodes 134 and 534. The difference is near zero, wherein the current of the inductor 537 remains virtually constant. Similarly, if the current of the inductor 537 is greater than the current of the inductor 137, the diode 532 conducts a difference between both currents. The inductor 537 is discharged, whereas the current of the inductor 137 remains virtually constant. The higher inductor current may eventually fall to the level of the upheld inductor current while the switches 131 and 133 remain open.

The diodes 532 and 534 are cut off as the inductors 137 and 537 act like a single inductor charging the capacitor 138. If both switches 131 and 133 are closed, the corrective current is equal to a difference between both inductor currents.

The flyback converter limits the holdup voltage stored in the capacitor 138. It draws a primary current when the holdup voltage is above a predetermined level. The converter produces a return current that is fed back to the power supply. Specifically, when the switch 135 is turned on, the holdup voltage is applied across the primary winding of the transformer 530. The diode 136 is cut off. However, the current discharging the capacitor 138 is equal to the primary current of the transformer 530 only when the switches 131 and 133 are turned on or both inductor currents are zero. Otherwise, the current applied to the capacitor 138 is equal to a difference between the primary current and the charging current. The latter current may be equal to the difference between both inductor currents. For example, if the switches 131 and 135 are turned on, the capacitor 138 is discharged when the primary current exceeds the current of the inductor 537. When the switch 135 is turned off, energy stored in the transformer 530 is returned to the power supply. The diode 136 applies the sum of the supply voltages across the secondary winding.

Figure 14:
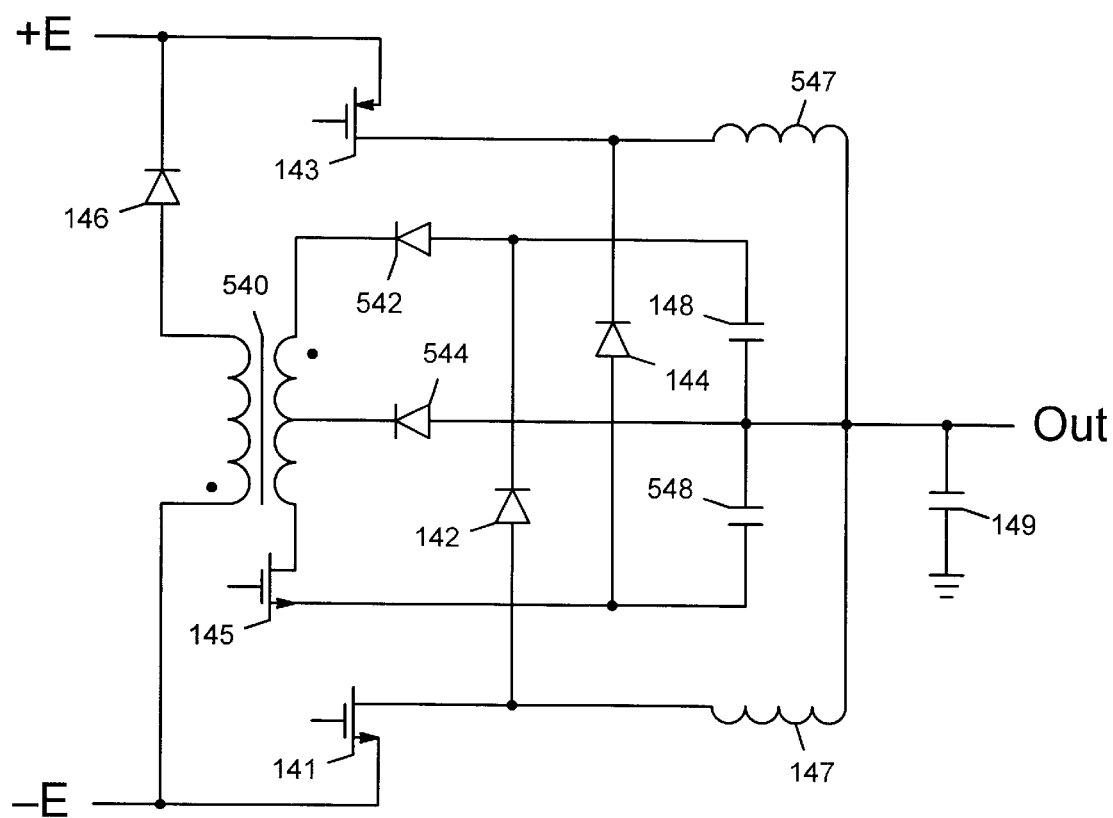
FIG. 14 is another embodiment of discontinuous mode I²PS incorporating flyback converter.

FIG. 14 is another embodiment of discontinuous mode I²PS incorporating flyback converter. The I²PS is based on the FIG. 31 embodiment disclosed in the abovementioned "Precision Switching Power Amplifier and Uninterruptible Power System," U.S. Pat. No. 6,385,056. In particular, the components 145, 146, 540, 542 and 544 constitute the flyback converter that corresponds to the converter 710 of FIG. 31. The flyback converter transfers excessive energy stored in the capacitors 148 and 548 to the power supply.

A positive supply voltage +E is applied to the source of the switch 143, P-channel MOSFET, and the cathode of the diode 146. The anode of the diode 146 is connected to one end of the secondary winding of the flyback transformer 540. A negative supply voltage −E is applied to the source of the switch 141 and the other end. The drain of the switch 141 is tied to the anode of the diode 142 and the inductor 147. The drain of the switch 143 is tied to the cathode of the diode 144 and the inductor 547. The primary winding of the flyback transformer 540 is connected between the drain of the switch 145 and the cathode of the diode 542. A primary center tap is tied to the cathode of the diode 544. The source of the switch 145 is connected to the anode of the diode 144 and the capacitor 548. The anode of the diode 542 is connected to the cathode of the diode 142 and the capacitor 148. The anode of the diode 544, the capacitors 148, 149, 548 and the inductors 147, 547 are connected to the output of the I²PS. The capacitor 149 is grounded and stores the output voltage.

The flyback converter limits both holdup voltages stored in the capacitors 148 and 548. It draws a primary current when either holdup voltage becomes excessive. The converter produces a return current that is fed back to the power supply. Specifically, the capacitors 148 and 548 store holdup voltages that are positive and negative with reference to the I²PS output respectively. When either holdup voltage exceeds a predetermined level, the switch 145 turns on. If the voltage stored in the capacitor 548 is greater than the voltage stored in the capacitor 148, the diode 544 conducts. The former voltage is applied across the respective half of the primary winding, whereas the diode 542 is cut off. If a sum of the holdup voltages exceeds another predetermined level, the sum is applied across the primary winding. Both capacitors 148 and 548 are discharged. The capacitor 148 can have a significantly smaller value than the capacitor 548. When the switch 145 turns off, energy stored in the transformer 540 is fed back to the power supply. The switch 145 operates independently of the switches 141 and 143.

FIG. 15 is an embodiment of continuous or discontinuous mode bidirectional I²PS. The I²PS is based on the FIG. 13 embodiment disclosed in the abovementioned "Precision Switching Power Amplifier and Uninterruptible Power System," U.S. Pat. No. 6,385,056. However, voltage ratings of two switches and two diodes are cut in half. Moreover, the instant I²PS is bidirectional since diodes direct inductor currents to ground.

A positive supply voltage +E is applied to the source of the switch 553, P-channel MOSFET, and the cathode of the diode 154. A negative supply voltage −E is applied to the source of the switch 551 and the anode of the diode 152. One end of the inductor 157 is connected to the drain of the switch 551 and the anode of the diode 552. The other end is connected to the drain of the switch 151, P-channel MOSFET, and the cathode of the diode 152. Similarly, one end of the inductor 557 is connected to the drain of the switch 553 and the cathode of the diode 554. The other end is connected to the drain of the switch 153 and the anode of the diode 154. The sources of the switches 151, 153 and the capacitor 159 are connected to the output of the I²PS. The cathode of the diode 552, the anode of the diode 554 and the capacitor 159 are grounded. The output voltage appears across the capacitor 159.

The switch 151 turns on to decrease the output voltage. If the output voltage is negative or near zero crossing, the switch 551 turns on as well. The corrective current is equal to the current of the inductor 157. However, the switch 551 is turned off if the output voltage is positive. The supply current is zero, which allows bidirectional operation of the I²PS. The switch 151 turns off to interrupt the correction. The diode 152 takes over the current of the inductor 157. If the switch 551 is turned off, the diode 552 conducts and energy stored in the inductor 157 is returned to the power supply. However, the switch 551 can remain closed so that the inductor current continues to flow through this switch and the diode 152. The voltage across the inductor 157 is near zero, wherein the inductor current remains virtually constant. When the switch 151 turns on again, the corrective current can immediately assume the upheld value of the inductor current. Therefore, continuous mode of operation is accomplished. The I²PS operates analogously when the switches 153 and/or 553 are activated.

FIG. 16 is the preferred embodiment of continuous or discontinuous mode transformer-less I²PS boosting the output voltage. The I²PS derives from embodiments of FIGS. 18 and 33 disclosed in the abovementioned "Precision Switching Power Amplifier and Uninterruptible Power System," U.S. Pat. No. 6,385,056. Specifically, the series connection with the switch 161 is reversed. Therefore, the drain of the switch 161 is connected to the diode 162 and the capacitor 168. The inductor 167 and the diode 562 are tied to the output of the I²PS. The switches 161, 163, 561 and 563 are easier to drive. The supply voltages are applied to the sources of the switches 161 and 163, wherein the latter switch is P-channel MOSFET. The sources of the switches 561 and 563 are tied to the capacitors 168 and 568 respectively. Voltages stored in the capacitors 168, 169 and 568 vary at limited rates.

The switch 161 turns on to decrease the output voltage. The corrective current is equal to the current of the inductor 167. The switch 561 turns on or remains turned on if it is necessary to discharge the capacitor 168 or to decrease the output voltage below −E. Otherwise, the diode 162 conducts the corrective current. If the switch 161 turns off, the corrective current is interrupted instantaneously. The current of the inductor 167 is upheld if the switch 561 remains closed. Otherwise, the current flows through the diodes 162, 562 and charges the capacitor 168. The I²PS operates analogously when one or both switches 163 and 563 are closed. Moreover, the corrective current is equal to a difference between both inductor currents when both switches 161 and 163 are closed simultaneously. This may be advantageous if the output voltage is within main supply voltages. The differential corrective current allows a significantly increase of the inductor currents above the level of the corrective current. Therefore, the capacitor 168 and 568 can be quickly recharged even when the corrective current is low.

Figure 17:
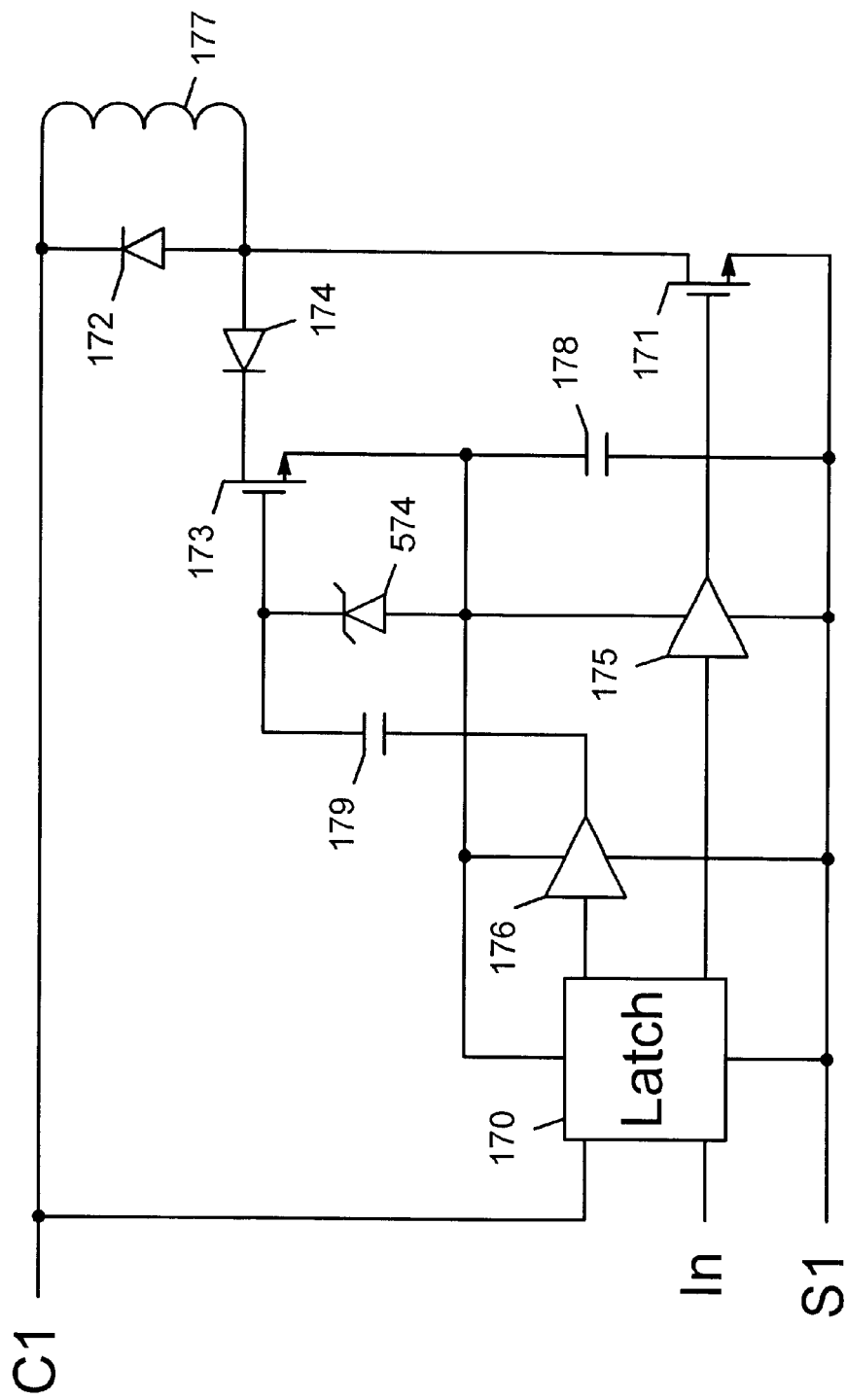
FIG. 17 illustrates a method for connecting switches in parallel.

FIG. 17 illustrates a method for connecting switches in parallel. Any switching regulator requires a special consideration. The regulator may be inefficient if it delivers a pair of supply currents that have substantially different amplitudes. The regulator can inject a high frequency noise into the output. The noise can increase quantization errors and diminish quality of the amplified signal. An input voltage of the regulator can vary in a wide range, which may result in high current spikes. Moreover, the regulator does not participate in the signal amplification.

A switch can be added to each output switch. The additional switch can entirely take over operation of the respective output switch. This results in power sharing and increased efficiency of the amplifier. Moreover, the additional switch is used to maintain a supply voltage for an input latch, drivers and possibly other devices. A separate switching regulator is superfluous. Both switches have the same voltage and current ratings, wherein only one switch can conduct the corrective current. An additional diode operates in series with the additional switch and has voltage ratings reduced to the supply voltage of the drivers. A scheme used for driving the additional switch is very simple. Furthermore, a single voltage shifter can be used between the main logic of the amplifier and the input latch. The main logic can be shared in full-bridge or multi-channel amplifier.

The instant embodiment can be implemented in any I²PS. It represents one half of an output stage in half-bridge configuration. A modification allowing implementation of P-channel MOSFETs would have been obvious to persons skilled in the art. A main switching means includes the switch 171 and the driver 175. A supply terminal of the driver 175 is connected to a supply terminal of the main switching means. The inductor 177 attains the corrective current. A converter means includes the additional switch 173 for selectively applying the corrective current to the supply terminal of the main switching means.

Specifically, a signal from the main logic is applied to one input of the latch 170. The latch 170 provides a pair of output signals that are applied to inputs of the drivers 175 and 176. The drivers 175 and 176 further drive the gates of the switches 171 and 173 respectively. However, an output of the driver 176 is in series with the capacitor 179. The gate of the switch 173 is connected to cathode of the zener diode 574 and the capacitor 179. The drain of the switch 173 is in series with the diode 174. The source of the switch 173, the anode of the diode 574, the capacitor 178 and supply terminals of the components 170, 175, 176 are tied together. The drain of the switch 171 is tied to the anodes of the diodes 172, 174 and the inductor 177. Another input of the latch 170, the cathode of the diode 172 and the inductor 177 are tied to the terminal C1. The source of the switch 171, the capacitor 178 and reference terminals of the components 170, 175, 176 are connected to the terminal S1.

The supply voltage of the latch 170 and the drivers 175, 176 is stored in the capacitor 178. The latch 170 senses the supply voltage, at its supply terminal, and a voltage appearing at the terminal C1. Both voltages are referenced to the terminal S1. The latch 170 comprises a pair of comparators for sensing the voltages. Each comparator may consist merely of a resistor divider driving an internal gate of the latch 170. Zener diodes can be added to accomplish greater accuracy. The drivers 175 and 176 provide rail-to-rail output. The capacitor 179 operates as a level shifter. The zener diode 574 limits a voltage stored in the capacitor 179. The voltage varies in a small range as the zener voltage is slightly higher than the supply voltage.

If the input signal is low, the latch 170 is reset and the switches 171, 173 are turned off. The input signal changes from low to high in order to launch flow of the corrective current. The switch 173 turns on if the voltage at C1 is above a predetermined level and the supply voltage is insufficient. Otherwise, the switch 171 turns on. In the former case, the corrective current flows through the diode 174 and charges the capacitor 178. In the latter case, the switch 171 applies the corrective current directly to S1. The diode 174 prevents reverse voltage across the switch 173. The state of the closed switch is maintained until the input signal changes from high to low. However, if the switch 173 is turned on and the supply voltage becomes excessive, the switch 171 can turn on to take over the corrective current. This is significant only if the switching cycle has long period.

Figure 18:
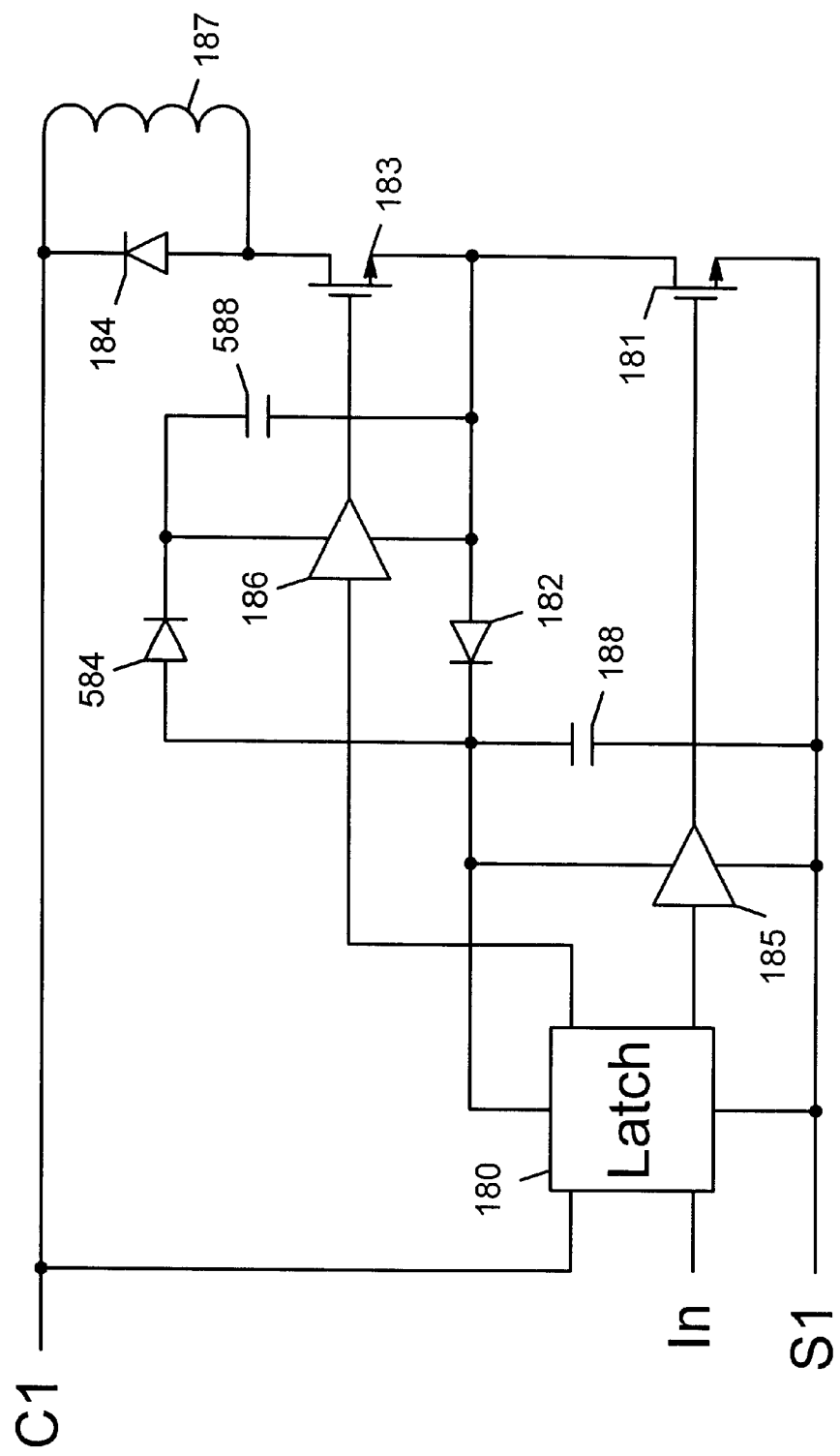
FIG. 18 illustrates a method for connecting switches in series.

FIG. 18 illustrates a method for connecting switches in series. A switch can be added to each output switch. Similar to the FIG. 17 embodiment, the additional switch is used to maintain a supply voltage for an input latch, drivers and possibly other devices. A separate switching regulator is superfluous. However, both switches are is series. Both switches have the same current ratings as one or both switches conduct the corrective current. By contrast, voltage ratings of one switch are reduced to the supply voltage.

The instant embodiment can be implemented in any I²PS. It represents one half of an output stage in half-bridge configuration. Specifically, a signal from the main logic is applied to one input of the latch 180. The latch 180 controls the drivers 185 and 186 that further drive the gates of the switches 181 and 183 respectively. The drain of the switch 183 is connected to the anode of the diode 184 and the inductor 187. The drain of the switch 181, the source of the switch 183, the anode of the diode 182, the capacitor 588 and a reference terminal of the driver 186 are tied together. The cathode of the diode 182, the anode of the diode 584, the capacitor 188 and supply terminals of the components 180, 185 are tied together. The cathode of the diode 584, the capacitor 588 and a supply terminal of the driver 186 are tied together. Another input of the latch 180, the cathode of the diode 182 and the inductor 187 are tied to the terminal C1. The source of the switch 181, the capacitor 188 and reference terminals of the components 180, 185 are connected to the terminal S1.

The supply voltage of the latch 180 and the driver 185 is stored in the capacitor 188. The supply voltage of the driver 186 is stored in the capacitor 588. The latch 180 senses its supply voltage and a voltage appearing at the terminal C1. Both voltages are referenced to the terminal S1. If the input signal is low, the latch 180 is reset and the switches 181, 183 are turned off. The input signal changes from low to high in order to launch flow of the corrective current. The switch 183 turns on if the voltage at C1 is above a predetermined level and the supply voltage stored in the capacitor 188 is insufficient. Otherwise, both switches 181 and 183 turn on. In the former case, the corrective current flows through the diode 182 and charges the capacitor 188. In the latter case, the corrective current flows directly to S1. Moreover, the diode 584 applies the supply voltage stored in the capacitor 188 across the capacitor 588. The states of the switches are maintained until the input signal changes from high to low. However, the switch 181 can also turn on if the supply voltage stored in the capacitor 188 becomes excessive. This is significant only if the switching cycle has long period.

Figure 19:
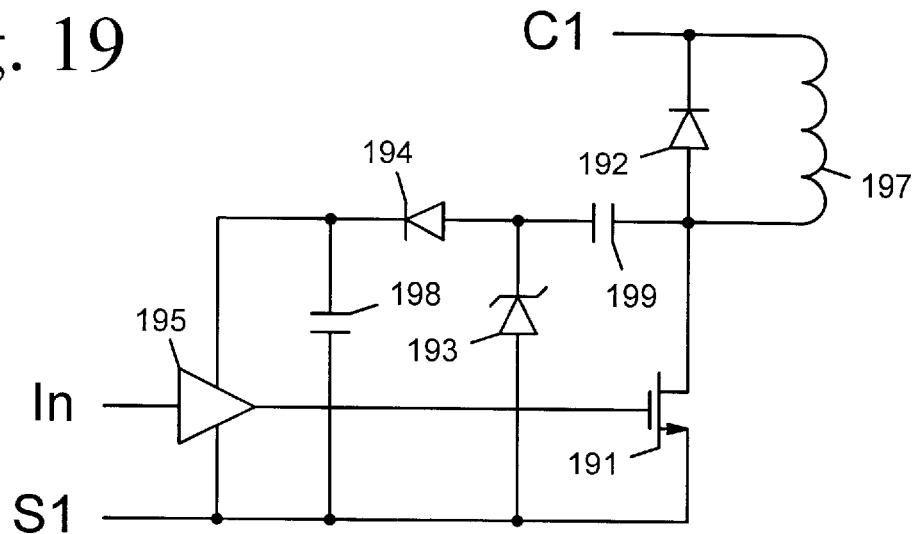
FIG. 19 illustrates a method for switching almost at zero voltage.

FIG. 19 illustrates a method for switching almost at zero voltage. Parasitic capacitances appearing at the drain of a MOSFET significantly contribute to switching losses. In a continuous mode I²PS, these capacitances include drain-source capacitance of the MOSFET, intra-winding capacitance of an inductive component and junction capacitance of a parallel coupled diode. The parasitic capacitances usually cause largest supply voltage spikes and most troublesome parasitic oscillations. Moreover, the switch acts as a non-linear resistor during a transition period. Since the switched load is inductive, the respective current peaks at the switch turn-off and remains virtually constant during the transition period. Switching at the peak current can make the largest contribution to the switching losses. A switching at zero voltage is desirable. In a single switch design, a capacitor or a resonant network is used to accomplish that switching. In the instant embodiment, a capacitor is used, wherein a supply current to a driver of the switch is also developed. A voltage regulator is reduced merely to a transient voltage suppressor (TVS) that operates as a zener diode.

The instant embodiment can be implemented in any I²PS. It represents one half of an output stage in half-bridge configuration. Therefore, at least one additional capacitive means separately coupled to one of the switching means applies the respective corrective current to the supply terminal of the one switching means. At least one additional rectifying means is separately coupled to the one additional capacitive means for limiting a voltage appearing thereacross. The switch 191, the driver 195 and the capacitor 198 represent the switching means. The capacitor 199 and the diodes 193, 194 represent the respective capacitive and rectifying means. Specifically, the driver 195 receives a signal from the main logic and drives the gate of the switch 191. The drain of the switch 191 is tied to the anode of the diode 192, the inductor 197 and the capacitor 199. The capacitor 199 is further connected to the cathode of the TVS 193 and the anode of the diode 194. The cathode of the diode 194, the capacitor 198 and a supply terminal of the driver 195 are tied together. The cathode of the diode 192 and the inductor 197 are tied to the terminal C1. The source of the switch 191, the anode of the TVS 193, the capacitor 178 and a reference terminal of the driver 195 are connected to the terminal S1.

The supply voltage of the driver 195 is stored in the capacitor 198. If the input signal is high, the switch 191 is turned on. The switch 191 applies the corrective current to the terminal S1 and discharges the capacitor 199 through the TVS 193. If the input signal changes from high to low, the switch 191 turns off. As the drain voltage reaches the level of the supply voltage, the diode 194 starts to conduct. The capacitor 199 takes over the corrective current and charges the capacitor 198. Consequently, the drain current of the switch 191 drops to zero. Moreover, the drain voltage continues to increase at a reduced pace as the capacitor 199 is recharged. The TVS 193 limits the supply voltage.

The capacitor 199 has a relatively small value as it is used merely for diverting the corrective current from the switch 191 to the diodes 193 and/or 194. A peak current provided by the capacitor 199 is limited to the corrective current. If the driver 195 draws a large supply current, an additional power supply is necessary. Moreover, too large value of the capacitor 199 is equivalent to reduced turn-off time of the switch 191, which degrades performance of the I²PS. The circuit is also ineffective when the I²PS delivers a peak output voltage. Specifically, the capacitor 199 cannot be recharged if a voltage between the terminals C1 and S1 is smaller than the supply voltage.

Figure 20:
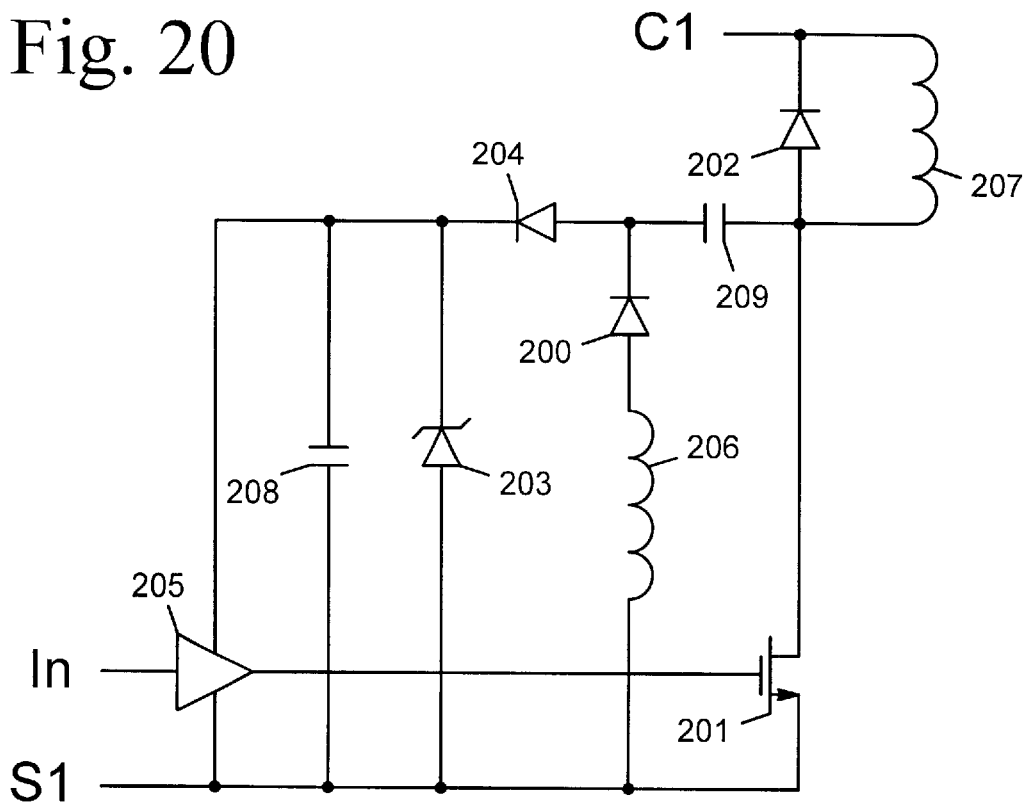
FIG. 20 illustrates the preferred method for switching at zero voltage.

FIG. 20 illustrates the preferred method for switching at zero voltage. In the FIG. 19 embodiment, the respective capacitor takes over the corrective current when the drain voltage reaches the level of the supply voltage. By adding only two components, the switch can turn off at zero voltage. The topology and the circuit operation of the instant embodiment are very similar to that of the FIG. 19 embodiment. Therefore, only points requiring additional comment will be addressed. The anode of the diode 204 is connected to the cathode of the diode 200 and the capacitor 209. The cathode of the diode 204 is connected to the cathode of the TVS 203, the capacitor 208 and a supply terminal of the driver 205. The inductor 206 is in series with the diode 200 and limits a current applied thereto. The source of the switch 201, the anode of the TVS 203, the inductor 206, the capacitor 208 and a reference terminal of the driver 205 are connected to the terminal S1.

The supply voltage of the driver 205 is stored in the capacitor 208 and limited by the TVS 203. If the input signal is low, the switch 201 is turned off. If this condition is maintained sufficiently long, the voltage across the capacitor 209 becomes approximately equal to a difference between the voltage at the terminal C1 and the supply voltage. If the input signal changes from low to high, the switch 201 turns on. The voltage stored in the capacitor 209 is applied across the inductor 206. Both components constitute a resonant network. The diode 200 conducts the inductor current that recharges the capacitor 209. The voltage thereacross changes polarity and is clamped by the diodes 203 and 204. If the input signal changes from high to low, the switch 201 turns off. The capacitor 209 immediately takes over the corrective current, wherein the switch 201 turns off at zero voltage. The capacitor 209 has a relatively small value as it is used merely for diverting the corrective current. An additional power supply may be necessary.

Figure 21:
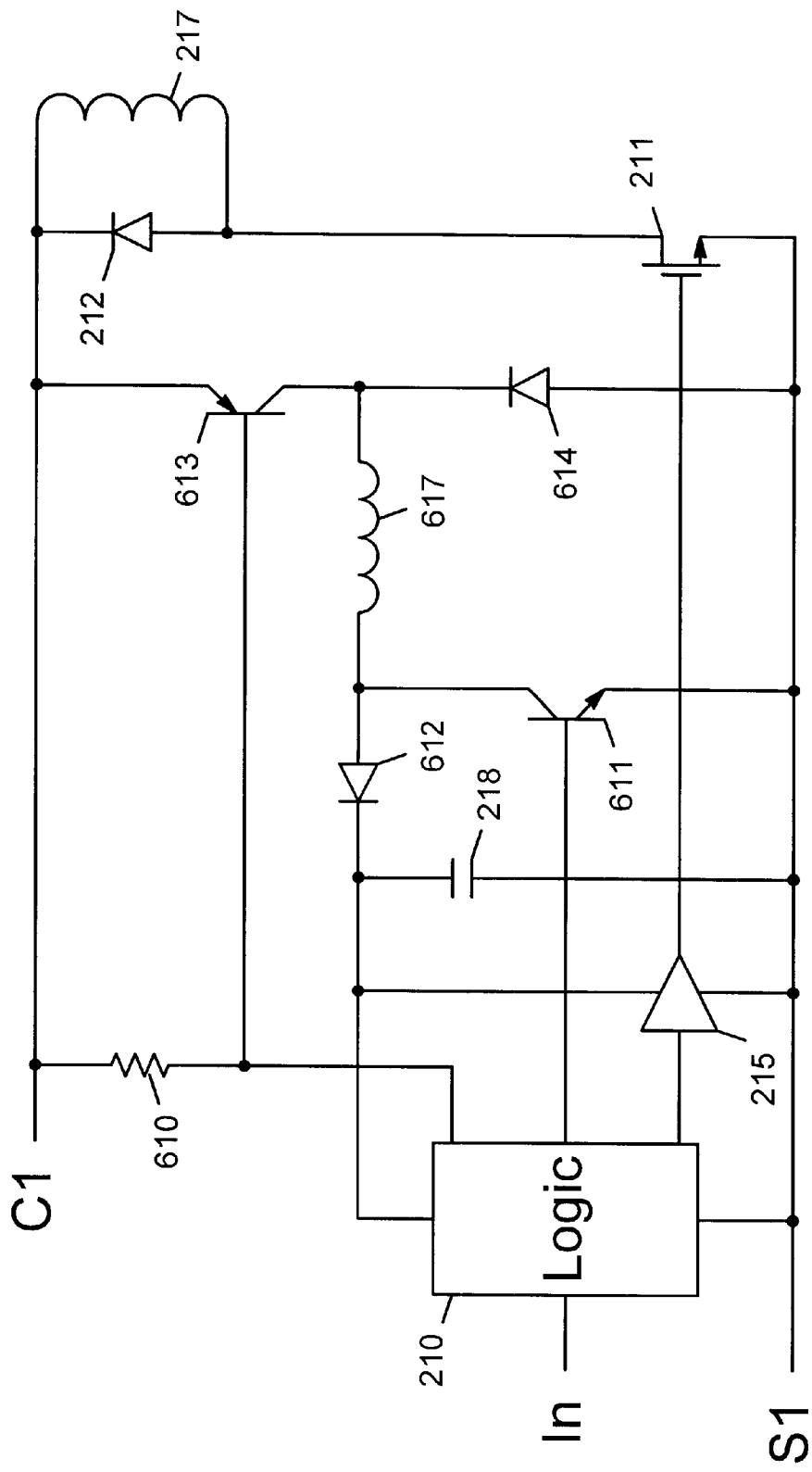
FIG. 21 illustrates a method for implementing fine amplifier with buck-boost converter.

FIG. 21 illustrates a method for implementing fine amplifier with buck-boost converter. In an I²PS, the output inductors are relatively small in order to deliver full power at highest frequency. Therefore, the output signal can vary at peak slew rate. Moreover, the I²PS has finite response time particularly due to limited transition time of various components, including the input comparator and output switches. Parasitic components can also significantly degrade performance of the I²PS. In particular, intra-winding capacitance of the output inductors, intrinsic capacitance of the output diodes, equivalent series resistance and inductance (ESR and ESL) of the output capacitor are critical. However, the output signal has often very small amplitude. Corrective noise signal superimposed onto the output signal may become excessive. This results in deterioration of performance as expressed by distortion level, signal to noise ratio, efficiency, EMI/RFI, etc. A fine amplifier operating in parallel with the main amplifier is desirable. The fine amplifier also provides supply current to switch drivers and possibly other devices.

The instant embodiment can be implemented in any I²PS. It represents one half of an output stage in half-bridge configuration. Therefore, the inductor 617 represents only one additional inductive means for attaining an additional corrective current and providing an additional return voltage. An additional switching means includes the switches 611 and 613. It is coupled in series with the additional inductive means for selectively applying the respective additional corrective current between the power supply and the I²PS output. Finally, at least one additional rectifying means is separately coupled to one of the additional inductive means for applying the respective additional return voltage to at least one supply terminal. Accordingly, the diodes 612 and 614 limit the return voltage of the inductor 617 to the supply voltage of the driver 215.

Specifically, a signal from the main logic is applied to an input of the local logic 210. The logic 210 has three outputs for controlling the switches 211, 611 and 613. One output is connected to the driver 215 that drives the gate of the switch 211. The other outputs separately provide currents to the bases of the NPN transistor 611 and the PNP transistor 613. The resistor 610 is connected to the latter base. The cathode of the diode 612 is connected to the capacitor 218 and supply terminals of the components 210, 215. One end of the inductor is tied the collector of the switch 611 and the anode of the diode 612. The other end is tied the collector of the switch 613 and the cathode of the diode 614. The drain of the switch 211 is tied to the anode of the diode 212 and the inductor 217. The emitter of the switch 613, the cathode of the diode 212, the inductor 217 and the resistor 610 are tied to the terminal C1. The source of the switch 211, the emitter of the switch 611, the anode of the diode 614, the capacitor 218 and reference terminals of the components 210, 215 are connected to the terminal S1.

If the input signal changes from low to high, the switches 611 and 613 turn on. The corrective current flows through the inductor 617 between the terminals C1 and S1. The correction performed by the fine amplifier is successful if the input signal changes from high to low within a predetermined period of time. The switches 611 and 613 turn off and immediately interrupt the corrective current. Energy stored in the inductor 617 is delivered to the capacitor 218 through the diodes 612 and 614. However, the switch 211 turns on if the input signal remains unchanged. The corrective current is a sum of the currents flowing through the inductors 217 and 617. The capacitor 218 stores the supply voltage of the logic 210 and the driver 215.

If the switch 211 is turned on and the supply voltage is sufficient, the switches 611 and 613 are turned off. Otherwise, both switches 611 and 613 turn on and off to charge the capacitor 218. The fine amplifier becomes the buck-boost converter. The logic can also sense the voltage at the terminal C1. That voltage is approximately equal to the base voltage of the switch 613. If the voltage at the terminal C1 is higher than the supply voltage, with reference to the terminal S1, only the switch 613 turns on and off to charge the capacitor 218. The switch 611 is open. The fine amplifier becomes the buck converter. All switches turn off if the input signal changes from high to low.

Figure 22:
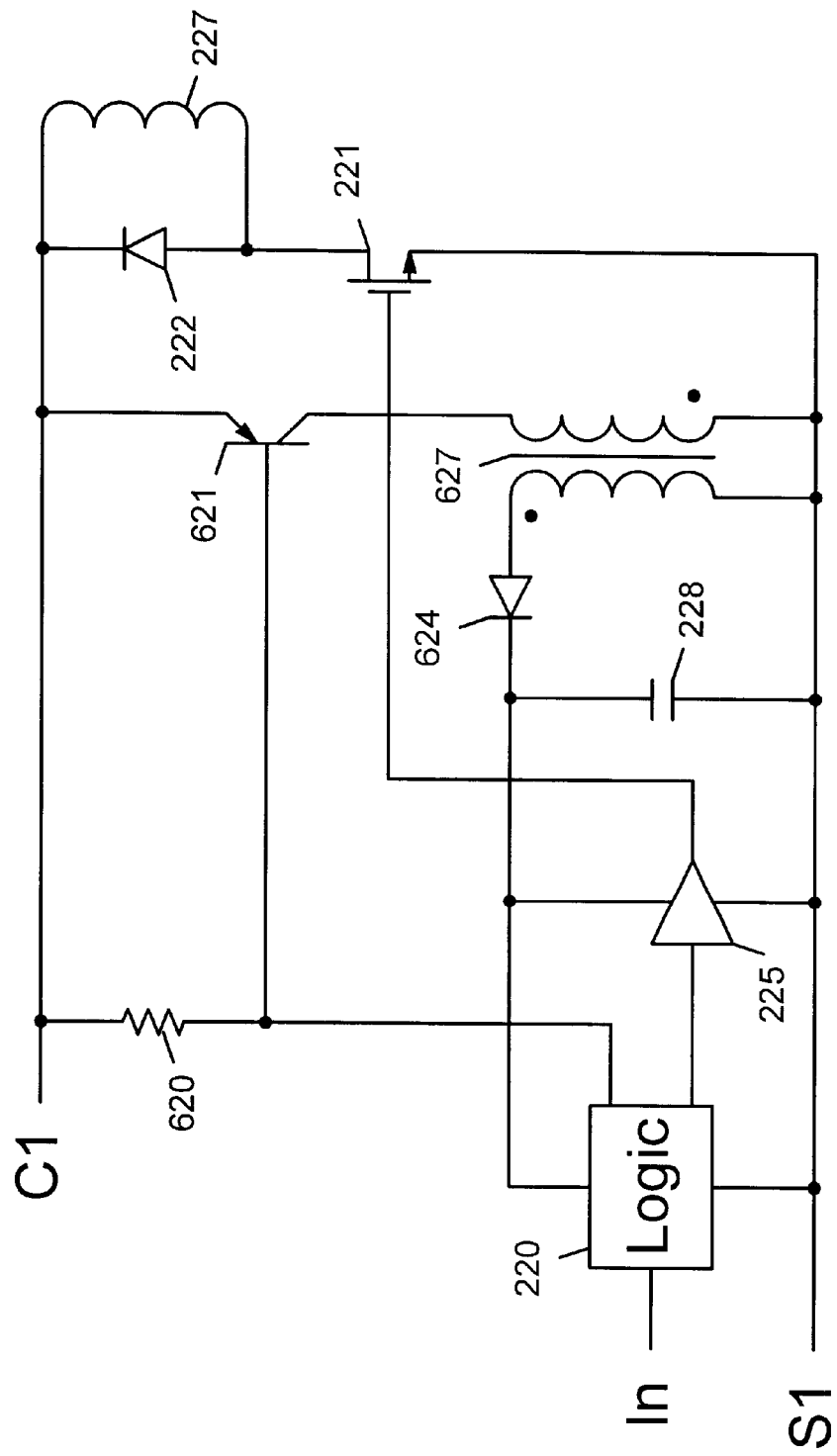
FIG. 22 illustrates a method for implementing fine amplifier with flyback converter.

FIG. 22 illustrates a method for implementing fine amplifier with flyback converter. The FIG. 21 embodiment employs the buck-boost converter. In order to accomplish best performance, converter operation depends on the voltage appearing between the terminals C1 and S1. The instant embodiment employs flyback converter that simplifies the operation. Moreover, a plurality of secondary windings can be used to develop supply voltages referenced to various potentials.

Specifically, a signal from the main logic is applied to an input of the local logic 220. The logic 220 has two outputs for controlling the switches 221 and 621. One output is connected to the driver 225 that drives the gate of the switch 221. The other output provides a current to the base of the PNP transistor 621 and the resistor 620. The collector of the switch 621 is tied to the primary winding of the flyback transformer 627. The anode of the diode 624 is tied to the secondary winding. The cathode of the diode 624 is connected to the capacitor 228 and supply terminals of the components 220, 225. The drain of the switch 221 is tied to the anode of the diode 222 and the inductor 227. The emitter of the switch 621, the cathode of the diode 222, the inductor 227 and the resistor 620 are tied to the terminal C1. The source of the switch 221, both windings of the transformer 627, the capacitor 228 and reference terminals of the components 220, 225 are connected to the terminal S1.

If the input signal changes from low to high, the switch 621 turns on. The corrective current flows through the primary winding, between the terminals C1 and S1. The correction performed by the fine amplifier is successful if the input signal changes from high to low within a predetermined period of time. The switch 621 turns off and immediately interrupts the corrective current. Energy stored in the transformer 627 is delivered to the capacitor 228 through the diode 624. However, the switch 221 turns on if the input signal remains unchanged. The corrective current is a sum of the currents flowing through the inductor 227 and the primary winding of the transformer 627. The capacitor 228 stores the supply voltage. If the voltage is sufficient, the switch 621 turns off. Otherwise, the switch 621 turns on and off to charge the capacitor 228. The fine amplifier becomes the flyback converter. If the input signal changes from high to low, both switches turn off.

Figure 23:
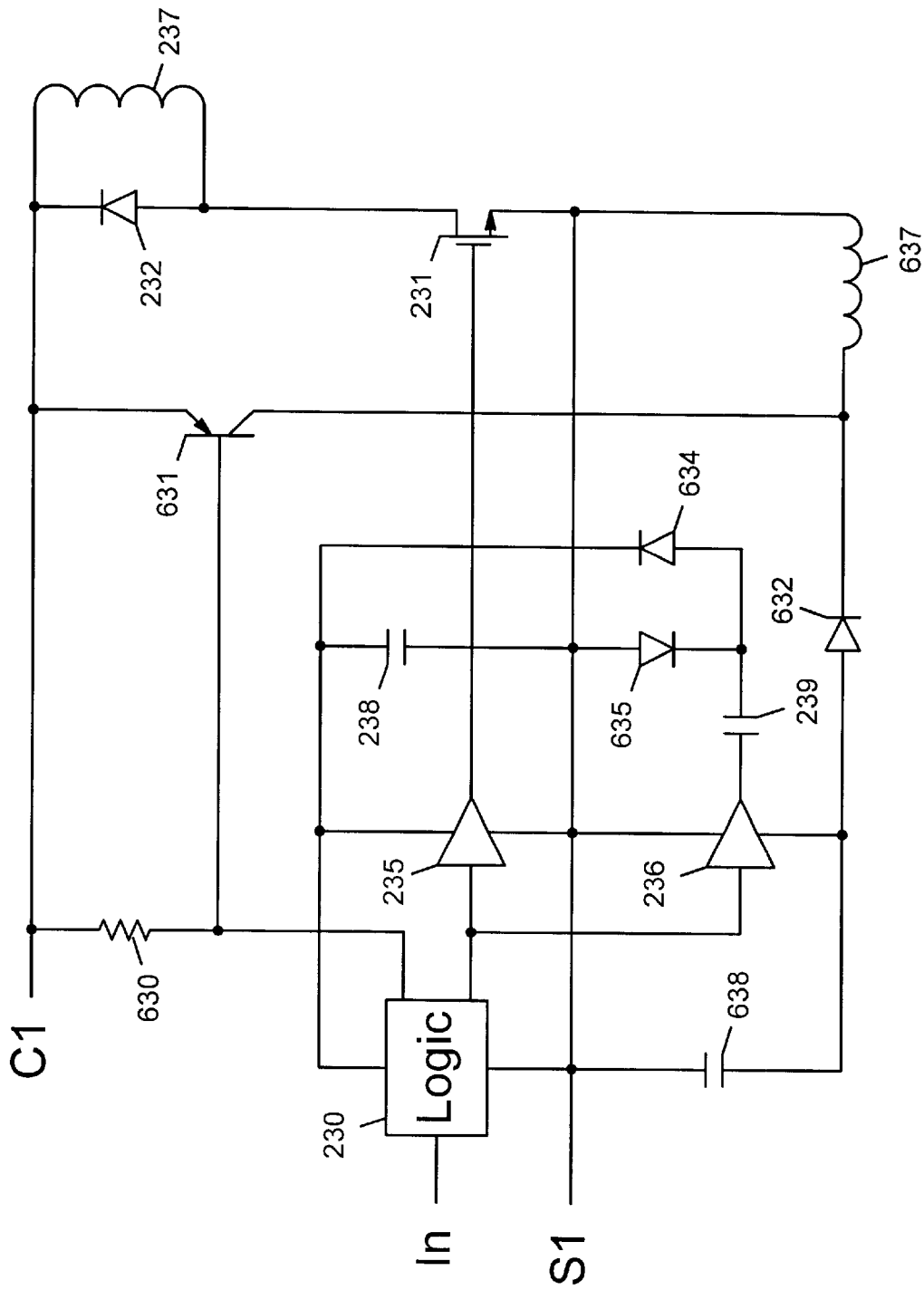
FIG. 23 illustrates the preferred method for implementing fine amplifier with flyback converter and charge pump.

FIG. 23 illustrates the preferred method for implementing fine amplifier with flyback converter and charge pump. The charge pump allows employment of an inductor rather than a transformer as of FIG. 22. A negative voltage is developed. Specifically, a signal from the main logic is applied to an input of the local logic 230. The logic 230 has two outputs for controlling the switches 231 and 631. One output signal is applied to the driver 235 that drives the gate of the switch 231. The same signal controls the driver 236 whose output is in series with the capacitor 239. The capacitor 239 is further connected to the anode of the diode 634 and the cathode of the diode 635. The other output of the logic 230 provides a current to the base of the PNP transistor 631 and the resistor 630. The collector of the switch 631 is tied to the cathode of the diode 632 and the inductor 637.

The cathode of the diode 634 is connected to the capacitor 238 and supply terminals of the components 230, 235. The anode of the diode 632 is connected to the capacitor 638 and a reference terminal of the driver 236. The drain of the switch 231 is tied to the anode of the diode 232 and the inductor 237. The emitter of the switch 631, the cathode of the diode 232, the inductor 237 and the resistor 630 are tied to the terminal C1. The source of the switch 231, the anode of the diode 635, the inductor 637, the capacitors 238, 638, a supply terminal of the driver 236 and reference terminals of the components 230, 235 are connected to the terminal S1.

If the input signal changes from low to high, the switch 631 turns on. The corrective current flows through the inductor 637 between the terminals C1 and S1. The correction performed by the fine amplifier is successful if the input signal changes from high to low within a predetermined period of time. The switch 631 turns off and immediately interrupts the corrective current. Energy stored in the inductor 637 is delivered to the capacitor 638 through the diode 632. However, the switch 231 turns on if the input signal remains unchanged. The corrective current is a sum of the currents flowing through the inductors 237 and 637.

The capacitors 238 and 638 store positive and negative supply voltages respectively. If the positive supply voltage is sufficient, the switch 631 turns off. Otherwise, the switch 631 turns on and off to charge the capacitor 638. The fine amplifier becomes the flyback converter. The output of the driver 236 is high, wherein the diode 634 conducts. The capacitors 238 and 239 are charged and discharged respectively. If the input signal changes from high to low, both switches turn off. The output of the driver 236 is low. The capacitor 239 is recharged through the diode 635.

Figure 24:
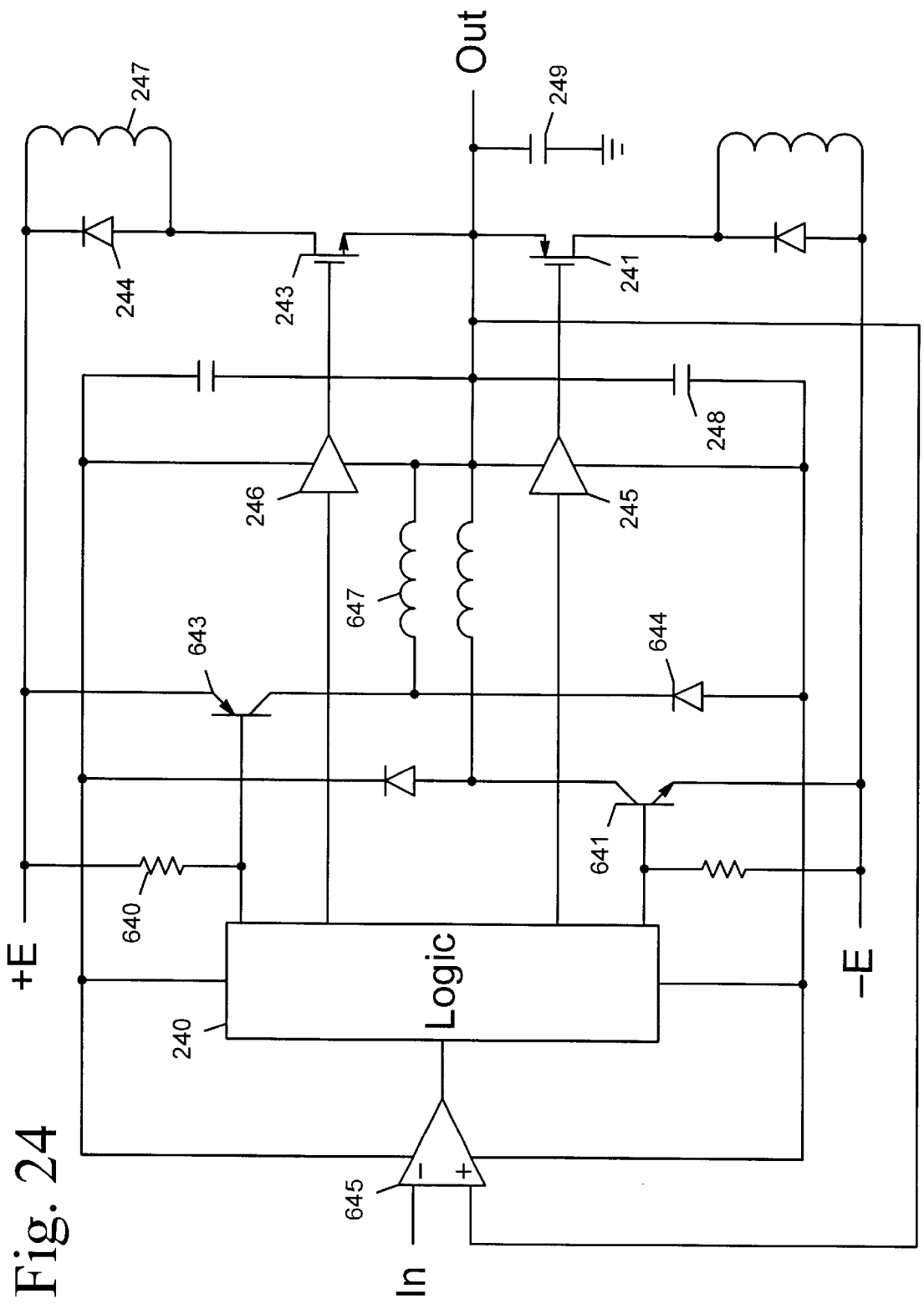
FIG. 24 is an embodiment of continuous mode I²PS comprising floating drivers and incorporating fine amplifier with flyback converters.

FIG. 24 is an embodiment of continuous mode I²PS comprising floating drivers and incorporating fine amplifier with flyback converters. The I²PS employs complementary output switches with sources connected to the output of the I²PS. One example of this arrangement is shown in FIG. 7. However, the logic is indirectly referenced to the output of the I²PS. The I²PS inherently has unity gain. The fine amplifier is supplied from the main supply voltages +E and −E. It provides supply currents to the comparator, the logic and drivers.

Specifically, the input signal is applied to the inverting input of the comparator 645. A comparator output signal is applied to an input of the logic 240. The logic 240 has four outputs for controlling all switches. One output is connected to the driver 246 that drives the gate of the switch 243. Another output provides a current to the base of the PNP transistor 643 and the resistor 640. The collector of the switch 643 is tied to the cathode of the diode 644 and the inductor 647. The anode of the diode 644 is connected to the capacitor 248, a negative supply terminal of the comparator 645 and reference terminals of the components 240, 245. The drain of the switch 243 is tied to the anode of the diode 244 and the inductor 247. A main supply voltage +E is applied to the emitter of the switch 643, the cathode of the diode 244, the inductor 247 and the resistor 640. The non-inverting input of the comparator 645, the sources of the switches 241, 243, the capacitors 248, 249, the inductor 647, a supply terminal of the driver 245 and a reference terminal of the driver 246 are connected to the output of the I²PS. The capacitor 249 is grounded and provides the AC output voltage.

Another pair of the outputs of the logic 240 is used to control the switch 241, P-channel MOSFET, and the switch 641, NPN transistor. The respective portion of the I²PS is analogous to the portion already described. In particular, the driver 245 operates between the logic 240 and the gate of the switch 241. A capacitor and an inductor are also connected to the output of the I²PS. The capacitor corresponds to the capacitor 248 and stores a positive supply voltage for the components 240, 246 and 645. The inductor corresponds to the inductor 647 and is further tied to the collector of the switch 641. A main supply voltage −E is applied to the emitter of the switch 641 and its base resistor, and to the drain of the switch 641 through parallel coupled diode and inductor.

If the input voltage becomes larger than the output voltage, the comparator output signal is low. The logic 240 turns the switch 643 on. +E is applied to the inductor 647 that attains the corrective current. The correction performed by the fine amplifier is successful if the comparator output signal changes to high within a predetermined period of time. The logic 240 turns the switch 643 off and immediately interrupts the corrective current. Energy stored in the inductor 647 is delivered to the capacitor 248 through the diode 644. However, the logic 240 turns the switch 243 on if the comparator output signal remains unchanged. The corrective current is a sum of the currents flowing through the inductors 247 and 647. The capacitor 248 stores the negative supply voltage. If the voltage is sufficient, the switch 643 turns off. Otherwise, the switch 643 turns on and off. The fine amplifier becomes the flyback converter. If the comparator output signal changes to high, the switches 243 and 643 turn off. Subsequently, the switches 241 and/or 641 are activated. Their operation is analogous.

Figure 25:
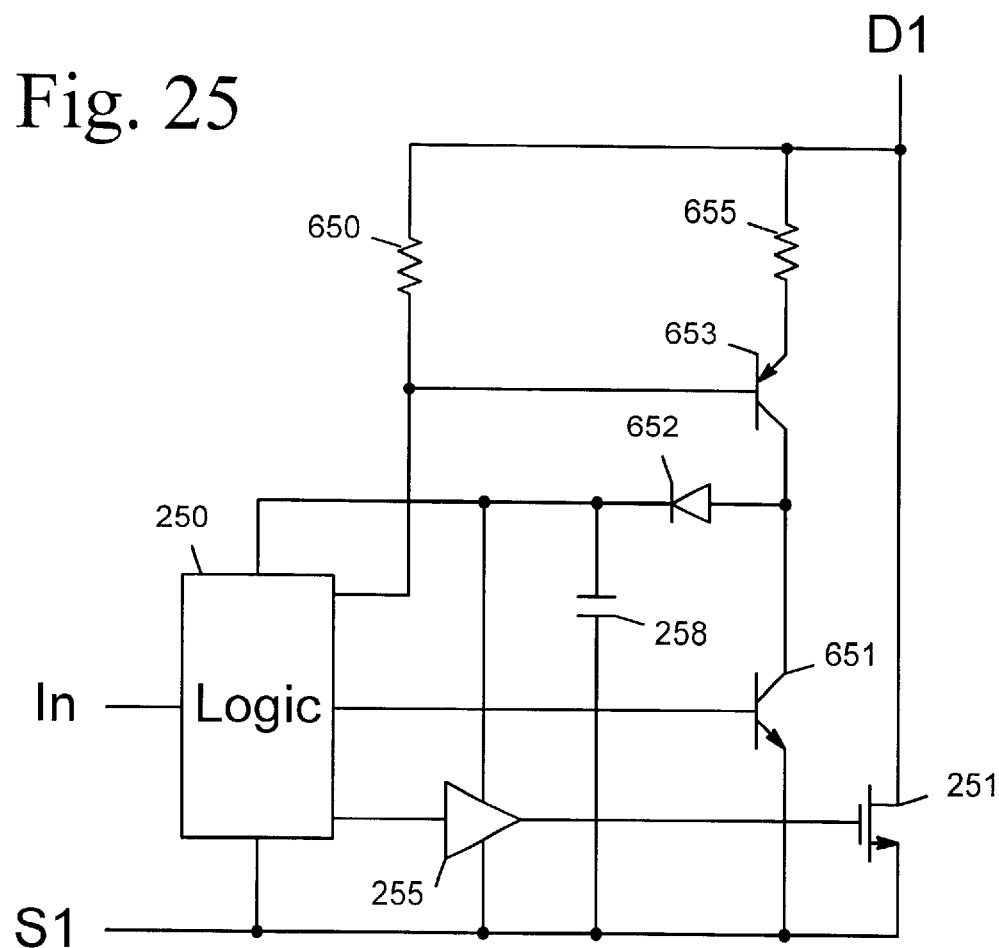
FIG. 25 illustrates a method for implementing fine amplifier with linear regulator.

FIG. 25 illustrates a method for implementing fine amplifier with linear regulator. If the supply current of switch drivers is relatively small, a linear voltage regulator may be adequate. Consequently, a fine linear amplifier can be utilized. The instant embodiment can be implemented in any I²PS. It represents a three-terminal device that is equivalent to a single switch with a driver. An additional switching means is coupled in parallel with the main switching means and includes a series coupled resistive means for limiting the respective corrective current. The additional switching means includes the transistors 651, 653 and the series coupled resistor 655.

A signal from the main logic is applied to an input of the local logic 250. The logic 250 has three outputs for controlling the transistors 251, 651 and 653. One output is connected to an input of the driver 255 that drives the gate of the switch 251. The other outputs separately provide currents to the bases of the NPN transistor 651 and the PNP transistor 653. The resistors 650 and 655 are connected to the base and emitter of the transistor 653 respectively. The collectors of the transistors 651, 653 and the anode of the diode 652 are tied together. The cathode of the diode 652 is connected to the capacitor 258 and supply terminals of the components 250, 255. The drain of the switch 251 and the resistors 650, 655 are connected to the terminal D1. The source of the switch 251, the emitter of the switch 651, the capacitor 258 and reference terminals of the components 250, 255 are connected to the terminal S1.

The transistor 653 operates in linear mode. When the input signal is low, the transistor 653 is cut off. A voltage drop across the resistor 650 is zero, wherein the voltage appearing at the terminal D1 is applied to the logic 250. The respective output thereof is thus used for sensing the voltage at the terminal D1 with reference to the terminal S1. The capacitor 258 stores the supply voltage of the logic 250 and the driver 255. If the input signal changes from low to high, the logic 250 provides a fixed current to the resistor 650. As a result, the transistor 653 provides the corrective current that is fixed. The corrective current flows through the diode 652 and charges the capacitor 258. However, the switch 651 turns on if the voltage at D1 is below or slightly above the supply voltage, or if the supply voltage is sufficient. A voltage between the terminals D1 and S1 is below the supply voltage.

The correction performed by the fine amplifier is successful if the input signal changes from high to low within a predetermined period of time. The transistors 651 and 653 turn off and immediately interrupt the corrective current. However, the switch 251 turns on if the input signal remains unchanged. The terminals D1 and S1 are effectively shorted, which cuts off the transistors 651 and 653. The switch 251 takes over the corrective current as to increase it. All transistors turn off if the input signal changes from high to low. The switch 651 can operate independently of the switches 251 and 653. Therefore, the switch 651 can turn off only if the supply voltage is insufficient and the voltage at D1 is at least a couple of volts above the supply voltage. The logic 650 can discontinue base currents of the transistors 651 and 653 if the switch 251 is closed.

Figure 26:
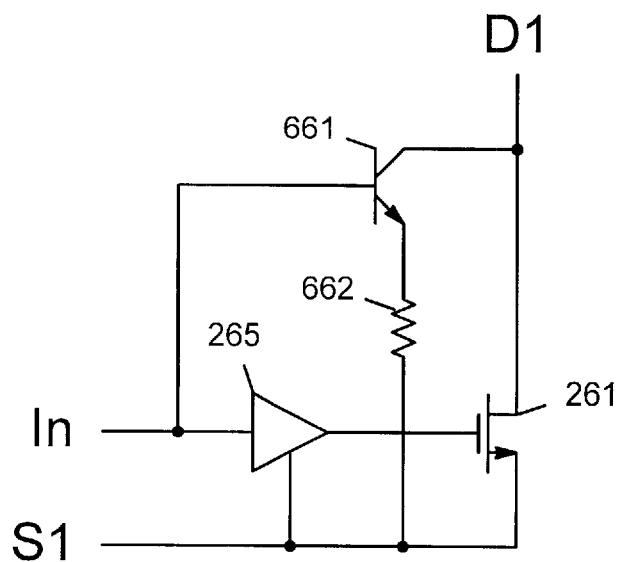
FIG. 26 illustrates a method for implementing fine linear amplifier.

FIG. 26 illustrates a method for implementing fine linear amplifier. A fine linear amplifier may be inadequate to deliver a large supply current of a driver and possibly other devices. Consequently, the amplifier can be optimized to provide for highest fidelity of the output signal. The embodiment of FIG. 25 can be dramatically simplified. Specifically, a voltage from the main logic is applied to the base of the NPN transistor 661 and an input of the driver 265. The emitter of the transistor 661 is in series with the resistor 662. An output of the driver is connected to the gate of the switch 261. The drain of the switch 261 and the collector of the transistor 661 are connected to the terminal D1. The source of the switch 261, the resistor 662 and a reference terminal of the driver 265 are connected to the terminal S1.

The fine amplifier includes at least one controllable current source separately coupled to one of the switching means for providing an additional current that is at least a portion of the fine current. Specifically, the transistor 661 operates in linear mode. When the input voltage is low, both transistors are cut off. If the input voltage changes from low to high, a fixed voltage drop appears across the resistor 662. As a result, the transistor 661 provides the corrective current that is fixed.

Figure 28:
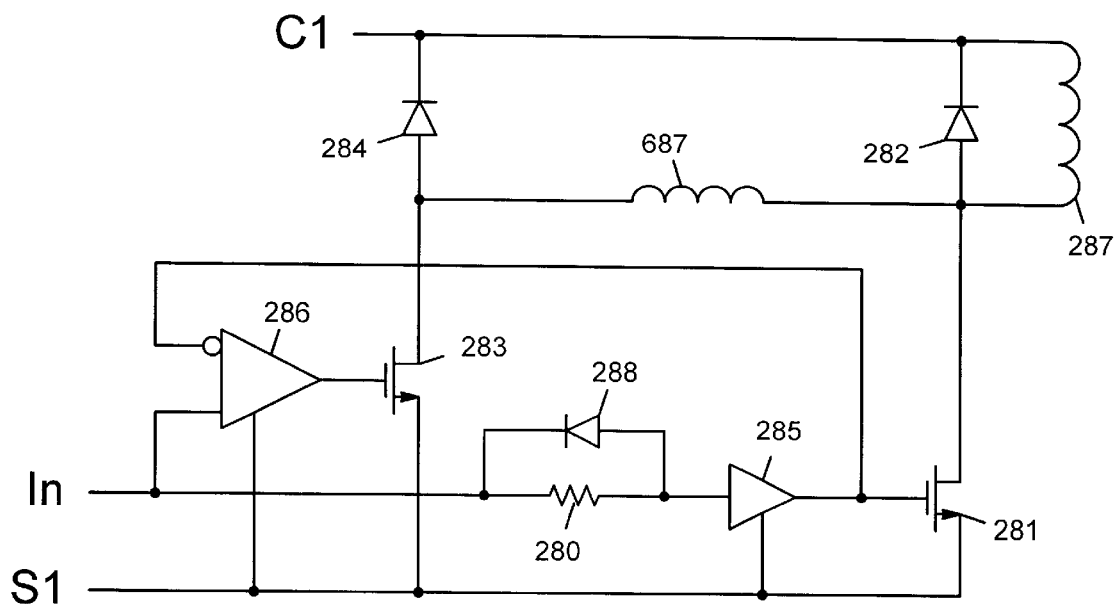
FIG. 28 illustrates a method for implementing fine switching amplifier.
Figure 29:
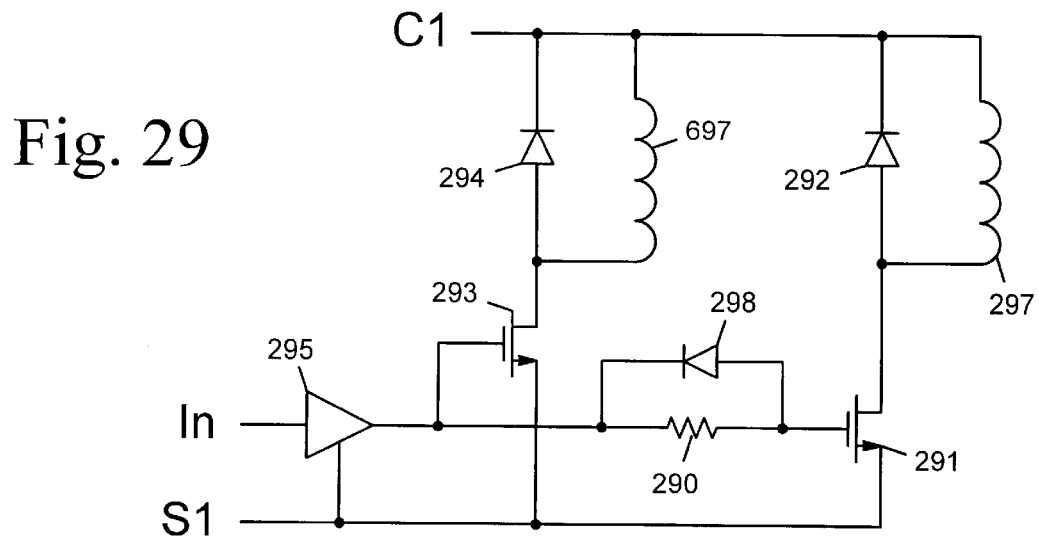
FIG. 29 illustrates a method for increasing output power of the I²PS.

The switch 261 can turn on after a delay that is primarily determined by propagation delay and current capabilities of the driver 265, and intrinsic input capacitance of the switch 261. The delay can be extended by adding a resistor paralleled by a diode as shown in FIGS. 28 and 29. The correction performed by the fine amplifier is successful if the input voltage changes from high to low before the end of the delay. The transistor 661 turns off and immediately interrupts the corrective current. However, the switch 261 turns on if the input voltage remains unchanged. The terminals D1 and S1 are effectively shorted, which cuts off the transistor 661. The switch 261 takes over the corrective current as to increase it. Both transistors turn off if the input voltage changes from high to low.

Figure 27:
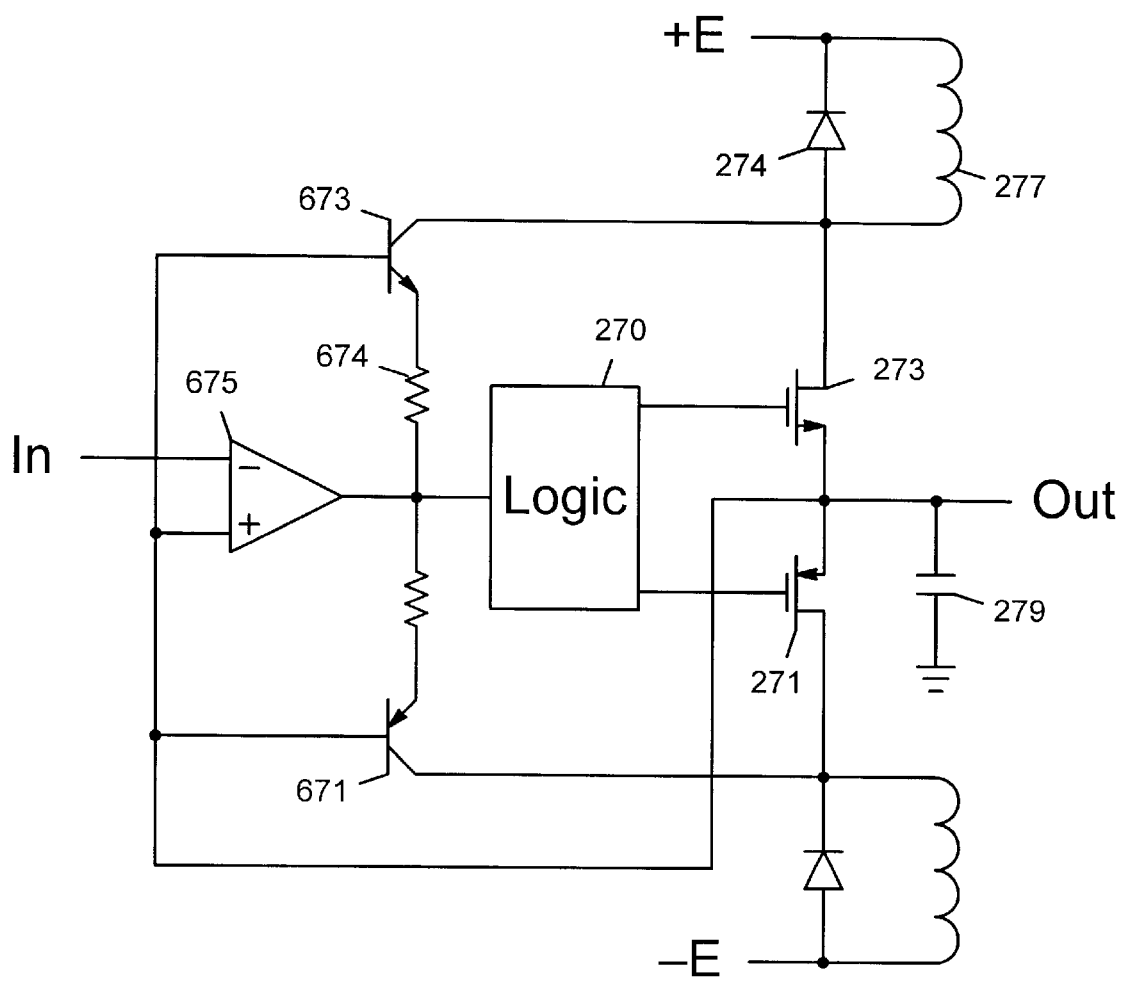
FIG. 27 is an embodiment of continuous mode I²PS comprising floating drivers and incorporating ultra-fast fine amplifier.

FIG. 27 is an embodiment of continuous mode I²PS comprising floating drivers and incorporating ultra-fast fine amplifier. The I²PS has unity gain and employs complementary output switches connected to the output of the I²PS. The logic 270 is indirectly referenced to the output. An external power supply can provide a pair of supply voltages that are referenced to the output. A positive supply voltage is applied to positive supply terminals of the components 270 and 675. A negative supply voltage is applied to a negative supply terminal of the comparator 675 and a reference terminal of the logic 270. The fine amplifier is driven directly by the comparator 675 as to accomplish the fastest possible correction.

The input voltage is applied to the inverting input of the comparator 675. A comparator output voltage is applied to an input of the logic 270 and a pair of resistors. The resistors are separately connected in series with the emitters of the PNP transistor 671 and the NPN transistor 673 respectively. The logic 270 integrates a pair of drivers for controlling the switches 271 and 273. The former switch is P-channel MOSFET. The drain of the switch 273 is tied to the collector of the transistor 673, the anode of the diode 274 and the inductor 277. A positive supply voltage +E is applied to the cathode of the diode 274 and the inductor 277. Similarly, a negative supply voltage −E is applied to the drain of the switch 271 and the collector of the transistor 671 through respective diode and inductor. The non-inverting input of the comparator 675, the sources of the switches 271, 273, the bases of the switches 671, 673 and the capacitor 279 are connected to the output of the I²PS. The capacitor 279 is grounded and provides the AC output voltage.

If the input voltage becomes larger than the output voltage, the comparator output voltage is negative. This voltage, reduced by base-emitter voltage of the transistor 673, is also applied across the resistor 674. As a result, the transistor 673 provides a constant current. The current is equal to the corrective current if the switches 271 and 273 are open. Moreover, the current is relatively small. For example, the current is chosen to change the output voltage of the I²PS by merely one quantization level in several clock cycles. The current can thus change the output voltage by only one bit of the desired accuracy within a short period of time. This corresponds to zero crossing condition during which output noise of the I²PS is most audible.

The correction performed by the fine amplifier is successful if the comparator output voltage becomes positive within a predetermined period of time. The comparator 675 immediately changes polarity of the corrective current by cutting off the transistor 673 and energizing the transistor 671. However, the logic 270 turns the switch 273 on if the comparator output voltage remains positive. The inductor 277 attains the corrective current that can have large amplitude. Power dissipation of the transistor 673 is minimal due to its small collector current. Moreover, the transistor 673 is effectively shorted when the switch 673 is turned on. The operation of the transistors 271 and 671 is analogous.

The non-inverting input of the comparator 675 and the bases of the transistors 671, 673 can be grounded. A resistor divider, such as 413, 414 of FIG. 1, can be used to apply the input voltage to the inverting input of the comparator 675. The divider can set a higher gain of the I²PS. However, a level shifter is necessary to apply the comparator output voltage to the logic 270. The coupling of the transistors 671 and 673 to the comparator 675 remains unchanged so that the fastest possible correction is accomplished. The logic 270 can be grounded as well. This requires employment of a pair of voltage shifters between the logic 270 and drivers of the switches 271 and 273. A single voltage shifter providing an output voltage at three levels can be also used. An example is shown in FIG. 4b.

FIG. 28 illustrates a method for implementing fine switching amplifier. The input voltage derives from the main logic. It is applied to a non-inverting input of the driver 286 that drives the gate of the switch 283. The voltage is also applied to the cathode of the diode 288 and the resistor 280. The anode of the diode 288 and the resistor 280 are connected to an input of the driver 285. Its output is connected to the gate of the switch 281 and an inverting input of the driver 286. The drain of the switch 283 is tied to the anode of the diode 284 and the inductor 687. The drain of the switch 281 is tied to the anode of the diode 282 and both inductors 287 and 687. The cathodes of the diodes 282, 284 and the inductor 287 are tied to the terminal C1. The sources of the switches 281, 283 and reference terminals of the drivers 285, 286 are connected to the terminal S1.

The instant embodiment can be implemented in any I²PS. It represents one half of an output stage in half-bridge configuration. Therefore, the fine amplifier includes at least one controllable current source separately coupled to one of the switching means for providing an additional current that is at least a portion of the fine current. The components 280, 281, 285 and 288 represent the one switching means. The components 283, 284, 286 and 687 represent the controllable current source. The inductor 687 attains the additional current and provides an additional return voltage. The switch 283 is coupled in series with the additional inductor 687 for selectively conducting the additional current. The diode 284 limits the additional return voltage.

If the input voltage changes from low to high, the switch 283 turns on. The corrective current flows through the inductors 287 and 687 between the terminals C1 and S1. However, the diode 282 conducts a difference between the current of the inductor 287 and the current of the inductor 687 if the former current is larger. The resistor 280 and intrinsic input capacitance of the driver 285 set a time delay. The correction performed by the fine amplifier is successful if the input voltage changes from high to low before the end of the delay. The switch 683 turns off and immediately interrupts the corrective current. The input capacitance of the driver 285 is discharged through the diode 288. The inductor 687 is discharged through the diode 284 and possibly the diode 282. If the inductor currents are even, the diode 282 is nonconductive. The switch 281 turns on if the input voltage remains unchanged during the time delay. The output voltage of the driver 285 is high. This voltage appears also at the inverting input of the driver 283, which causes the switch 283 to turn off. The corrective current is a difference between the inductor currents. The switch 281 turns off if the input voltage changes from high to low.

FIG. 29 illustrates a method for increasing output power of the I²PS. Current ratings of power devices strongly affect their performance and cost. For example, MOSFETs have reduced on-resistance at higher current ratings. However, their turn-on and -off times can be significantly higher. This often results in poor performance in high speed applications. High current diodes have significantly higher reverse recovery time. High current inductors require large and expensive cores. By paralleling power devices, their individual current ratings can be dramatically reduced.

There are many problems associated with operating a switch at high current and high frequency. One of the most difficult problems is power supply noise. At high frequencies, output impedance of the power supply can cause large supply voltage spikes. The switch has to recharge various parasitic capacitances while turning on. In a continuous mode I²PS, they include intra-winding capacitance of an inductor and intrinsic junction capacitance of a parallel coupled diode. The latter capacitance can be quite large at zero voltage. Series coupling of diodes is impractical. The switch can act as an active snubber by turning on and/or off at reduced speed. However, power dissipation is increased. A single switch is particularly inefficient when switching narrow pulses. For example, the switch can turn off immediately after reaching full conduction at peak current. Mere paralleling of switches leaves these and other problems unsolved.

The instant embodiment can be implemented in any I²PS. It represents one half of an output stage in half-bridge configuration. The fine amplifier includes at least one controllable current source separately coupled between the power supply and the I²PS output for providing an additional current that is at least a portion of the fine current. The components 290, 291 and 298 represent one of the switching means. The components 293, 294 and 697 represent the controllable current source. Specifically, a signal from the main logic is applied to an input of the driver 295. Its output is connected to the gate of the switch 293, the cathode of the diode 298 and the resistor 290. The drain of the switch 293 is tied to the anode of the diode 294 and the inductor 697. The gate of the switch 291 is connected to the anode of the diode 298 and the resistor 290. The drain of the switch 291 is tied to the anode of the diode 292 and the inductor 297. The cathodes of the diodes 292, 294 and the inductors 297, 697 are tied to the terminal C1. The sources of the switches 291, 293 and a reference terminal of the driver 295 are connected to the terminal S1.

If the input signal changes from low to high, the driver 295 turns the switch 293 on. The corrective current is equal to the current of the inductor 697. The gate voltage of the switch 293 also appears momentarily across the resistors 290 due to intrinsic input capacitance of the switch 291. The switch 291 turns on after a delay, when its gate-source voltage reaches a threshold level. The resistor 290 and the input capacitance determine the delay. When both switches are turned on, the corrective current is equal to a sum of the inductor currents. Therefore, approximately one half of the peak corrective current determines current ratings of the switches 291, 293, the diodes 292, 294 and the inductors 297, 697.

If the input signal changes from high to low, the driver 295 provides a low output voltage. The input capacitances of the switches 291 and 293 are promptly discharged, and both switches turn off simultaneously. The diode 298 conducts a gate current of the latter switch. The operation of the embodiment is particularly effective when a narrow pulse is applied to the input of the driver 295. The switch 293 may turn on and off even before the switch 291 starts to conduct. The timing of the switching can be controlled more precisely by employing a separate driver for the switch 291. The input signal applied to that driver is delayed. An intrinsic input capacitor of that driver can be used, as in the FIG. 28 embodiment. Moreover, both drivers can have reduced current capabilities. If more than two switches are used, the respective delays should be chosen more accurately to limit differences between peak drain currents.

Figure 30:
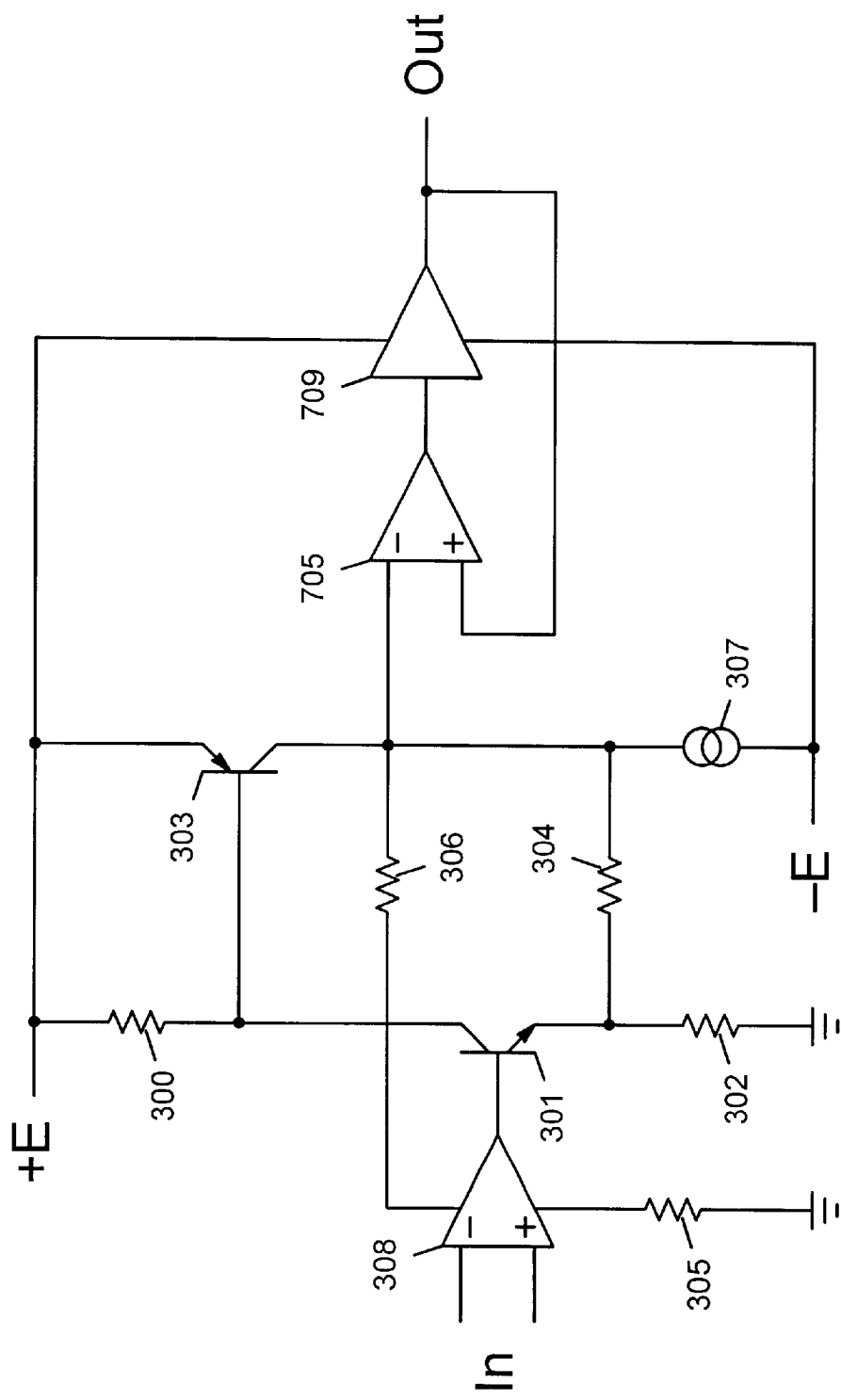
FIG. 30 is the preferred embodiment of preamplifier driving unity gain I²PS.

FIG. 30 is the preferred embodiment of preamplifier driving unity gain I²PS. In an I²PS, such as shown in FIG. 1, the comparator is used to set the total gain. This gain effectively reduces open-loop gain of the comparator and results in lower resolution of the I²PS. For example, open-loop gain of conventional fast comparators reaches merely few thousand. Preferably, the comparator is used as inverting amplifier with non-inverting input grounded. A comparator having moderate common mode rejection ratio and sustaining small supply voltages or even a single supply voltage can be used. However, feedback resistors having small values are required in order to minimize effect of parasitic capacitances. The gain of the I²PS is inversely proportional to value of the input resistor. Therefore, a preamplifier driving the comparator has to have low output impedance. A modulation thereof contributes to gain error and signal distortion. Another concern is power supply and ground noise. The grounded comparator produces noise that can interfere with the grounded preamplifier. In particular, an overdrive protection circuit of the comparator can inject large noise leading to instability of the I²PS.

Examples of the I²PS having unity gain are shown in FIGS. 7 through 9, 24 and 27. A quantization error of the comparator corresponds to the resolution of the I²PS. Moreover, it is relatively easy to amplify the input signal, e.g. from an audio source, that has limited bandwidth. Input impedance of the comparator is highest possible. A modulation of output impedance of the preamplifier has practically no effect on gain error and signal distortion of the I²PS. Finally, the analog and digital sections can be separated, which minimizes noise.

An output stage of the preamplifier provides an output voltage in response to an input signal. A first transistor means has a first base electrode for receiving the input signal, an emitter electrode for providing an emitter voltage and a first collector electrode for providing a collector current. A second transistor means has a second base electrode for receiving the collector current and a second collector electrode for providing the output voltage. A current source means provides a bias current to the second collector electrode. A resistive means applies the emitter voltage to the second collector electrode and ground.

Specifically, the input signal is applied between inverting and non-inverting inputs of the instrumentation amplifier 308. Its output drives the base of the NPN transistor 301. The emitter of the transistor 301 is connected to the resistors 302 and 304. The collector of the transistor 301 is connected to the base of the PNP transistor 303 and the resistor 300. The collector of the transistor 303 is tied to the inverting input of the comparator 705, the current source 307 and the resistors 304, 306. The non-inverting input of the comparator 705 is tied to the output of the buffer 709 that is also the output of the I²PS. The output of the comparator 705 is connected to an input of the buffer 709. The comparator 705 and the buffer 709 constitute the I²PS. In particular, the buffer 709 includes the logic, drivers, output transistors and output capacitor. The comparator 705 is shown as the separate component to point out that the I²PS has unity gain.

The instrumentation amplifier 308 has two additional outputs that allow placing the output stage within the feedback loop, thus maintaining high accuracy of the amplification. Specifically, the resistor 306 is connected to an output-sense terminal of the amplifier 308. The resistor 305 is added to trim common-mode rejection. Usually, the resistors 305 and 306 are in series with internal resistors of the amplifier 308. The internal resistors are connected to non-inverting and inverting inputs of an output stage of the amplifier 308 respectively. A positive supply voltage +E is applied to the buffer 709, the emitter of the transistor 303 and the resistor 300. A negative supply voltage −E is applied to the buffer 709 and the current source 307. The resistors 302 and 305 are grounded.

The output stage of the preamplifier can operate independently. It has two gain stages that provide for a large open-loop gain. The resistors 300 and 302 set the gain of the first stage. The gain of the second stage is large as the current source 307 is used for biasing the transistor 303. An example of the current source is shown in FIG. 6. Preferably, +E and −E are applied to the output stage through a simple RC network. A resistor can be then used as the current source 307. The feedback resistor 304 dramatically cuts the gain and output impedance of the output stage. The closed-loop gain is greater than the ratio of +E to a supply voltage of the amplifier 308. The other feedback resistor 306 sets the total gain of the preamplifier.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Switching power apparatus providing an AC output voltage in response to an AC input signal comprising:
   a power supply means for providing at least one supply voltage;
   a first and second inductive means for attaining a first and second corrective currents, and providing a first and second return voltages respectively;

a first and second rectifying means for limiting the first and second return voltages respectively;

a capacitive means for providing the AC output voltage;

a first switching means having a first reference terminal and a first supply terminal, and coupled in series with the first inductive means for selectively applying the first corrective current between the power supply means and the capacitive means;

a second switching means having a second reference terminal and a second supply terminal, and coupled in series with the second inductive means for selectively applying the second corrective current between the power supply means and the capacitive means; and a converter means having a first and second input terminals for converting a voltage appearing therebetween and providing a supply current to at least one supply terminal, wherein the first input terminal is coupled to one of the terminals of the first switching means and the second input terminal is coupled to one of the terminals of the second switching means.

2. Switching power apparatus of claim 1 wherein the converter means includes:

a third inductive means coupled to the first inductive means for providing a third return voltage;

a third rectifying means for applying the first return voltage to the second supply terminal, wherein the first rectifying means limits the third return voltage, further wherein the first reference terminal is coupled to the power supply means and the first input terminal is coupled to the first inductive means, and still further wherein the second reference terminal and the second input terminal are coupled to the capacitive means.

3. Switching power apparatus of claim 1 wherein the converter means includes:

a third inductive means for attaining the supply current and providing a third return voltage;

a third switching means for selectively applying the voltage appearing between the first and second input terminals to the third inductive means; and a third rectifying means for limiting the third return voltage.

4. Switching power apparatus of claim 3 wherein at least one reference terminal is coupled to the capacitive means, further wherein the supply voltage is applied between the first and second input terminals, and still further wherein the third rectifying means is coupled to the third switching means for applying the supply current to at least one supply terminal.

5. Switching power apparatus of claim 1 wherein the first and second reference terminals are coupled to the power supply means, and further wherein the first and second input terminals are coupled to the first and second supply terminals respectively.

6. Switching power apparatus of claim 1 wherein the first and second reference terminals are coupled to the power supply means, and further the converter means includes a current source means for providing the supply current.

7. Switching power apparatus of claim 1 wherein the first and second reference terminals are coupled to the capacitive means, and further wherein the first and second supply terminals are coupled to each other.

8. Switching power apparatus of claim 1 wherein the converter means includes at least one additional switching means separately coupled to one of first said switching means for selectively applying the respective corrective current to the supply terminal of the one switching means.

9. Switching power apparatus of claim 8 wherein the additional switching means is coupled in series with the one switching means and includes an additional rectifying means for applying the respective corrective current to the supply terminal of the one switching means.

10. Switching power apparatus of claim 8 wherein the additional switching means is coupled to the one switching means and includes a series coupled resistive means for limiting the respective corrective current.

11. Switching power apparatus of claim 1 wherein the converter means includes:

at least one additional inductive means each for attaining an additional corrective current and providing an additional return voltage;

at least one additional switching means coupled in series with one of the additional inductive means for selectively applying the respective additional corrective current between the power supply means and the capacitive means; and at least one additional rectifying means separately coupled to one of the additional inductive means for applying the respective additional return voltage to at least one supply terminal.

12. Switching power apparatus of claim 1 wherein the converter means includes:

at least one additional capacitive means separately coupled to one of the switching means for applying the respective corrective current to the supply terminal of the one switching means; and at least one additional rectifying means separately coupled to the one additional capacitive means for limiting a voltage appearing thereacross.

13. Switching power apparatus of claim 12 wherein the converter means includes:

at least one additional inductive means separately coupled to one of the additional rectifying means for limiting a current applied thereto.

14. Switching power apparatus of claim 1 further including a comparator means for comparing the AC input signal against the AC output voltage and providing a comparator signal, wherein the first and second switching means, and the converter means are responsive to the comparator signal.

15. Switching power apparatus providing an AC output voltage in response to an AC input signal comprising:

a power supply means for providing at least one supply voltage;

a pair of inductive means each for attaining a corrective current and providing a return voltage;

a pair of rectifying means separately coupled to the inductive means for limiting the respective return voltages;

a capacitive means for providing the AC output voltage;

a pair of switching means separately coupled in series with the inductive means for selectively applying the respective corrective currents between the power supply means and the capacitive means;

an amplifier means for providing a fine current to the capacitive means in response to the AC input signal and the AC output voltage.

16. Switching power apparatus of claim 15 wherein the amplifier means includes at least one controllable current source means separately coupled to one of the switching means for providing an additional current that is at least a portion of the fine current.

17. Switching power apparatus of claim 16 wherein the controllable current source means includes:

an additional inductive means for attaining the additional current and providing an additional return voltage;

an additional switching means coupled in series with the additional inductive means for selectively conducting the additional current; and an additional rectifying means for limiting the additional return voltage.

18. Switching power apparatus of claim 17 wherein the amplifier means includes at least one controllable current source means separately coupled between the power supply means and the capacitive means for providing an additional current that is at least a portion of the fine current.

19. Switching power apparatus of claim 18 wherein the controllable current source means includes:

an additional inductive means for attaining the additional current and providing an additional return voltage;

an additional switching means coupled in series with the additional inductive means for selectively conducting the additional current; and an additional rectifying means for limiting the additional return voltage.

20. Switching power apparatus of claim 15 further including a comparator means for comparing the AC input signal against the AC output voltage and providing a comparator signal, wherein each switching means and the amplifier means are responsive to the comparator signal.

* * * * *